(12) United States Patent
Kang et al.

(10) Patent No.: US 12,302,561 B2
(45) Date of Patent: May 13, 2025

(54) SEMICONDUCTOR DEVICE, METHOD OF MANUFACTURING THE SAME, AND MASSIVE DATA STORAGE SYSTEM INCLUDING THE SAME

(71) Applicant: SAMSUNG ELECTRONICS CO., LTD., Suwon-si (KR)

(72) Inventors: Minjun Kang, Hwaseong-si (KR); Byunggon Park, Seoul (KR); Joongshik Shin, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 906 days.

(21) Appl. No.: 17/354,445

(22) Filed: Jun. 22, 2021

(65) Prior Publication Data

US 2022/0173118 A1 Jun. 2, 2022

(30) Foreign Application Priority Data

Dec. 2, 2020 (KR) ........................ 10-2020-0166311

(51) Int. Cl.
| | |
|---|---|
| *H01L 27/11582* | (2017.01) |
| *H01L 27/11529* | (2017.01) |
| *H01L 27/11556* | (2017.01) |
| *H01L 27/11573* | (2017.01) |
| *H10B 41/27* | (2023.01) |
| *H10B 41/41* | (2023.01) |

(Continued)

(52) U.S. Cl.
CPC ............ *H10B 43/27* (2023.02); *H10B 41/27* (2023.02); *H10B 41/41* (2023.02); *H10B 43/40* (2023.02)

(58) Field of Classification Search
None
See application file for complete search history.

(56) References Cited

U.S. PATENT DOCUMENTS

| | | |
|---|---|---|
| 10,381,369 B2 | 8/2019 | Kim et al. |
| 10,553,598 B2 | 2/2020 | Jung |
| 10,608,013 B1 | 3/2020 | Xiao |

(Continued)

FOREIGN PATENT DOCUMENTS

| | | |
|---|---|---|
| KR | 1020140033938 A | 3/2014 |
| KR | 1020150133914 A | 12/2015 |

(Continued)

*Primary Examiner* — Robert K Carpenter
(74) *Attorney, Agent, or Firm* — Muir Patent Law, PLLC

(57) ABSTRACT

A semiconductor device including a gate electrode structure on a substrate and including gate electrodes spaced apart from each other in a first direction, each gate electrode extending in a second direction; a memory channel structure extending through the gate electrode structure on the substrate, the memory channel structure including a channel extending in the first direction; a charge storage structure surrounding an outer sidewall of the channel; a first filling pattern filling an inner space formed by the channel; and a first capping pattern on the channel and the first filling pattern; and a dummy charge storage structure extending through the gate electrode structure on the substrate, the dummy charge storage structure including a second filling pattern extending in the first direction; a dummy charge storage structure surrounding an outer sidewall of the second filling pattern; and a second capping pattern on the second filling pattern.

20 Claims, 48 Drawing Sheets

(51) Int. Cl.
   *H10B 43/27*      (2023.01)
   *H10B 43/40*      (2023.01)

(56) References Cited

U.S. PATENT DOCUMENTS

| | | | |
|---|---|---|---|
| 10,672,789 | B2 | 6/2020 | Song et al. |
| 2019/0319039 | A1 | 10/2019 | Kim et al. |
| 2019/0326317 | A1* | 10/2019 | Jung ................ H01L 29/42344 |
| 2020/0035702 | A1 | 1/2020 | Lee et al. |
| 2020/0168621 | A1 | 5/2020 | Jung |
| 2020/0185408 | A1 | 6/2020 | Song et al. |
| 2020/0194457 | A1 | 6/2020 | Lee et al. |

FOREIGN PATENT DOCUMENTS

| | | |
|---|---|---|
| KR | 10-2018-0096878 A | 8/2018 |
| KR | 1020190023950 A | 3/2019 |
| KR | 10-2019-0053715 A | 5/2019 |
| KR | 10-2019-0057669 A | 5/2019 |
| KR | 1020200007220 A | 1/2020 |
| KR | 10-2020-0011852 A | 2/2020 |
| KR | 10-2020-0072638 A | 6/2020 |

\* cited by examiner

SEMICONDUCTOR DEVICE, METHOD OF MANUFACTURING THE SAME, AND MASSIVE DATA STORAGE SYSTEM INCLUDING THE SAME

CROSS-REFERENCE TO RELATED APPLICATION

Korean Patent Application No. 10-2020-0166311, filed on Dec. 2, 2020 in the Korean Intellectual Property Office, and entitled: "Semiconductor Device, Method of Manufacturing the Same, and Massive Data Storage System Including the Same," is incorporated by reference herein in its entirety.

BACKGROUND

1. Field

Embodiments relate to a semiconductor device, a method of manufacturing the same, and a massive data storage system including the same.

2. Description of the Related Art

An electronic system for data storage may include a high capacity semiconductor device that may store high capacity data. A method of increasing the data storage capacity of the semiconductor device has been considered. For example, a semiconductor device including memory cells that may be 3-dimensionally stacked has been suggested.

SUMMARY

The embodiments may be realized by providing a semiconductor device including a substrate; a gate electrode structure on the substrate, the gate electrode structure including gate electrodes spaced apart from each other in a first direction perpendicular to an upper surface of the substrate, each of the gate electrodes extending in a second direction parallel to the upper surface of the substrate; a memory channel structure extending through the gate electrode structure on the substrate, the memory channel structure including a channel extending in the first direction; a charge storage structure surrounding an outer sidewall of the channel; a first filling pattern filling an inner space formed by the channel; and a first capping pattern on the channel and the first filling pattern; and a support structure extending through the gate electrode structure on the substrate, the support structure including a second filling pattern extending in the first direction; a dummy charge storage structure surrounding an outer sidewall of the second filling pattern; and a second capping pattern on the second filling pattern.

The embodiments may be realized by providing a semiconductor device including a substrate; a gate electrode structure on the substrate, the gate electrode structure including gate electrodes spaced apart from each other in a first direction perpendicular to an upper surface of the substrate, each of the gate electrodes extending in a second direction parallel to the upper surface of the substrate; a memory channel structure extending through the gate electrode structure on the substrate; and a support structure extending through the gate electrode structure on the substrate, the support structure including a first filling pattern extending in the first direction; a first capping pattern on the first filling pattern; and a dummy charge storage structure surrounding outer sidewalls of the first filling pattern and the first capping pattern, wherein the capping pattern includes an upper portion; and a lower portion protruding from an outer edge lower surface of the upper portion downwardly in the first direction.

The embodiments may be realized by providing a semiconductor device including a substrate including a cell array region and an extension region at least partially surrounding the cell array region; lower circuit patterns on the substrate; a common source plate (CSP) on the lower circuit patterns; a gate electrode structure on the CSP, the gate electrode structure including gate electrodes spaced apart from each other in a first direction perpendicular to an upper surface of the substrate, and each of the gate electrodes extending in a second direction parallel to the upper surface of the substrate; a memory channel structure extending through the gate electrode structure on the cell array region of the substrate and connected to the CSP, the memory channel structure including a channel extending in the first direction; a charge storage structure surrounding an outer sidewall of the channel; a first filling pattern filling an inner space formed by the channel; and a first capping pattern on the channel and the first filling pattern; a support structure extending through the gate electrode structure and connected to the CSP on the substrate, the support structure including a second filling pattern extending in the first direction; a dummy charge storage structure surrounding an outer sidewall of the second filling pattern; and a second capping pattern on the second filling pattern; and a contact plug extending in the first direction and contacting an upper surface of an end portion in the second direction of each of the gate electrodes.

The embodiments may be realized by providing a method of manufacturing a semiconductor device, the method including alternately and repeatedly stacking an insulation layer and a sacrificial layer on a substrate in a first direction perpendicular to an upper surface of the substrate to form a mold; forming at least one channel hole and at least one dummy channel hole through the mold; sequentially stacking a charge storage structure layer and a channel layer in the at least one channel hole and in the at least one dummy channel hole; partially removing the channel layer in the at least one dummy channel hole to partially expose the charge storage structure layer; forming a first filling pattern filling lower portions of the at least one channel hole on the channel layer; forming a second filling pattern filling lower portions of the at least one dummy channel hole on the charge storage structure layer; forming a first capping pattern on the first filling pattern to fill upper portions of the at least one channel hole; forming a second capping pattern on the second filling pattern to fill upper portions of the at least one dummy channel hole; forming an opening through the mold such that the opening extends in a second direction parallel to the upper surface of the substrate; removing the sacrificial layers through the opening to form gaps; and respectively forming gate electrodes in the gaps.

The embodiments may be realized by providing a method of manufacturing a semiconductor device, the method including alternately and repeatedly stacking an insulation layer and a sacrificial layer on a substrate in a first direction perpendicular to an upper surface of the substrate to form a mold; forming at least one channel hole and at least one dummy channel hole through the mold; forming a charge storage structure layer in the at least one channel hole and the at least one dummy channel hole; forming a channel layer on the charge storage structure layer in the at least one channel hole, a dummy channel being formed on an upper inner sidewall of the charge storage structure layer in the at least one dummy channel hole; forming first and second filling patterns on the channel layer and the charge storage structure layer, the first and second filling patterns filling lower portions of the at least one channel hole and the at least one dummy channel hole, respectively; forming first and second capping patterns on the first and second filling patterns, respectively, the first and second capping patterns filling upper portions of the at least one channel hole and the at least one dummy channel hole, respectively; forming an opening through the mold, the opening extending in a second direction parallel to the upper surface of the substrate; removing the sacrificial layers through the opening to form gaps, respectively; and forming gate electrodes in the gaps, respectively.

The embodiments may be realized by providing a method of manufacturing a semiconductor device, the method including forming lower circuit patterns on a substrate including a cell array region and an extension region at least partially surrounding the cell array region; forming a common source plate (CSP) on the lower circuit patterns; alternately and repeatedly stacking an insulation layer and a sacrificial layer on the CSP in a first direction perpendicular to an upper surface of the substrate to form a mold; forming a channel hole through the mold to expose an upper surface of the CSP on the cell array region of the substrate; forming a dummy channel hole through the mold to expose an upper surface of the CSP on the extension region of the substrate; sequentially stacking a charge storage structure layer and a channel layer in the channel hole and the dummy channel hole, respectively; partially removing the channel layer in the dummy channel hole to partially expose the charge storage structure layer; forming a first filling pattern filling lower portions of the channel hole on the channel layer; forming a second filling pattern filling lower portions of the dummy channel hole on the charge storage structure layer; forming a first capping pattern on the first filling pattern to fill upper portions of the channel hole; forming a second capping pattern on the second filling pattern to fill upper portions of the dummy channel hole; forming an opening through the mold on the cell array region and the extension region of the substrate to expose and upper surface of the CSP such that the opening extends in a second direction parallel to the upper surface of the substrate; removing the sacrificial layers through the opening to form gaps; forming gate electrodes in the gaps; and forming a contact plug extending in the first direction to contact an upper surface of an end portion in the second direction of each of the gate electrodes on the extension region of the substrate.

The embodiments may be realized by providing a massive data storage system, comprising a semiconductor device having a memory cell structure including a gate electrode structure on a substrate, the gate electrode structure including gate electrodes spaced apart from each other in a first direction perpendicular to an upper surface of the substrate, each of the gate electrodes extending in a second direction parallel to the upper surface of the substrate; a memory channel structure extending through the gate electrode structure on the substrate, the memory channel structure including a channel extending in the first direction; a charge storage structure surrounding an outer sidewall of the channel; a first filling pattern filling an inner space formed by the channel; and a first capping pattern on the channel and the first filling pattern; and a support structure extending through the gate electrode structure on the substrate, the support structure including a second filling pattern extending in the first direction; a dummy charge storage structure surrounding an outer sidewall of the second filling pattern; and a second capping pattern on the second filling pattern; peripheral circuit wirings configured to apply electrical signals to the memory cell structure; an input/output pad electrically connected to the peripheral circuit wirings; and a controller electrically connected to the semiconductor device through the input/output pad, the controller configured to control the semiconductor device.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
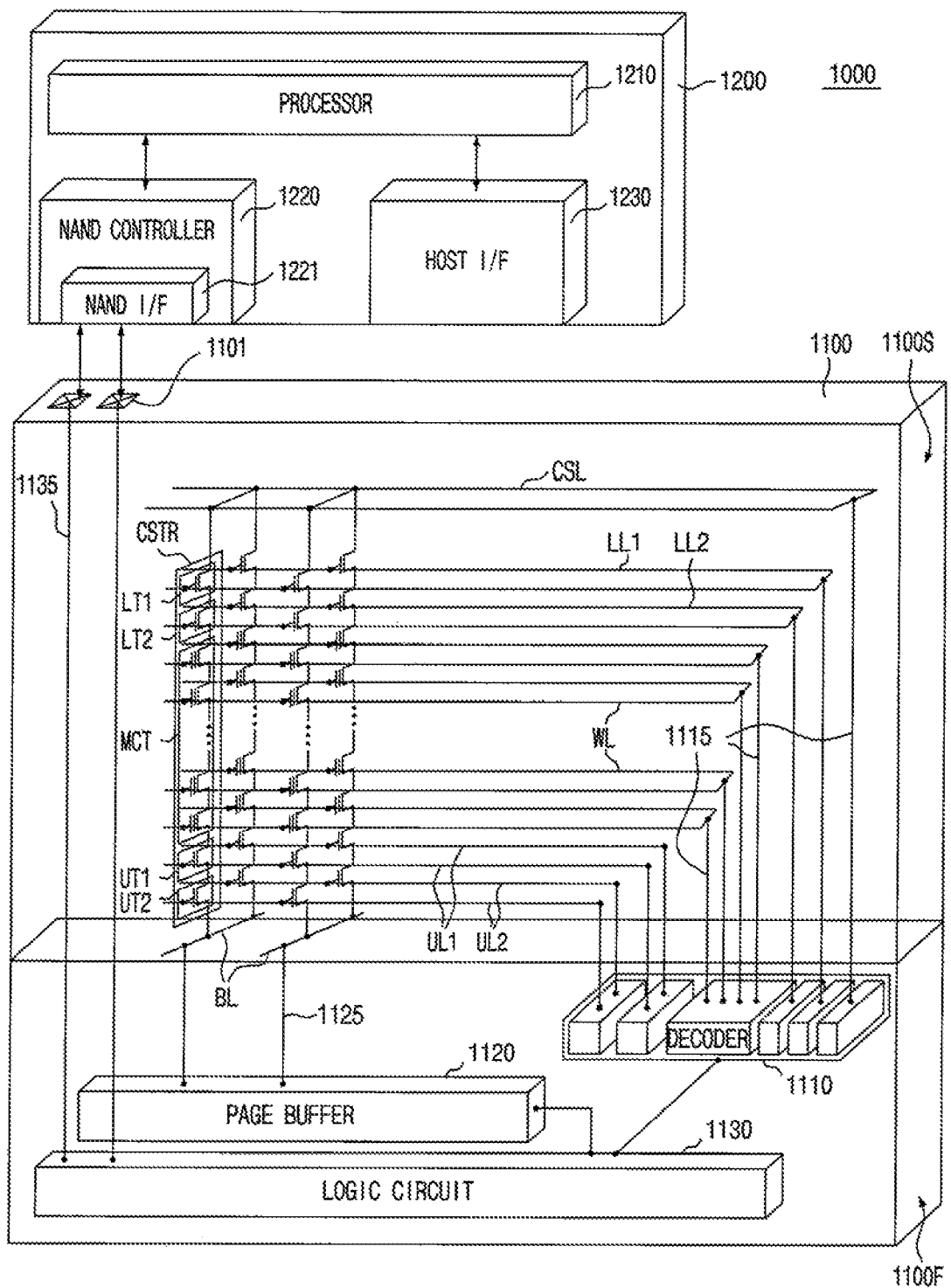
FIG. 1 is a diagram of an electronic system including a semiconductor device in accordance with example embodiments.

FIG. 1 is a diagram of an electronic system including a semiconductor device in accordance with example embodiments.

Referring to FIG. 1, an electronic system 1000 may include a semiconductor device 1100 and a controller 1200 electrically connected to the semiconductor device 1100. The electronic system 1000 may be a storage device including one or a plurality of semiconductor devices 1100 or an electronic device including a storage device. In an implementation, the electronic system 1000 may be a solid state drive (SSD) device, a universal serial bus (USB) device, a computing system, a medical device, or a communication device that may include one or a plurality of semiconductor devices 1100.

The semiconductor device 1100 may be a non-volatile memory device, e.g., a NAND flash memory device that will be illustrated with reference to FIGS. 41 to 48. The semiconductor device 1100 may include a first structure 1100F and a second structure 1100S on the first structure 1100F. In an implementation, as illustrated in the drawings, the first structure 1100F may be under the second structure 1100S. In an implementation, the first structure 1100F may be beside or on the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second upper gate lines UL1 and UL2, first and second lower gate lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with example embodiments.

In an implementation, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In an implementation, the lower transistors LT1 and LT2 may include a lower erase control transistor LT1 and a ground selection transistor LT2 that may be connected with each other in series. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 1110 through first connection wirings 1115 extending to the second structure 1110S in the first structure 1100F. The bit lines BL may be electrically connected to the page buffer 1120 through second connection wirings 1125 extending to the second structure 1100S in the first structure 1100F.

In the first structure 1100F, the decoder circuit 1110 and the page buffer 1120 may perform a control operation for at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection wiring 1135 extending to the second structure 1100S in the first structure 1100F.

The controller 1200 may include a processor 1210, a NAND controller 1220, and a host interface 1230. The electronic system 1000 may include a plurality of semiconductor devices 1100, and in this case, the controller 1200 may control the plurality of semiconductor devices 1100.

The processor 1210 may control operations of the electronic system 1000 including the controller 1200. The processor 1210 may be operated by firmware, and may control the NAND controller 1220 to access the semiconductor device 1100. The NAND controller 1220 may include a NAND interface 1221 for communicating with the semiconductor device 1100. Through the NAND interface 1221, control command for controlling the semiconductor device 1100, data to be written in the memory cell transistors MCT of the semiconductor device 1100, data to be read from the memory cell transistors MCT of the semiconductor device 1100, or the like, may be transferred. The host interface 1230 may provide communication between the electronic system 1000 and an outside host. When control command is received from the outside host through the host interface 1230, the processor 1210 may control the semiconductor device 1100 in response to the control command.

Figure 2:
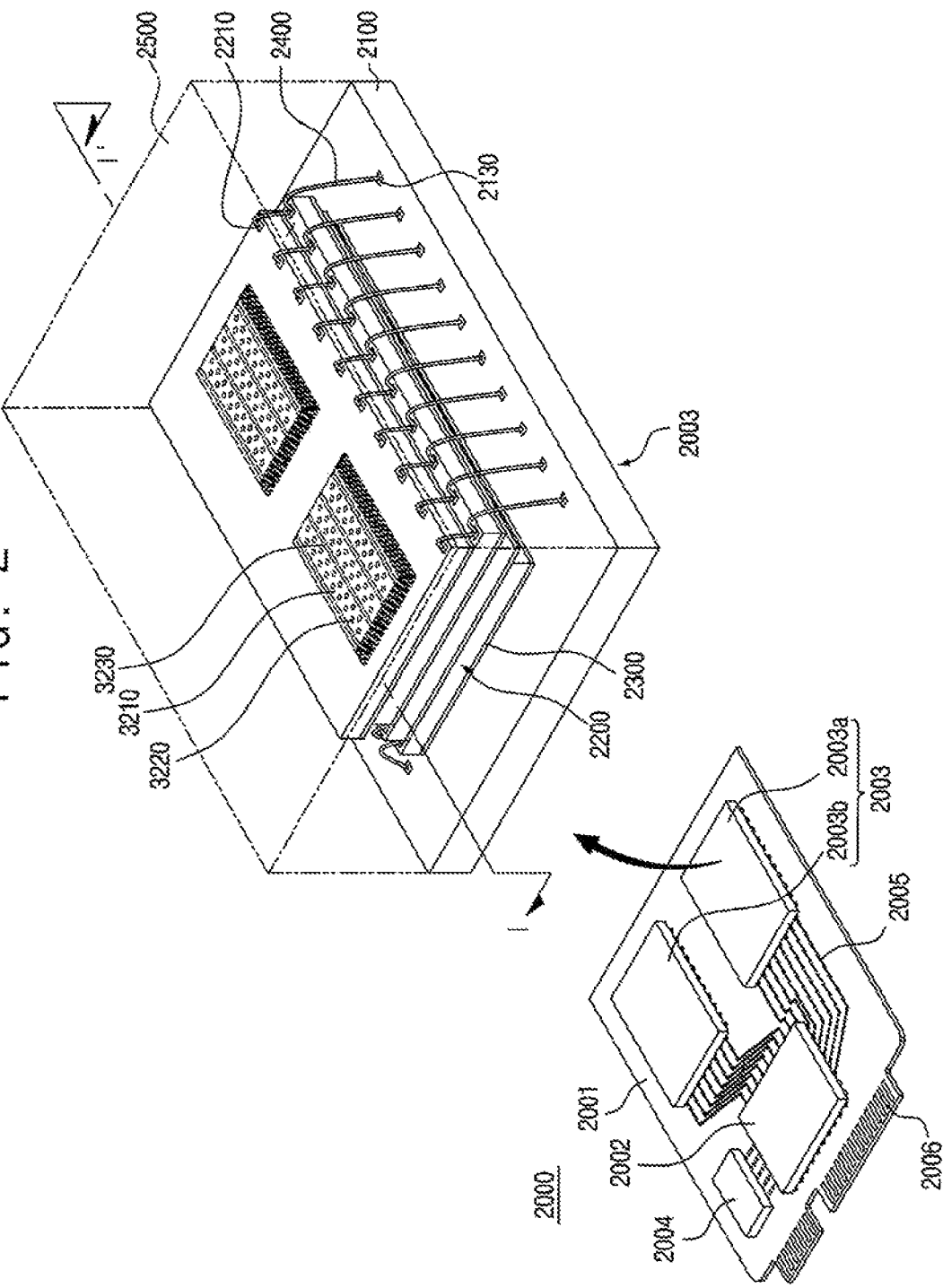
FIG. 2 is a perspective view of an electronic system including a semiconductor device in accordance with example embodiments.

FIG. 2 is a perspective view of an electronic system including a semiconductor device in accordance with example embodiments.

Referring to FIG. 2, an electronic system 2000 may include a main substrate 2001, a controller 2002 mounted on the main substrate 2001, at least one semiconductor package 2003, and a dynamic random access memory (DRAM) device 2004. The semiconductor package 2003 and the DRAM device 2004 may be connected to the controller 2002 by wiring patterns 2005 on the main substrate 2001.

The main substrate 2001 may include a connector 2006 having a plurality of pins connected to an outside host. The number and layout of the plurality pins in the connector 2006 may be changed depending on communication interface between the electronic system 2000 and the outside host. In an implementation, the electronic system 2000 may communicate with the outside host according to one of a USB, peripheral component interconnect express (PCI-Express), serial advanced technology attachment (SATA), M-Phy for universal flash storage (UFS), or the like. In an implementation, the electronic system 2000 may be operated by a power source provided from the outside host through the connector 2006. The electronic system 2000 may further include a power management integrated circuit (PMIC) for distributing the power source provided from the outside host to the controller 2002 and the semiconductor package 2003.

The controller 2002 may write data in the semiconductor package 2003 or read data from the semiconductor package 2003, and may enhance the operation speed of the electronic system 2000.

The DRAM device 2004 may be a buffer memory for reducing the speed difference between the semiconductor package 2003 for storing data and the outside host. The DRAM device 2004 included in the electronic system 2000 may serve as a cache memory, and may provide a space for temporarily storing data during the control operation for the semiconductor package 2003. If the electronic system 2000 includes the DRAM device 2004, the controller 2002 may further include a DRAM controller for controlling the DRAM device 2004 in addition to the NAND controller for controlling the semiconductor package 2003.

The semiconductor package 2003 may include first and second semiconductor packages 2003a and 2003b spaced apart from each other. The first and second semiconductor packages 2003a and 2003b may be semiconductor packages each of which may include a plurality of semiconductor chips 2200. Each of the first and second semiconductor packages 2003a and 2003b may include a package substrate 2100, the semiconductor chips 2200, bonding layers 2300 disposed under the semiconductor chips 2200, a connection structure 2400 for electrically connecting the semiconductor chips 2200 and the package substrate 2100, and a mold layer 2500 covering the semiconductor chips 2200 and the connection structure 2400 on the package substrate 2100.

The package substrate 2100 may be a printed circuit board (PCB) including package upper pads 2130. Each semiconductor chip 2200 may include an input/output pad 2210. The input/output pad 2210 may correspond to the input/output pad 1101 of FIG. 1. Each semiconductor chip 2200 may include gate electrode structures 3210, memory channel structures 3220 extending through the gate electrode structures 3210, and division structures 3230 for dividing the gate electrode structures 3210. Each semiconductor chip 2200 may include a semiconductor device that will be illustrated with reference to FIGS. 41 to 48.

In an implementation, the connection structure 2400 may be a bonding wire for electrically connecting the input/output pad 2210 and the package upper pads 2130. In an implementation, in each of the first and second semiconductor packages 2003a and 2003b, the semiconductor chips 2200 may be electrically connected with each other by a bonding wire method, and may be electrically connected to the package upper pads 2130 of the package substrate 2100. In an implementation, in each of the first and second semiconductor packages 2003a and 2003b, the semiconductor chips 2200 may be electrically connected with each other by a connection structure including a through silicon via (TSV), instead of the connection structure 2400 of the bonding wire method.

In an implementation, the controller 2002 and the semiconductor chips 2200 may be included in one package. In an implementation, the controller 2002 and the semiconductor chips 2200 may be mounted on an interposer substrate different from the main substrate 2001, and the controller 2002 and the semiconductor chips 2200 may be connected with each other by a wiring on the interposer substrate.

Figure 3:
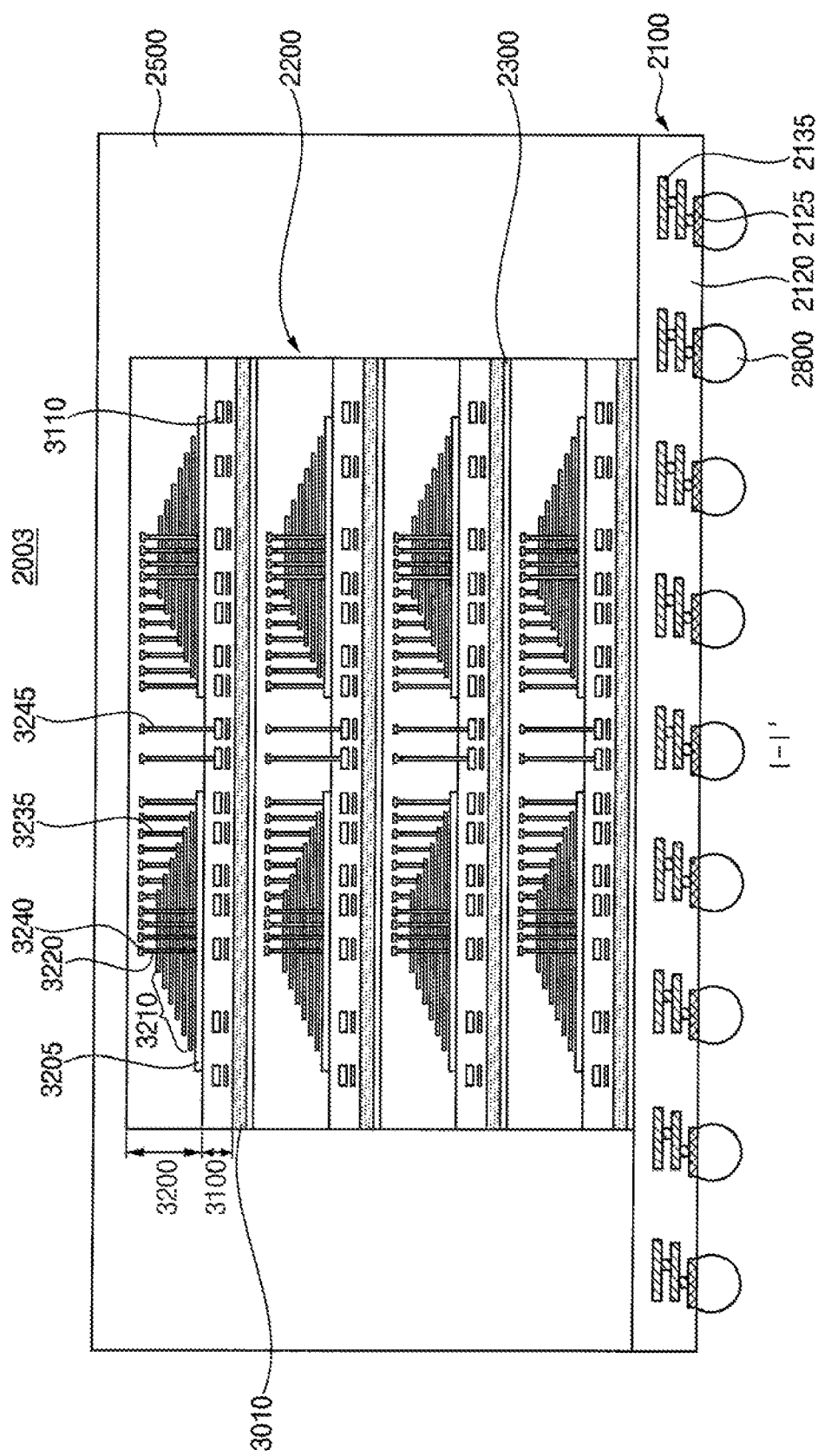
FIGS. 3 and 4 are cross-sectional views of semiconductor packages each of which may include a semiconductor device in accordance with example embodiments.
Figure 4:
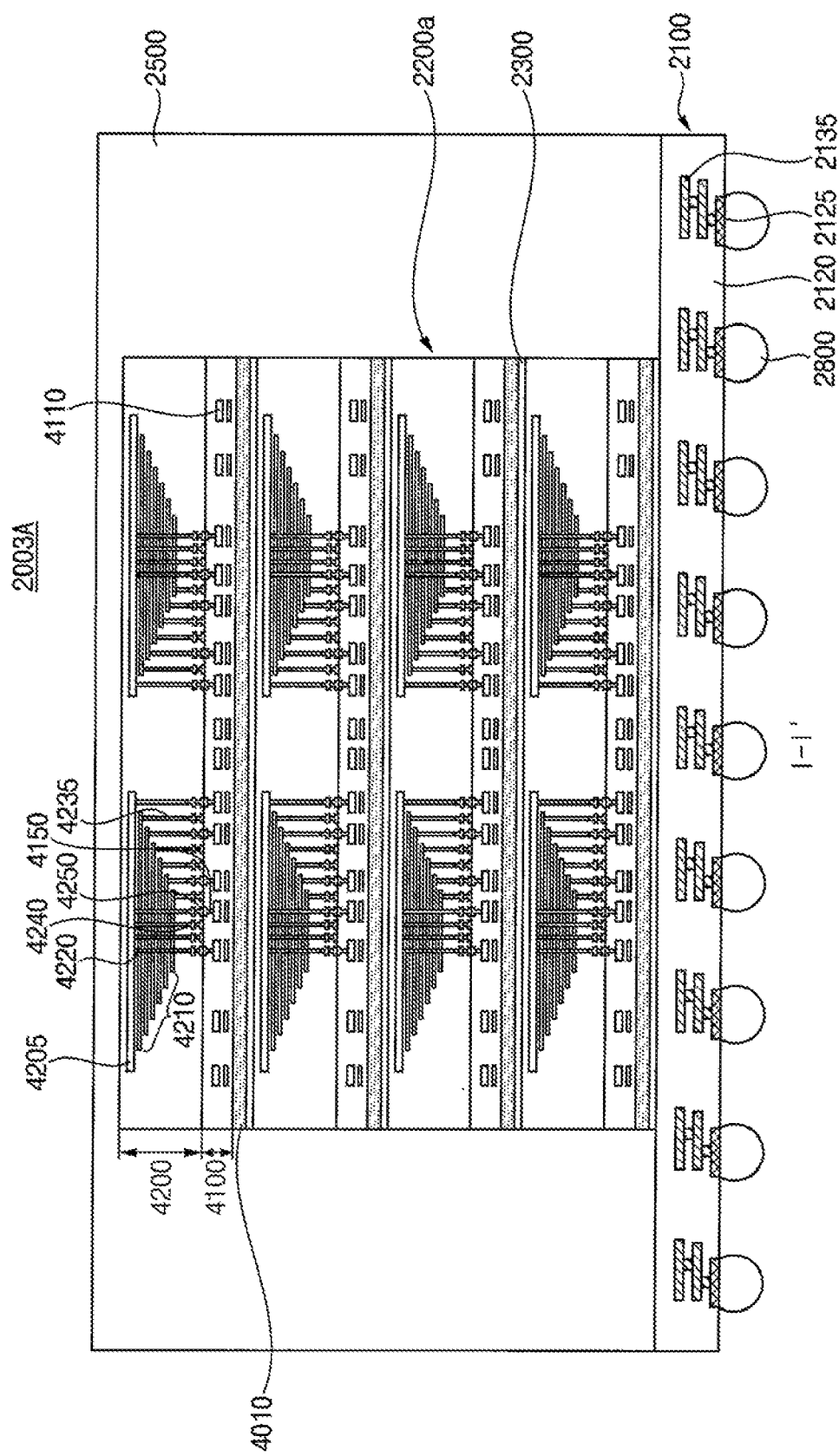

FIGS. 3 and 4 are cross-sectional views of semiconductor packages each of which may include a semiconductor device in accordance with example embodiments. FIGS. 3 and 4 illustrate example embodiments of the semiconductor package 2003 shown in FIG. 2, and show a cross-section taken along a line I-I' of the semiconductor package 2003 in FIG. 2.

Referring to FIG. 3, in the semiconductor package 2003, the package substrate 2100 may be a PCB. The package substrate 2100 may include a substrate body part 2120, upper pads 2130 (refer to FIG. 2) on an upper surface of the substrate body part 2120, lower pads 2125 on a lower surface of the substrate body part 2120 or exposed through the lower surface of the substrate body part 2120, and inner wirings 2135 for electrically connecting the upper pads 2130 and the lower pads 2125 in an inside of the substrate body part 2120. The upper pads 2130 may be electrically connected to the connection structures 2400. The lower pads 2125 may be connected to wiring patterns 2005 of the main substrate 2010 in the electronic system 2000 through conductive connection parts 2800, as shown in FIG. 2.

Each semiconductor chip 2200 may include a semiconductor substrate 3010, and a first structure 3100 and a second structure 3200 sequentially stacked on the semiconductor substrate 3010. The first structure 3100 may include a peripheral circuit region in which peripheral circuit wirings 3110 may be formed. The second structure 3200 may include a common source line 3205, a gate electrode structure 3210 on the common source line 3205, memory channel structures 3220 and division structures 3230 (refer to FIG. 2) extending through the gate electrode structure 3210, bit lines 3240 electrically connected to the memory channel structures 3220, and gate connection wirings 3235 electrically connected to the word lines WL of the gate electrode structure 3210 (refer to FIG. 1).

The second structure 3200 may further include a support structure 464 as illustrated in FIGS. 19-20 and 41-48.

Each semiconductor chip 2200 may include a through wiring 3245 electrically connected to the peripheral circuit wirings 3110 of the first structure 3100 and extending in the second structure 3200. The through wiring 3245 may be at an outside of the gate electrode structure 3210, and some through wirings 3245 may extend through the gate electrode structure 3210. Each semiconductor chip 2200 may further include the input/output pad 2210 (refer to FIG. 2) electrically connected to the peripheral circuit wirings 3110 of the first structure 3100.

Referring to FIG. 4, in a semiconductor package 2003A, each semiconductor chip 2200a may include a semiconductor substrate 4010, a first structure 4100 on the semiconductor substrate 4010, and a second structure 4200 on and bonded with the first structure 4100 by a wafer bonding method.

The first structure 4100 may include a peripheral circuit region in which a peripheral circuit wiring 4110 and first bonding structures 4150 may be formed. The second structure 4200 may include a common source line 4205, a gate electrode structure 4210 between the common source line 4205 and the first structure 4100, memory channel structures 4220 and the division structure 3230 (refer to FIG. 2) extending through the gate electrode structure 4210, and second bonding structures 4250 electrically connected to the memory channel structures 4220 and the word lines WL (refer to FIG. 1) of the gate electrode structure 4210. For example, the second bonding structures 4250 may be electrically connected to the memory channel structures 4220 and the word lines WL (refer to FIG. 1) through the bit lines 4240 electrically connected to the memory channel structures 4220 and the gate connection wirings 4235 electrically connected to the word lines WL (refer to FIG. 1), respectively. The first bonding structures 4150 of the first structure 4100 and the second bonding structures 4250 of the second structure 4200 may contact each other to be bonded with each other. The first bonding structures 4150 and the second bonding structures 4250 may include, e.g., copper.

The second structure 4200 may further include the support structure 464 as shown in FIGS. 11 to 13, FIGS. 19-20 and 41-48.

Each semiconductor chip 2200a may further include the input/output pad 2210 (refer to FIG. 2) electrically connected to the peripheral circuit wirings 4110 of the first structure 4100.

The semiconductor chips 2200 of FIG. 3 and the semiconductor chips 2200a of FIG. 4 may be electrically connected with each other by the connection structures 2400 in a bonding wire method. In an implementation, semiconductor chips such as the semiconductor chips 2200 of FIG. 3 and the semiconductor chips 2200a of FIG. 4 in the same semiconductor package may be electrically connected with each other by a connection structure including a TSV.

FIGS. 5 to 44 are plan views and cross-sectional views of stages in a method of manufacturing a vertical memory device in accordance with example embodiments. Particularly, FIGS. 5-6, 10, 21-22, 27, 34, 37 and 39 are the plan views, and FIGS. 7-9, 11-20, 23-26, 28-33, 35-36, 38 and 40-44 are the cross-sectional views.

FIGS. 7-9, 11 and 40-41 are cross-sectional views taken along lines A-A', respectively, of corresponding plan views, each of FIGS. 12-20 and 42 includes cross-sectional views taken along lines B-B' and C-C', respectively, of a corresponding plan view, FIGS. 23-26, 28-30, 32, 35, 38 and 43 are cross-sectional views taken along lines D-D' of corresponding plan views, respectively, and FIGS. 31, 33, 36 and 44 are cross-sectional views taken along lines E-E' of corresponding plan views, respectively. FIGS. 6 to 44 are drawings of region X in FIG. 5, and FIG. 20 includes enlarged cross-sectional views of regions Y and Z, respectively.

Figure 5:
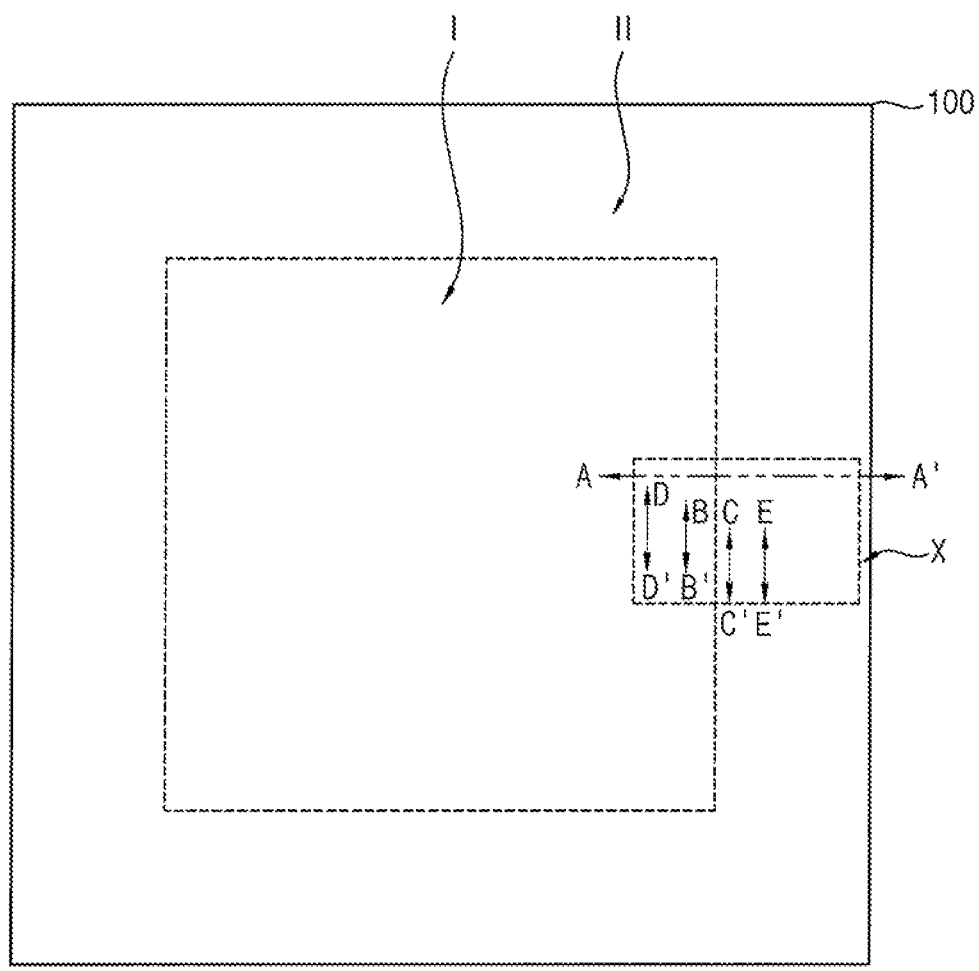
FIGS. 5 to 44 are plan views and cross-sectional views of stages in a method of manufacturing a vertical memory device in accordance with example embodiments.

Referring to FIG. 5, a substrate 100 may include a first region I and a second region II surrounding the first region I.

The substrate 100 may include silicon, germanium, silicon-germanium, or a III-V compound such as GaP, GaAs, GaSb, or the like. In an implementation, the substrate 100 may be a silicon-on-insulator (SOI) substrate or a germanium-on-insulator (GOI) substrate. In an implementation, the substrate 100 may be doped with p-type impurities, e.g., boron, or n-type impurities, e.g., phosphorus. As used herein, the term "or" is not an exclusive term, e.g., "A or B" would include A, B, or A and B.

In an implementation, the first region I may be a cell array region, the second region II be a pad region or an extension region. In an implementation, the first and second regions I and II together may form a cell region. In an implementation, memory cells, each of which may include a gate electrode, a channel, and a charge storage structure, may be formed on the first region I of the substrate 100, and upper contact plugs for transferring electrical signals to the memory cells and pads of the gate electrodes contacting the upper contact plugs may be formed on the second region II of the substrate 100. In an implementation, as illustrated in the drawings, the second region II may entirely surround the first region I. In an implementation, the second region II may be formed only on each of opposite sides in the second direction D2 of the first region I.

In an implementation, the substrate 100 may further include a third region surrounding the second region II, and upper circuit patterns for applying electrical signals to the memory cells through the upper contact plugs may be formed on the third region of the substrate 100.

Hereinafter, only structures in the region X partially including the first and second regions I and II of the substrate 100 will be illustrated.

Figure 6:
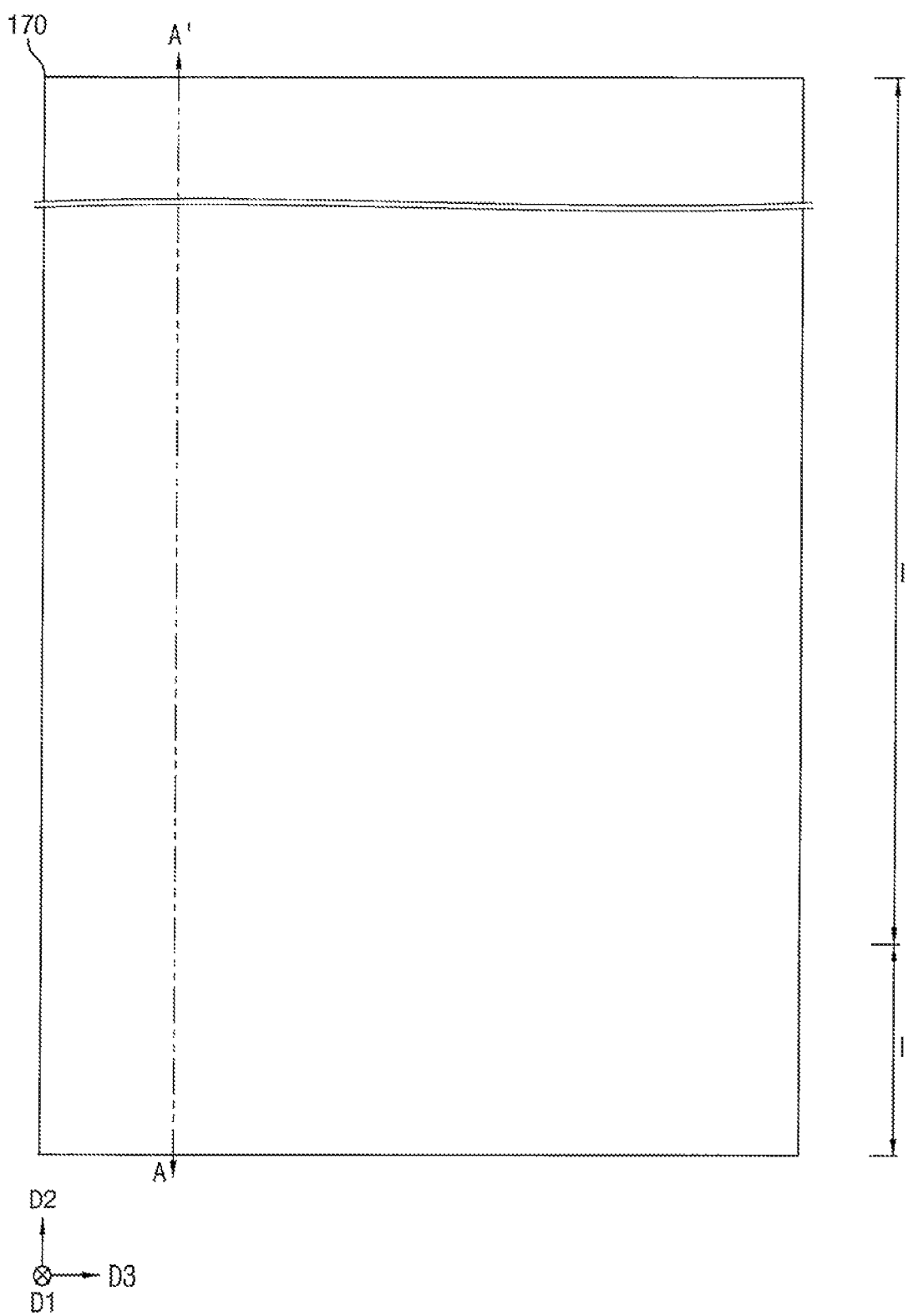
Figure 7:
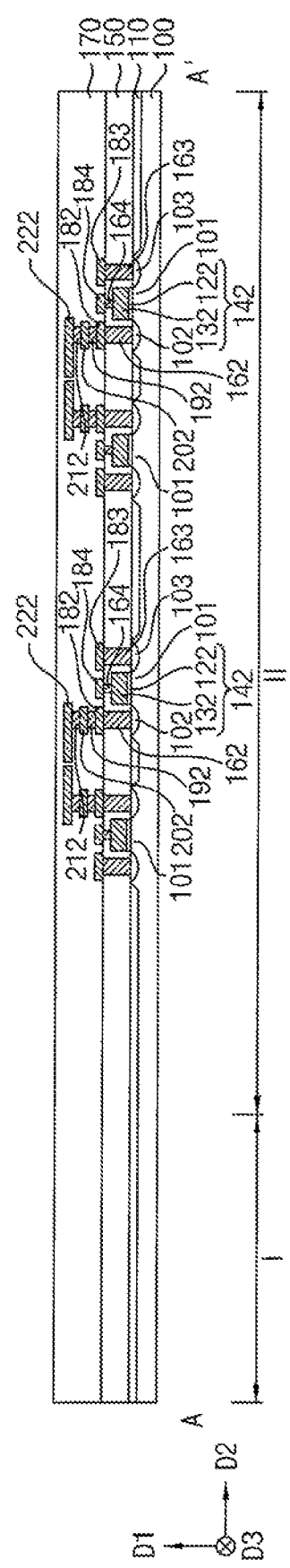

Referring to FIGS. 6 and 7, lower circuit patterns may be formed on the substrate 100, and first and second insulating interlayers 150 and 170 may be formed on the substrate 100 to cover the lower circuit patterns.

The substrate 100 may include a field region on which an isolation pattern 110 is formed and an active region 101 on which no isolation pattern is formed. The isolation pattern 110 may be formed by a shallow trench isolation (STI) process, and may include an oxide, e.g., silicon oxide.

In an implementation, the semiconductor device may have a cell over periphery (COP) structure. In an implementation, the lower circuit patterns may be formed on the substrate 100, and memory cells, upper contact plugs, and upper circuit patterns may be formed over the lower circuit patterns.

The lower circuit patterns may include, e.g., transistors, lower contact plugs, lower wirings, lower vias, or the like.

Figure 12:
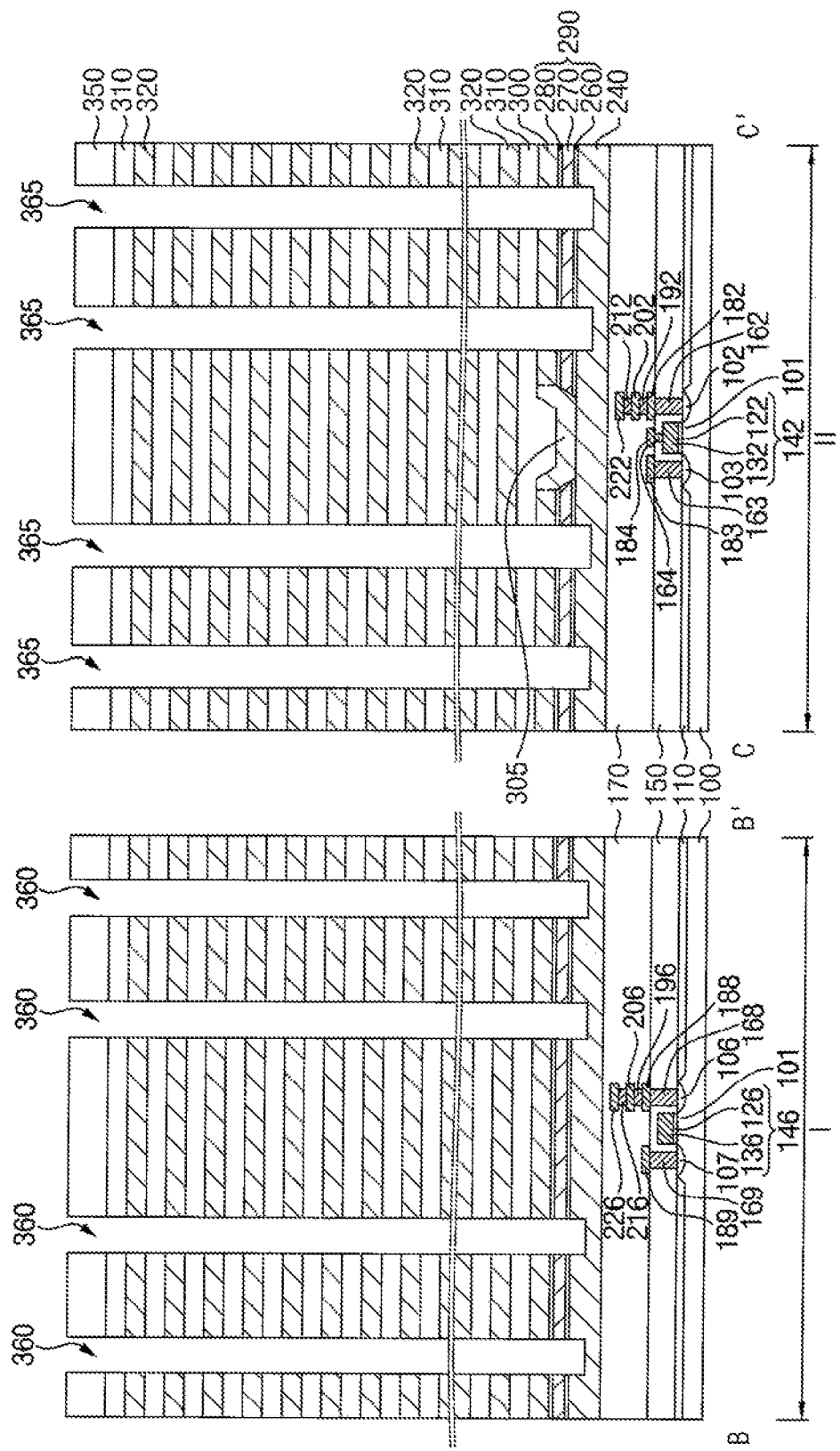

Referring to FIG. 12 together with FIGS. 6 and 7, e.g., first and second transistors may be formed on the second and first regions II and I, respectively, of the substrate 100. The first transistor may include a first lower gate structure 142 on the substrate 100 and first and second regions 102 and 103 serving as source/drain regions at upper portions of the active region 101 adjacent to the first lower gate structure 142, and the second transistor may include a second lower gate structure 146 on the substrate 100 and third and fourth regions 106 and 107 serving as source/drain regions at upper portions of the active region 101 adjacent to the second lower gate structure 146.

The first lower gate structure 142 may include a first lower gate insulation pattern 122 and a first lower gate electrode 132 sequentially stacked on the substrate 100, and the second lower gate structure 146 may include a second lower gate insulation pattern 126 and a second lower gate electrode 136 sequentially stacked on the substrate 100.

A first insulating interlayer 150 may be formed on the substrate 100 to cover the first and second transistors, and first, second, fourth and fifth lower contact plugs 162, 163, 168 and 169 extending through the first insulating interlayer 150 to contact the first to fourth impurity regions 102, 103, 106 and 107, respectively, and a third lower contact plug 164 extending through the first insulating interlayer 150 to contact the first lower gate electrode 132 may be formed. A sixth lower contact plug extending through the first insulating interlayer 150 to contact the second lower gate electrode 136 may be further formed.

First to fifth lower wirings 182, 183, 184, 188 and 189 may be formed on the first insulating interlayer 150 to contact upper surfaces of the first to fifth lower contact plugs 162, 163, 164, 168 and 169, respectively. A first lower via 192, a sixth lower wiring 202, a third lower via 212 and an eighth lower wiring 222 may be sequentially stacked on the first lower wiring 182, and a second lower via 196, a seventh lower wiring 206, a fourth lower via 216 and a ninth lower wiring 226 may be sequentially stacked on the fourth lower wiring 188.

The second insulating interlayer 170 may be formed on the first insulating interlayer 150 to cover the first to ninth lower wirings 182, 183, 184, 188, 189, 202, 206, 222 and 226 and the first to fourth lower vias 192, 194, 212 and 216.

Each element included in the lower circuit patterns may be formed by, e.g., a patterning process and/or a damascene process.

Figure 8:
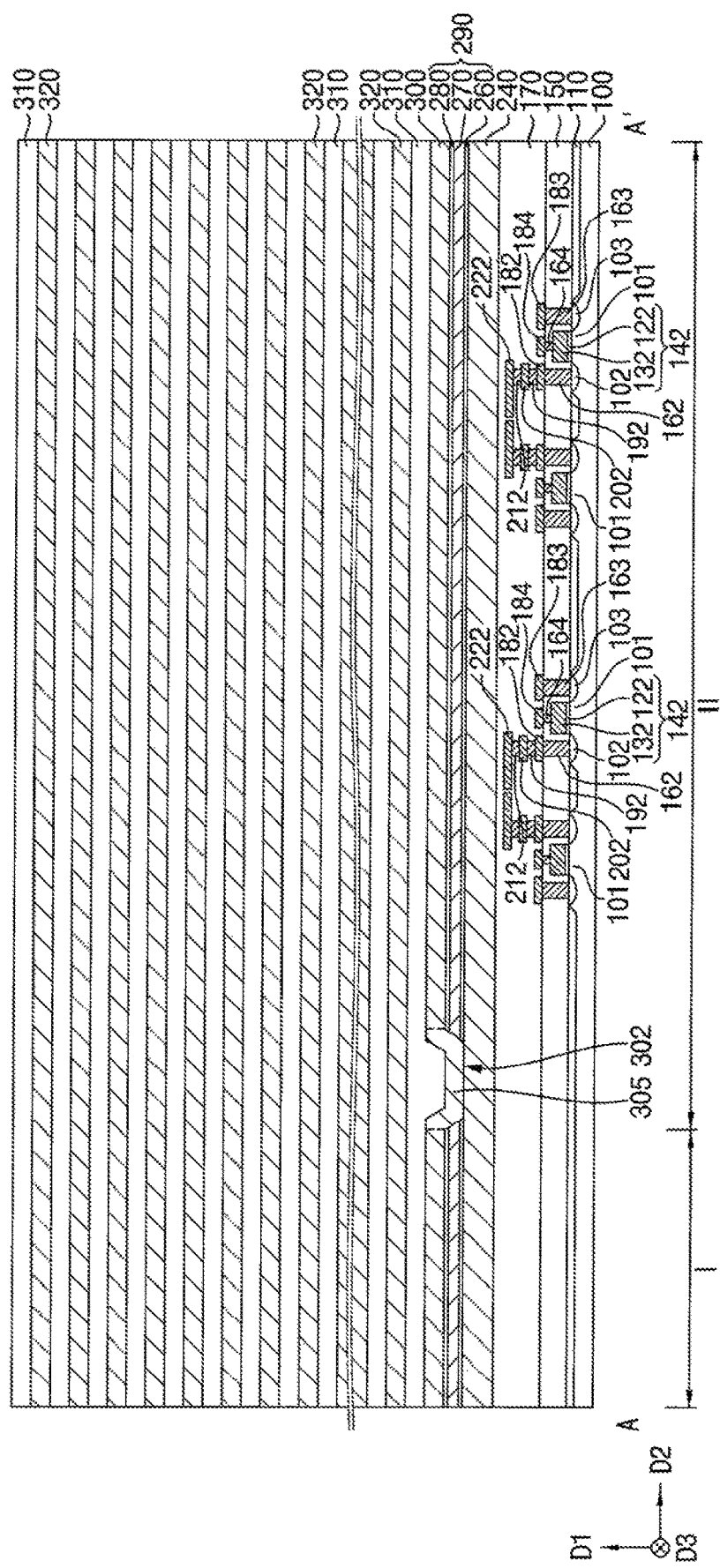

Referring to FIG. 8, a common source plate (CSP) 240 and a first sacrificial layer structure 290 may be sequentially formed on the second insulating interlayer 170, the first sacrificial layer structure 290 may be partially removed to form a first opening 302 exposing an upper surface of the CSP 240, and a first support layer 300 may be formed on an upper surface of the first sacrificial layer structure 290 and the exposed upper surface of the CSP 240.

The CSP 240 may include polysilicon doped with, e.g., n-type impurities. In an implementation, the CSP 240 may include a metal silicide layer and a polysilicon layer doped with, e.g., n-type impurities sequentially stacked. The metal silicide layer may include, e.g., tungsten silicide.

The first sacrificial layer structure 290 may include first, second and third sacrificial layers 260, 270 and 280 sequentially stacked in the first direction D1. The first and third sacrificial layers 260 and 280 may include an oxide, e.g., silicon oxide, and the second sacrificial layer 270 may include a nitride, e.g., silicon nitride.

The first opening 302 may have various layouts in a plan view. In an implementation, a plurality of first openings 302 may be formed to be spaced apart from each other in each of the second and third directions D2 and D3 on the first region I of the substrate 100. In an implementation, the first opening 302 may extend in the third direction D3 on a portion of the second region II of the substrate 100 adjacent to the first region I, and a plurality of first openings 302 each of which may extend in the second direction D2 may be spaced apart from each other in the third direction D3 on the second region II of the substrate 100.

The first support layer 300 may include a material having an etching selectivity with respect to the first to third sacrificial layers 260, 270 and 280, e.g., polysilicon doped with n-type impurities. The first support layer 300 may have a uniform thickness, and a first recess may be formed on a portion of the first support layer 300 in the first opening 302.

Hereinafter, the portion of the first support layer 300 may be referred to as a support pattern 305.

An insulation layer 310 and a fourth sacrificial layer 320 may be alternately and repeatedly stacked on the first support layer 300 and the support pattern 305, e.g., a mold layer including the insulation layers 310 and the fourth sacrificial layers 320 may be formed. The insulation layer 310 may include an oxide, e.g., silicon oxide, and the fourth sacrificial layer 320 may include a material having an etching selectivity with respect to the insulation layer 310, e.g., a nitride such as silicon nitride.

Figure 10:
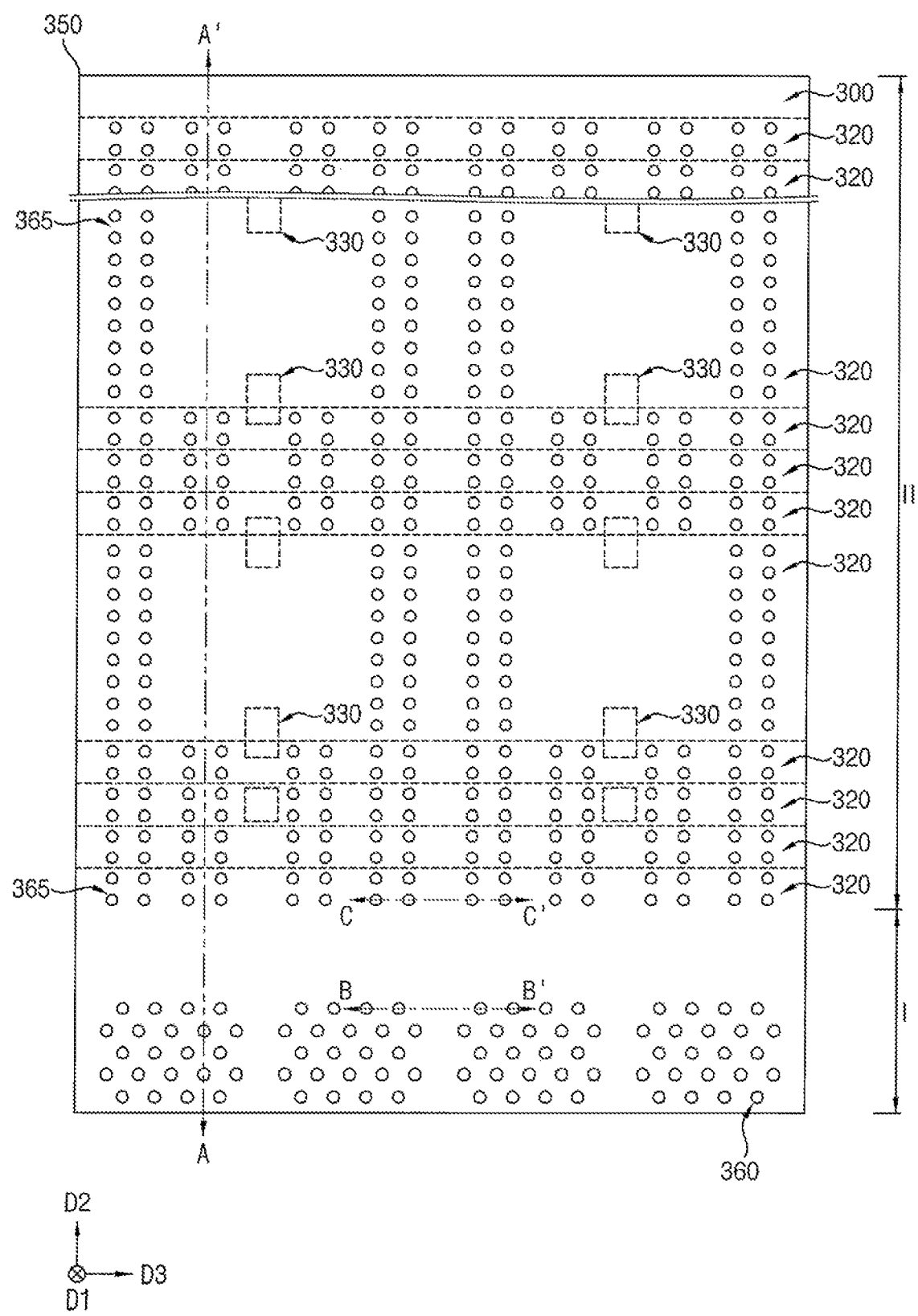

In an implementation, referring to FIG. 10 together with FIG. 8, a first division pattern 330 may be formed through a lowermost one of the fourth sacrificial layers 320. The first division pattern 330 may be formed on the second region II of the substrate 100, and may include an oxide, e.g., silicon oxide. In an implementation, a plurality of first division patterns 330 may be formed to be spaced apart from each other in each of the second and third directions D2 and D3.

Figure 9:
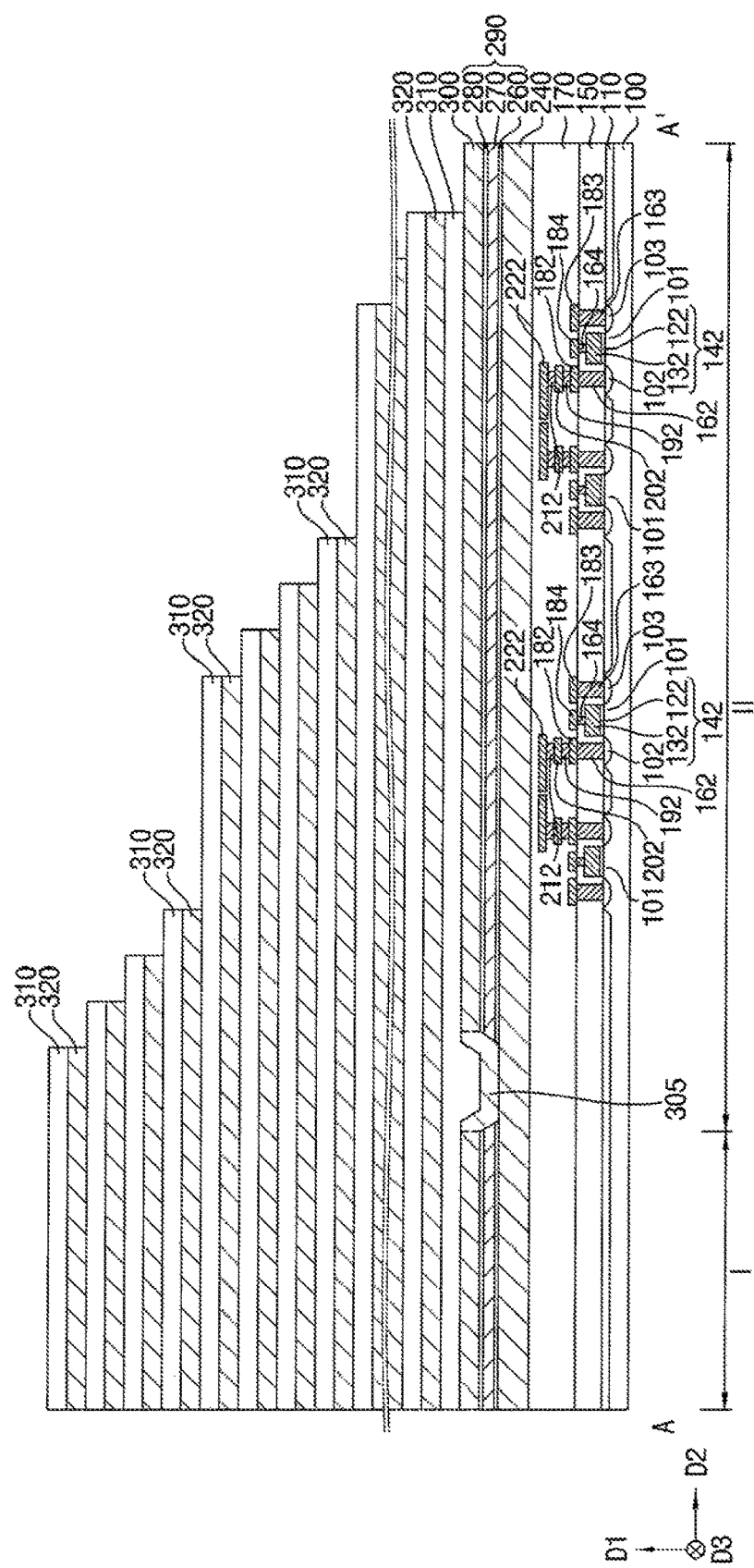

Referring to FIG. 9, a photoresist pattern may be formed on an uppermost one of the insulation layers 310, and the uppermost one of the insulation layers 310 and an uppermost one of the fourth sacrificial layers 320 may be etched using the photoresist pattern as an etching mask. Thus, one of the insulation layers 310 directly under the uppermost one of the fourth sacrificial layers 320 may be partially exposed.

A trimming process in which an area of the photoresist pattern is reduced by a given ratio may be performed, and the uppermost one of the insulation layers 310, the uppermost one of the fourth sacrificial layers 320, the exposed one of the insulation layers 310, and one of the fourth sacrificial layers 320 directly under the exposed one of the insulation layers 310 may be etched using the photoresist pattern having the reduced area. The trimming process and the etching process may be alternately and repeatedly performed to form a mold having a staircase shape including a plurality of step layers each of which may include one fourth sacrificial layer 320 and one insulation layer 310 sequentially stacked.

Hereinafter, the "step layer" may be defined as not only an exposed portion but also a non-exposed portion of the fourth sacrificial layer 320 and the insulation layer 310 at the same level, and the exposed portion thereof may be defined as a "step." In an implementation, the steps may be arranged in the second direction D2. In an implementation, the steps may also be arranged in the third direction D3.

In an implementation, lengths in the second direction D2 of the steps included in the mold may be uniform except for lengths of some ones, which may be greater than the lengths of other ones. Hereinafter, ones of the steps having relatively small lengths may be referred to as first steps, and other ones of the steps having relatively large lengths may be referred to as second steps. FIG. 9 shows two second steps. The steps will be denoted by dotted lines in plan views, hereinafter.

The mold may be formed on the first support layer 300 and the support pattern 305 on the first and second regions I and II of the substrate 100, and an edge upper surface of the first support layer 300 may not be covered by the mold but exposed. The steps of the mold may be formed on the second region II of the substrate 100.

Figure 11:
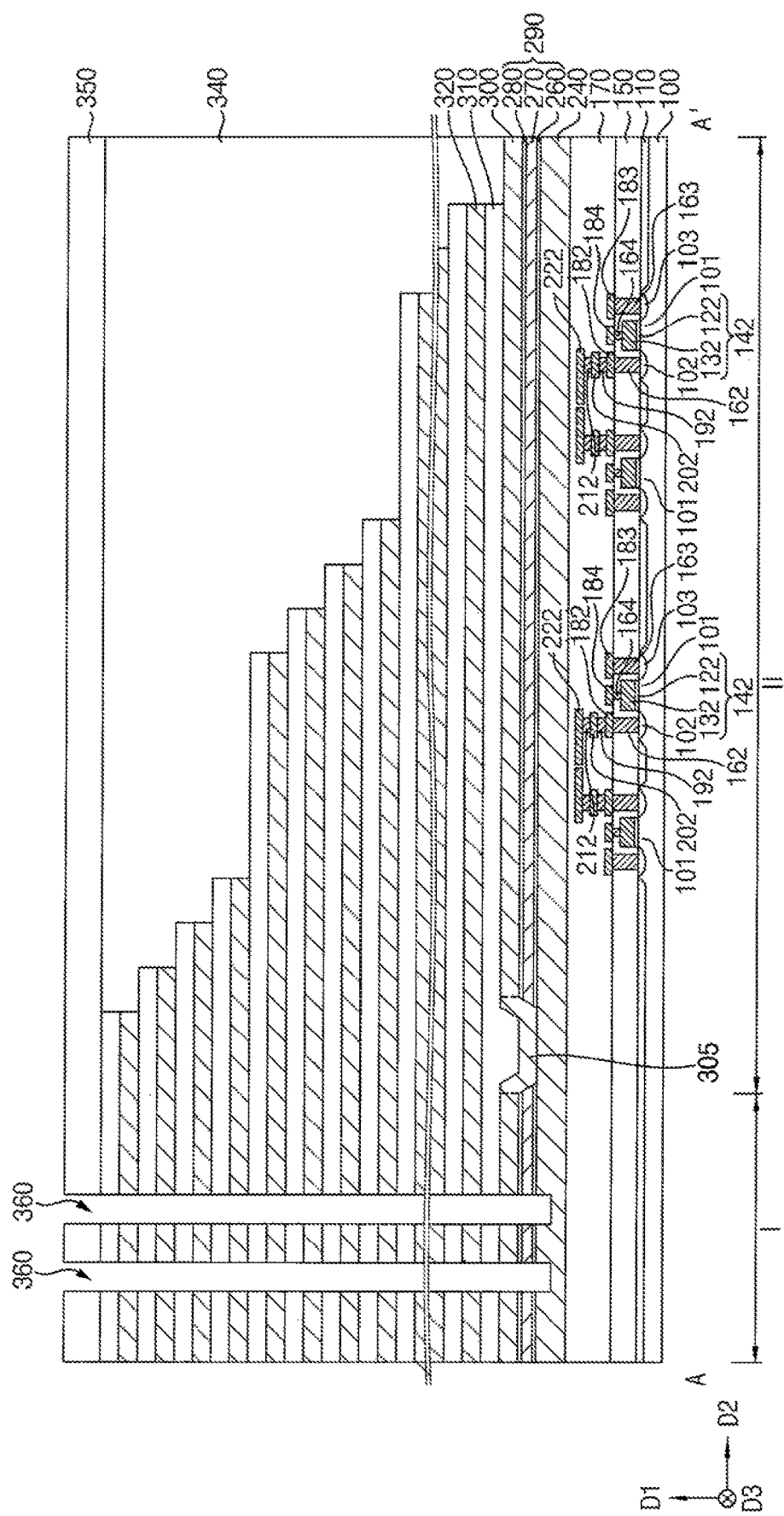

Referring to FIGS. 10 to 12, a third insulating interlayer 340 including an oxide, e.g., silicon oxide, may be formed on the CSP 240 to cover the mold and the first support layer 300, and may be planarized until an upper surface of the uppermost one of the insulation layers 310 of the mold is exposed. Thus, a sidewall of the mold, an upper surface and a sidewall of the first support layer 300, and a sidewall of the first sacrificial layer structure 290 may be covered by the third insulating interlayer 340. A fourth insulating interlayer 350 including an oxide, e.g., silicon oxide may be formed on upper surfaces of the mold and the third insulating interlayer 340.

A channel hole 360 extending in the first direction D1 may be formed through the fourth insulating interlayer 350, the mold, the first support layer 300 and the first sacrificial layer structure 290 on the first region I of the substrate 100 to expose an upper surface of the CSP 240, and a dummy channel hole 365 extending in the first direction D1 may be formed through the third and fourth insulating interlayers 340 and 350, a portion of the mold, the first support layer 300 and the first sacrificial layer structure 290 on the second region II of the substrate 100 to expose an upper surface of the CSP 240. In an implementation, a plurality of channel holes 360 may be formed spaced apart in each of the second and third directions D2 and D3 on the first region I of the substrate 100, and a plurality of dummy channel holes 365 may be formed spaced apart in each of the second and third directions D2 and D3 on the second region II of the substrate 100.

In an implementation, each of the channel hole 360 and the dummy channel hole 365 may have a shape of a circle, ellipse, polygon, or rounded polygon having rounded corners in a plan view. In an implementation, the dummy channel hole 365 may have a diameter greater than that of the channel hole 360. The channel holes 360 and the dummy channel holes 365 may be simultaneously formed by the same etching process, or may be sequentially formed by independent etching processes.

Figure 13:
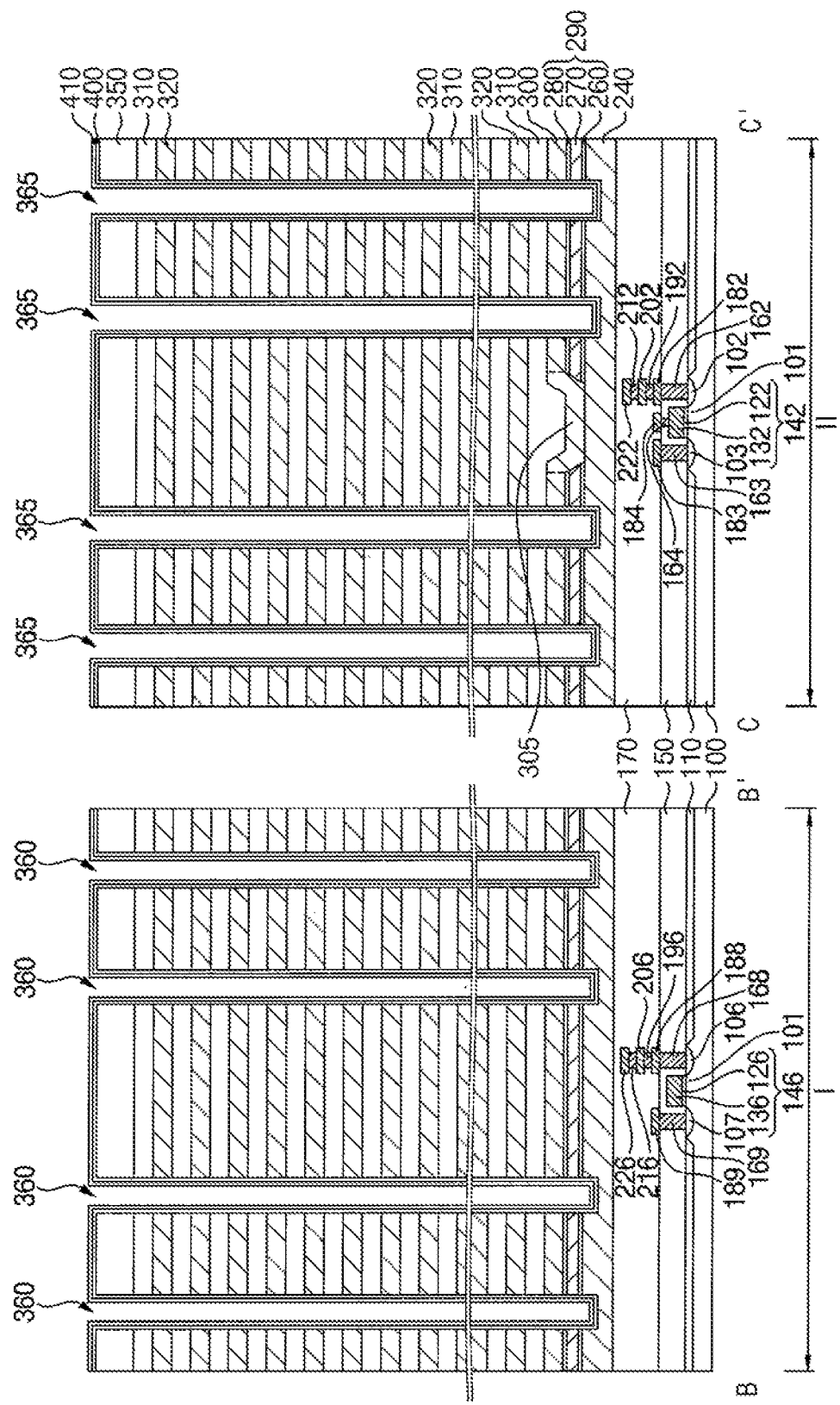

Referring to FIG. 13, a charge storage structure layer 400 and a channel layer 410 may be sequentially formed on sidewalls of the channels hole 360 and the dummy channel hole 365, the exposed upper surface of the CSP 240, and an upper surface of the fourth insulating interlayer 350.

In an implementation, the charge storage structure layer 400 may include a first blocking layer, a charge storage layer, and a tunnel insulation layer sequentially stacked. The first blocking layer and the tunnel insulation layer may include an oxide, e.g., silicon oxide, the charge storage layer may include a nitride, e.g., silicon nitride, and the channel layer 410 may include, e.g., polysilicon or single crystalline silicon that is undoped or doped with impurities.

Figure 14:
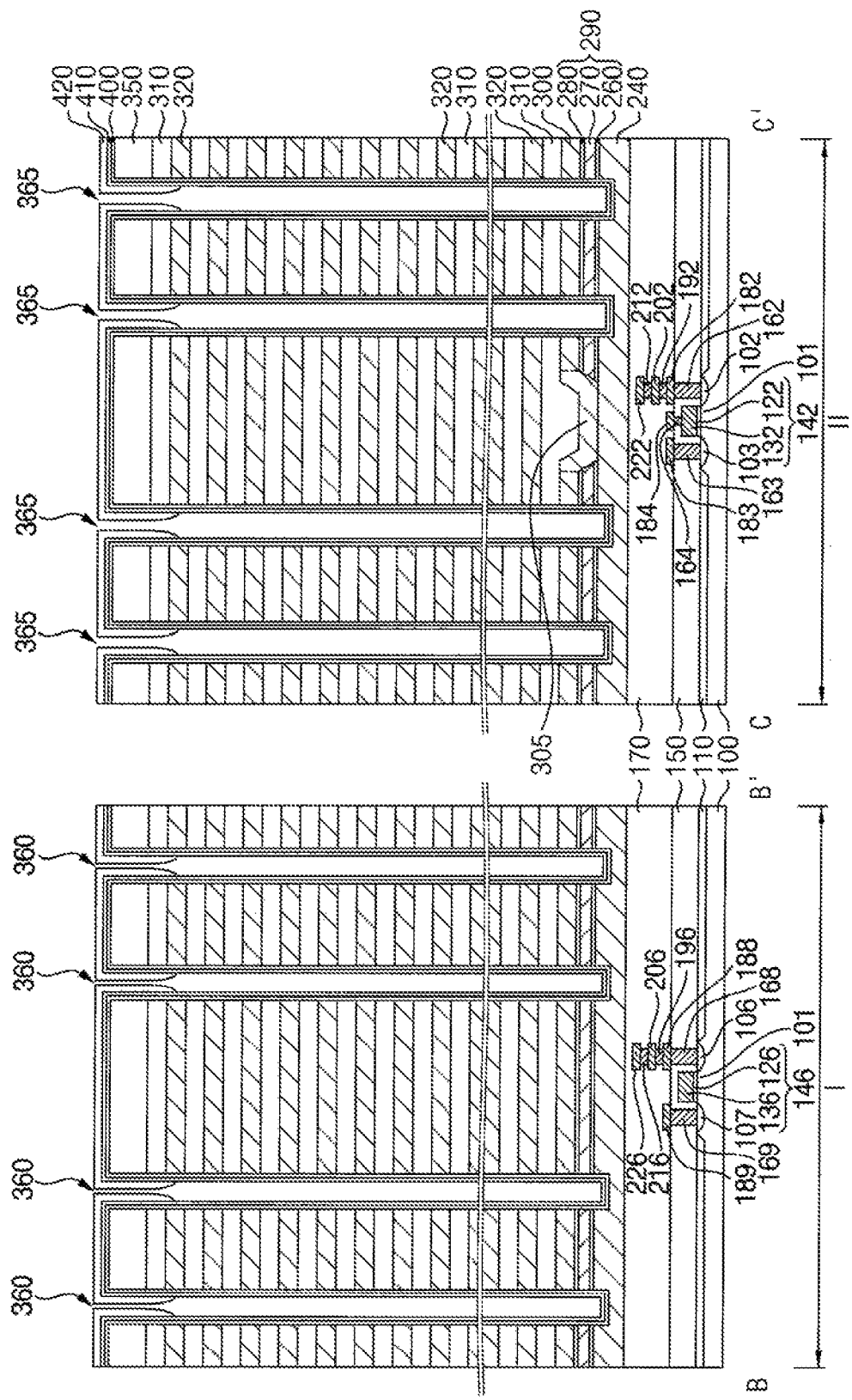

Referring to FIG. 14, a mask 420 may be formed on the channel layer 410.

In an implementation, the mask 420 may be formed by a chemical vapor deposition (CVD) process, and may include a material having a low gap filling characteristic, e.g., silicon oxide such as tetraethyl orthosilicate (TEOS). As the mask 420 includes the material having the low gap filling characteristic, the mask 420 may not entirely fill each of the channel hole 360 and the dummy channel hole 365, but may partially fill each of the channel hole 360 and the dummy channel hole 365.

In an implementation, the mask 420 may cover a portion of the channel layer 410 on an upper surface of the fourth insulating interlayer 350 and portions of the channel layer 410 on upper sidewalls of the channel hole 360 and the dummy channel hole 365, and central upper portions and lower portions of the channel hole 360 and the dummy channel hole 365 may not be filled with the mask 420.

In an implementation, a lowermost surface (e.g., surface closest to the substrate 100 in the first direction D1) of the mask 420 may be lower than (e.g., closer to the substrate 100 in the first direction D1 than) an upper surface (e.g., surface facing away from the substrate 100) of the uppermost one of the fourth sacrificial layers 320.

Figure 15:
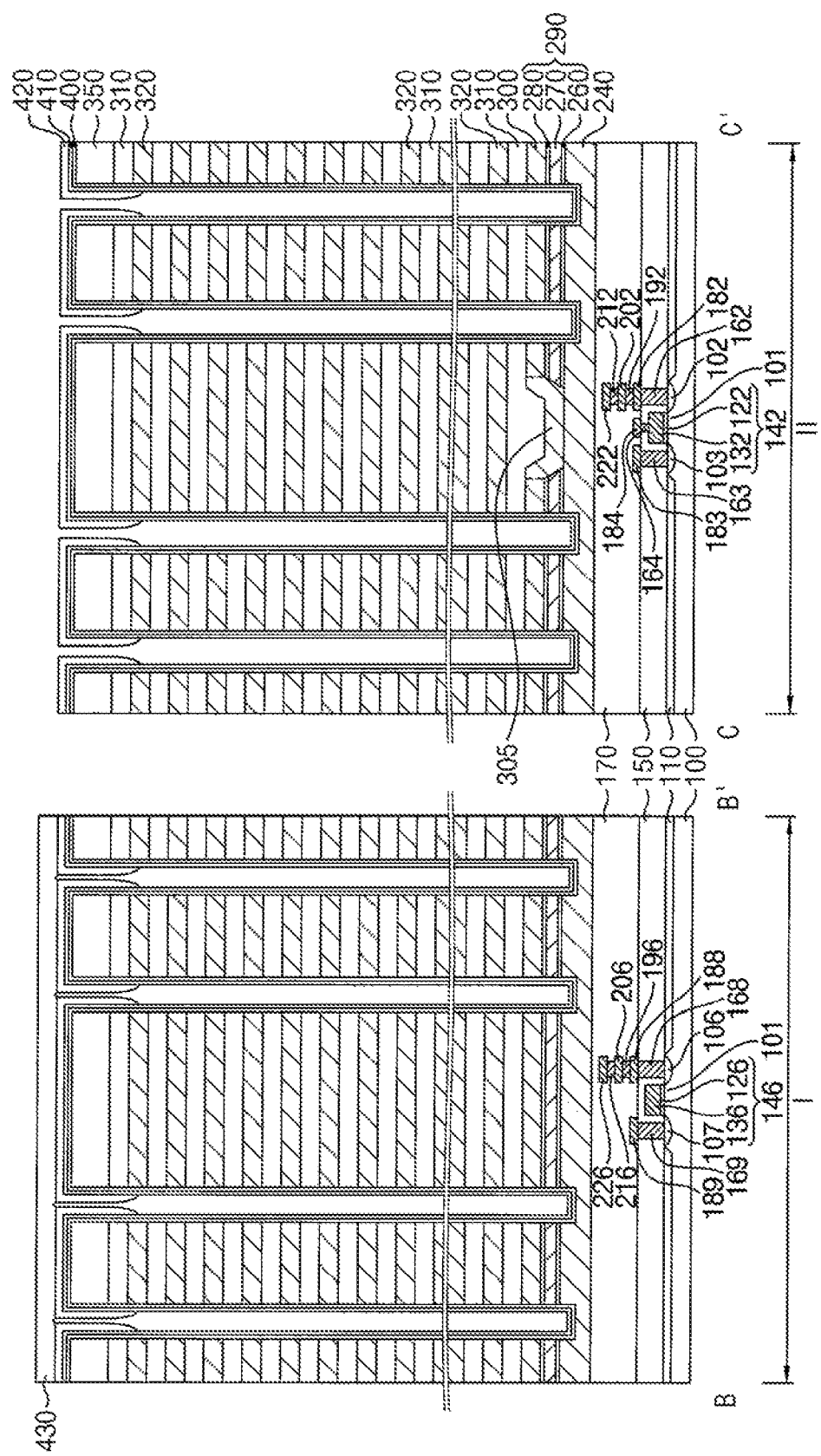

Referring to FIG. 15, a first capping layer 430 may be formed on the mask 420.

The first capping layer 430 may include, e.g., amorphous carbon layer (ACL) or spin-on-hardmask (SOH).

The first capping layer 430 may be formed on the mask 420, and may cover upper ends of the channel hole 360 and the dummy channel hole 365.

A portion of the first capping layer 430 on the second region II of the substrate 100 may be removed by an etching process using a photoresist pattern, and a portion of the mask 420 on the second region II of the substrate 100 and a portion of the channel layer 410 in the dummy channel hole 365 that is not covered by the mask 420 may be exposed. The first capping layer 430 may remain only on the first region I of the substrate 100.

Figure 16:
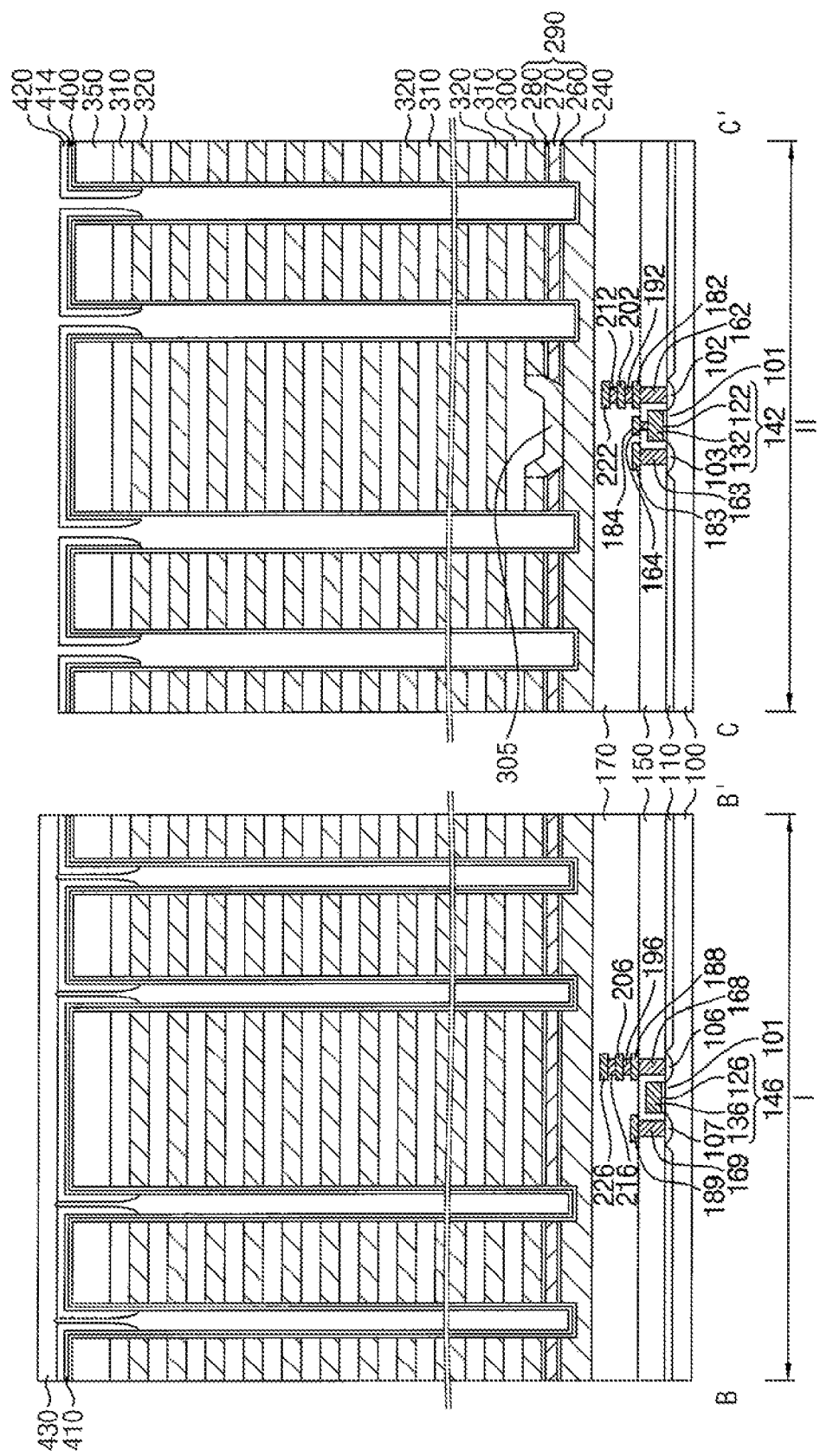

Referring to FIG. 16, a portion of the channel layer 410 in the dummy channel hole 365 that is not covered by the mask 420 may be removed, and a portion of the charge storage structure layer 400 in the dummy channel hole 365 may be exposed.

In an implementation, the portion of the channel layer 410 in the dummy channel hole 365 may be removed by a wet etching process using, e.g., SC1 solution, and the portion of the channel layer 410 that is not covered by the mask 420 may be entirely removed.

Hereinafter, a portion of the channel layer 410 covered by the mask 420 on the second region II of the substrate 100, which is not removed by the wet etching process, may be referred to as a dummy channel 414.

Figure 17:
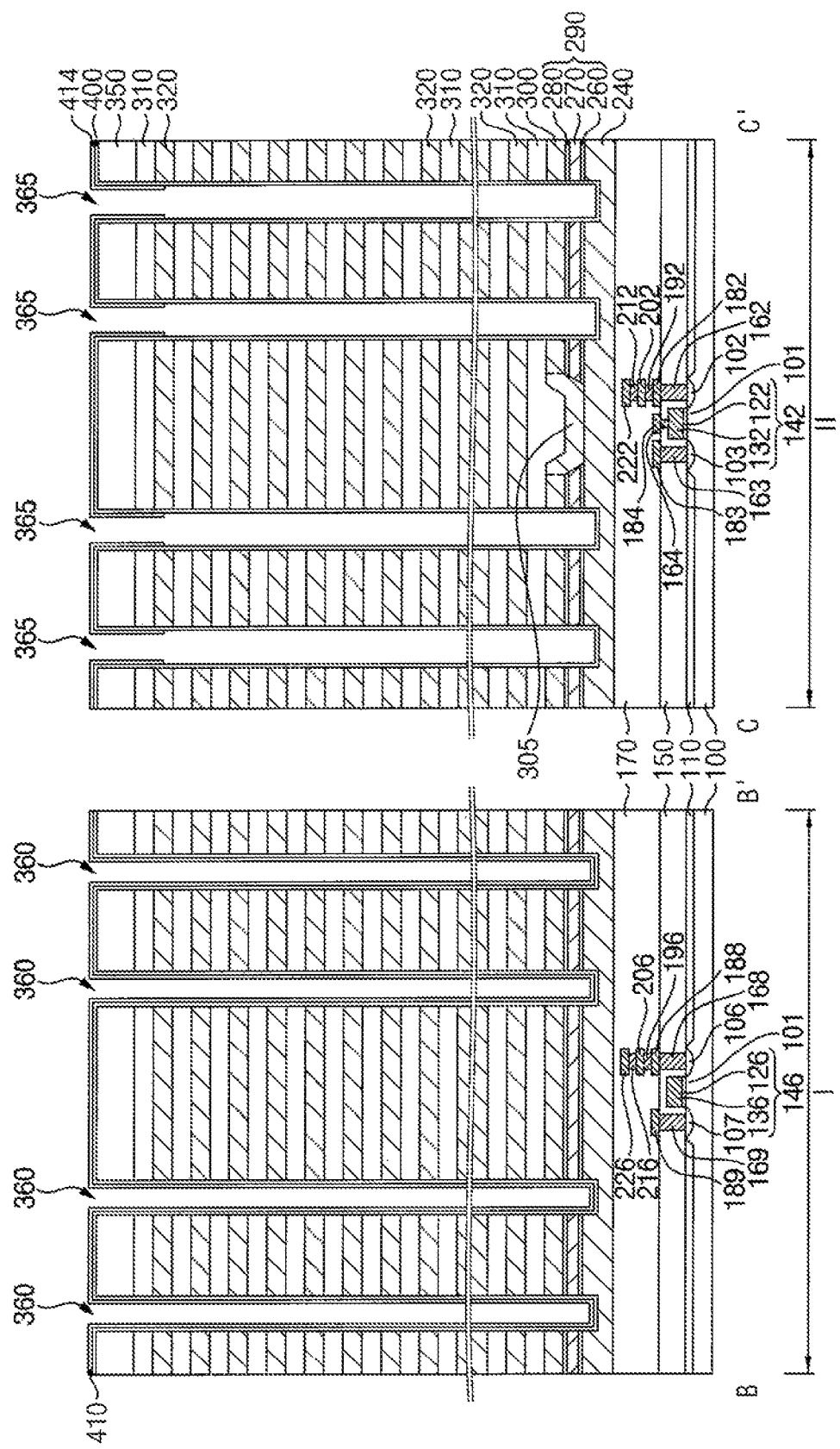

Referring to FIG. 17, the first capping layer 430 remaining on the first region I of the substrate 100 may be removed, and a portion of the mask 420 on the first region I of the substrate 100 and a portion of the channel layer 410 in the channel hole 360 that is not covered by the mask 420 may be exposed.

In an implementation, the first capping layer 430 may be removed by an ashing process or a stripping process.

The mask 420 on the first and second regions I and II of the substrate 100 may be removed by, e.g., a dry etching process. In an implementation, the channel layer 410 may be entirely exposed on the first region I of the substrate 100, and portions of the dummy channel 414 and the charge storage structure layer 400 may be exposed on the second region II of the substrate 100.

Figure 18:
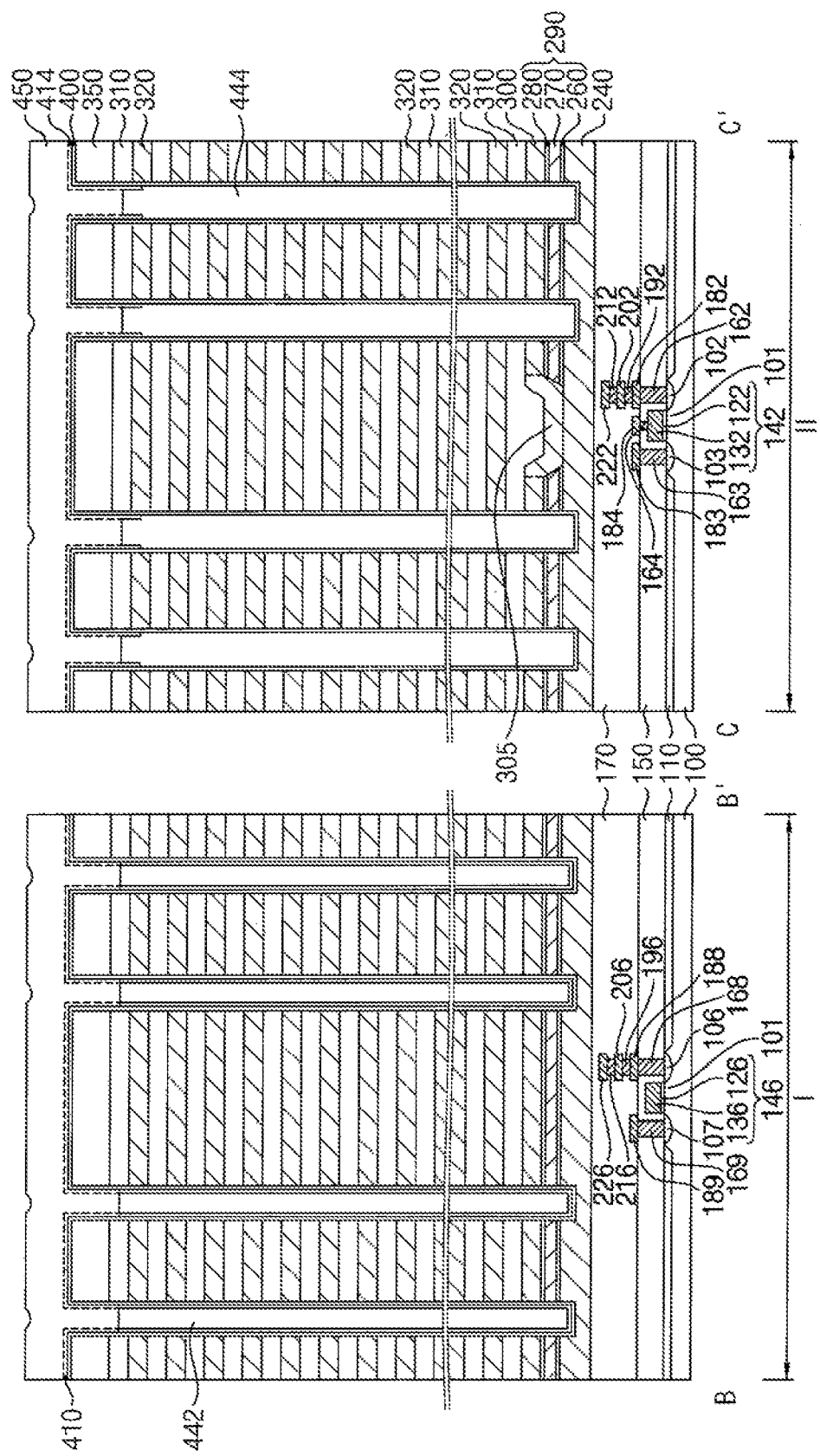

Referring to FIG. 18, a filling layer may be formed on the channel layer 410, the dummy channel 414, and the charge storage structure layer 400 to fill the channel hole 360 and the dummy channel hole 365, and an upper portion of the filling layer may be removed to form a second recess at an upper portion of each of the channel hole 360 and the dummy channel hole 365.

The filling layer may include an oxide, e.g., silicon oxide, and may be formed by, e.g., an ALD process, a CVD process, or the like.

In an implementation, the second recess may be formed by a wet etching process using, e.g., hydrofluoric acid (HF) as an etching solution. In an implementation, a lower surface of the second recess may be higher than the upper surface of the uppermost one of the fourth sacrificial layers 320. In an implementation, the lower surface of the second recess may be higher than a lowermost surface of the dummy channel 414 in the dummy channel hole 365 on the second region II of the substrate 100.

In an implementation, when the upper portion of the filling layer is removed to form the second recess, portions of the channel layer 410 and the dummy channel 414 adjacent to the second recess may also be removed.

Hereinafter, a portion of the filling layer in the channel hole 360 may be referred to as a first filling pattern 442, and a portion of the filling layer in the dummy channel hole 365 may be referred to as a second filling pattern 444. The second filling pattern 444 may entirely cover the exposed portion of the charge storage structure layer 400 in the dummy channel hole 365, and may also cover a lower surface and a sidewall of a lower end of the dummy channel 414.

A second capping layer 450 may be formed on the first and second filling patterns 442 and 444, the channel layer 410, and the dummy channel 414 to fill the second recess.

The second capping layer 450 may include, e.g., doped or undoped polysilicon, and if the channel layer 410 and the dummy channel 414 partially remain during the formation of the second recess, the second capping layer 450 may contact the channel layer 410 and the dummy channel 414 to be merged therewith.

Figure 19:
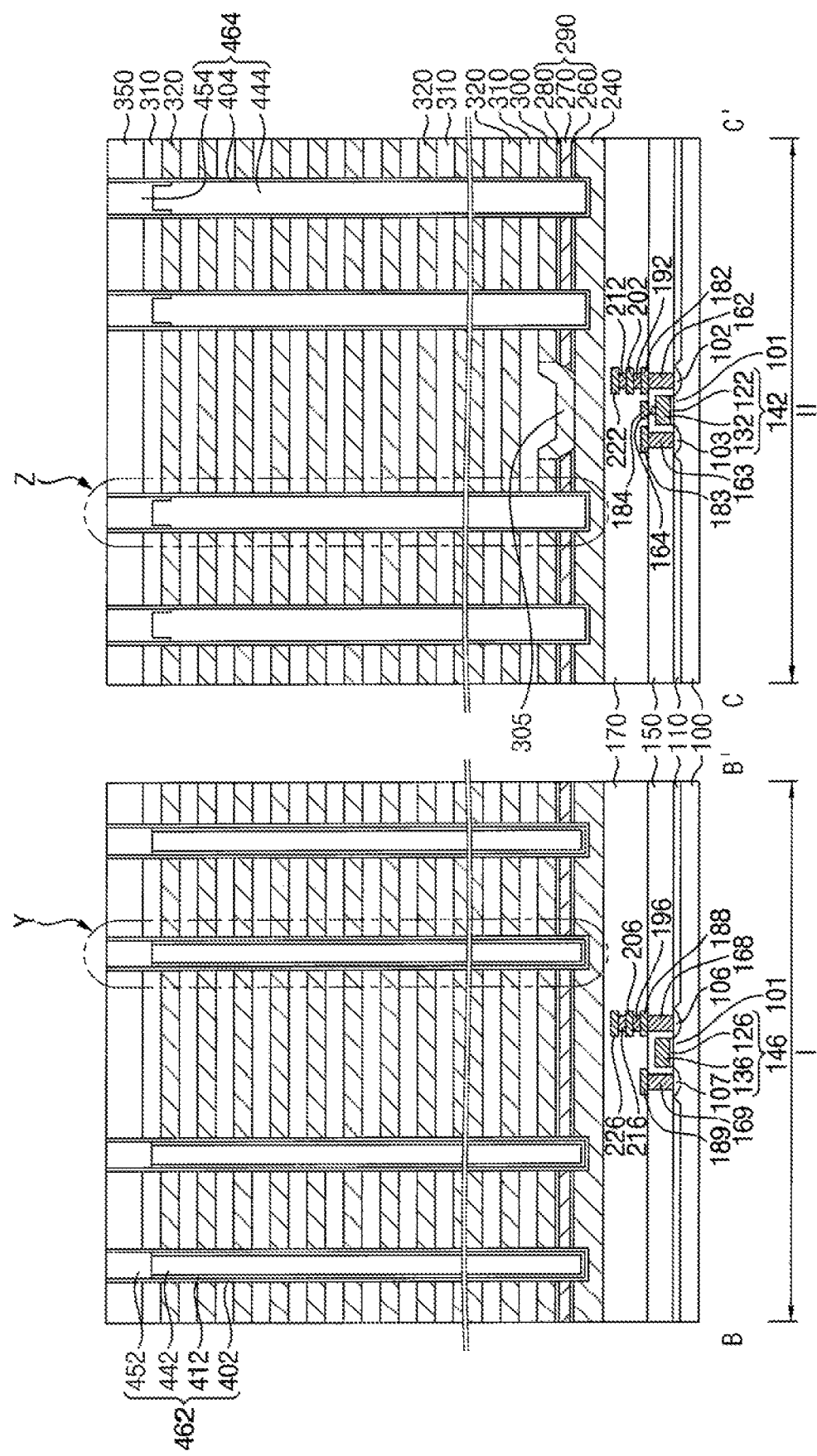
Figure 20:
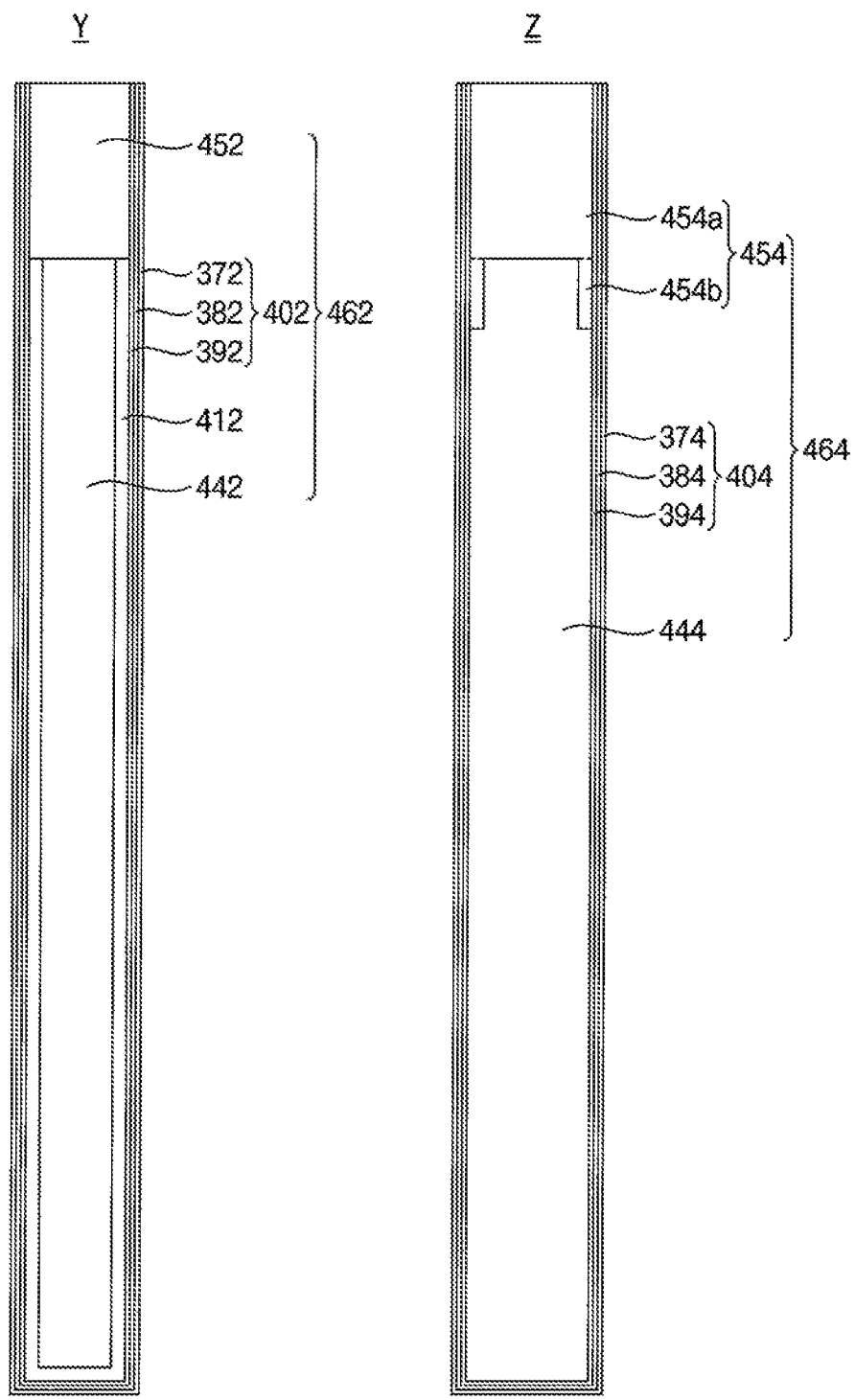

Referring to FIGS. 19 and 20, the second capping layer 450, the channel layer 410, the dummy channel 414, and the charge storage structure layer 400 may be planarized until the upper surface of the fourth insulating interlayer 350 is exposed.

The planarization process may be performed by, e.g., a chemical mechanical polishing (CMP) process or an etch back process.

By the planarization process, a first capping pattern 452 may be formed on the first filling pattern 442 and the channel layer 410 in the channel hole 360, and a second capping pattern 454 may be formed on the second filling pattern 444 and the dummy channel 414. As mentioned above, if the channel layer 410 remains at the upper portion of the channel hole 360 to be merged with the second capping layer 450, a portion of the channel layer 410 at a height equal to or greater than a height of an upper surface of the first filling pattern 442 in the channel hole 360 may be referred to as the first capping pattern 452 together with the second capping layer 450, and a portion of the channel layer 410 at a height equal to or less than a height of the upper surface of the first filling pattern 442 in the channel hole 360 may be referred to as a channel 412.

In an implementation, the dummy channel 414 in the dummy channel hole 365 together with the second capping layer 450 may be referred to as a second capping pattern 454. Thus, the second capping pattern 454 may include an upper portion 454a and a lower portion 454b protruding from the upper portion 454a downwardly (e.g., toward the substrate 100) in the first direction D1. Upper and lower surfaces of the upper portion 454a of the second capping pattern 454 may have a shape of a circuit, ellipse, polygon, or the like, and the lower portion 454b of the second capping pattern 454 may contact an (e.g., outer) edge of a lower (e.g., substrate 100-facing) surface of the upper portion 454a, and may have a shape of a ring.

By the planarization process, a charge storage structure 402 may be formed on a sidewall and a lower surface of the channel hole 360, and a dummy charge storage structure 404 may be formed on a sidewall and a lower surface of the dummy channel hole 365. The charge storage structure 402 may include a first blocking pattern 372, a charge storage pattern 382, and a tunnel insulation pattern 392 sequentially stacked, and the dummy charge storage structure 404 may include a dummy blocking pattern 374, a dummy charge storage pattern 384, and a dummy tunnel insulation pattern 394 sequentially stacked.

The charge storage structure 402, the channel 412, the first filling pattern 442, and the first capping pattern 452 in the channel hole 360 altogether may form a memory channel structure 462, and the dummy charge storage structure 404, the second capping pattern 454, and the second filling pattern 444 in the dummy channel hole 365 altogether may form a dummy memory channel structure 464. The dummy memory channel structure 464 may serve neither as a memory unit for storing data channel nor a channel in which charge carrier may move, but may help prevent the mold from leaning or falling down, and may be referred to as a support structure 464.

In an implementation, each of the memory channel structure 462 and the support structure 464 may have a shape of a pillar extending (e.g., lengthwise) in the first direction D1. In an implementation, a plurality of memory channel structures 462 may be formed to be spaced apart in each of the second and third directions D2 and D3 on the first region I of the substrate 100, and a plurality of support structures 464 may be formed to be spaced apart in each of the second and third directions D2 and D3 on the second region II of the substrate 100.

Figure 21:
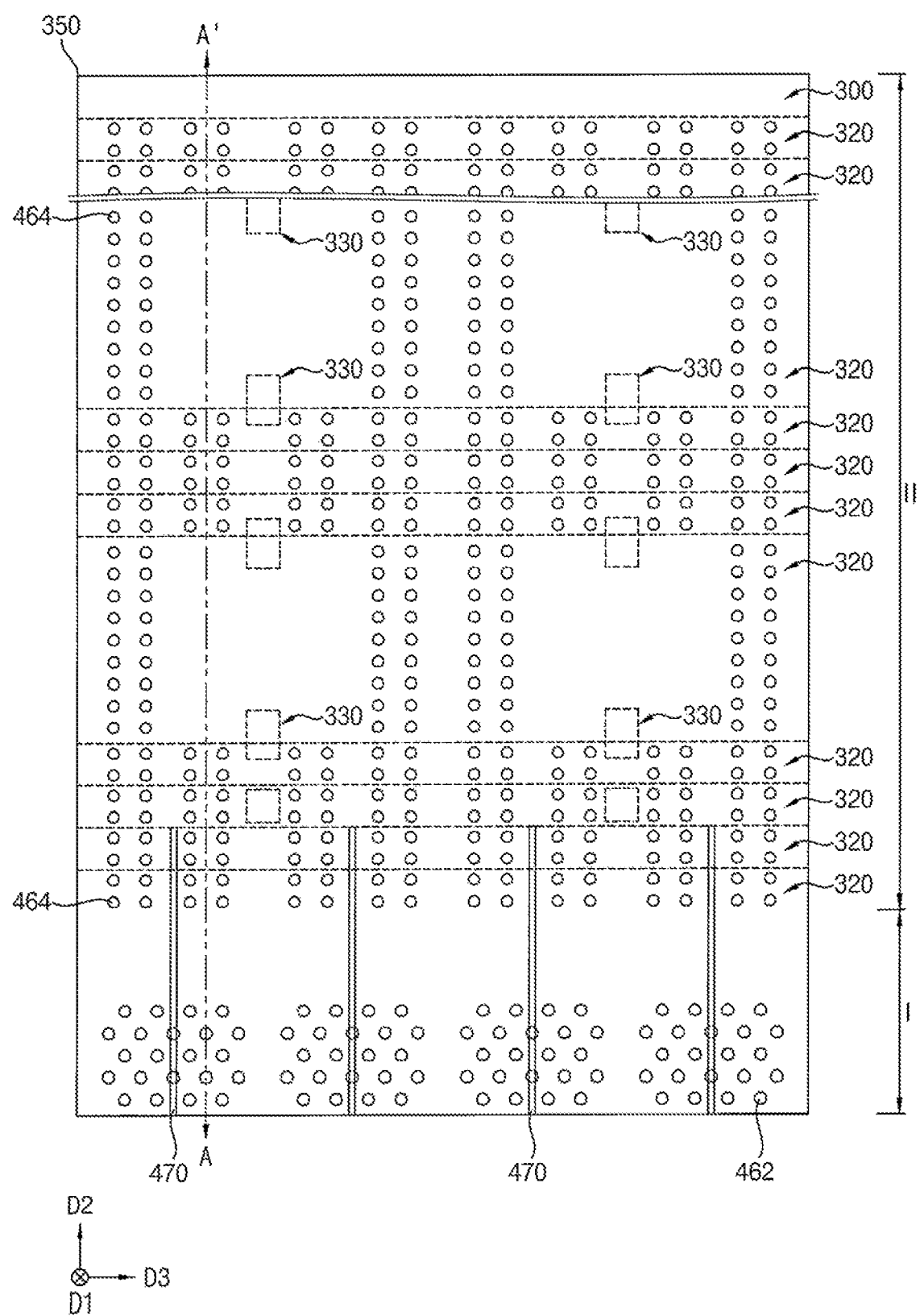

Referring to FIG. 21, the fourth insulating interlayer 350 and some of the insulation layers 310 and the fourth sacrificial layers 320 may be partially etched to form a second opening extending in the second direction D2, and a second division pattern 470 may be formed in the second opening.

In an implementation, the second division pattern 470 may extend through an upper portion of some of the memory channel structures 462. In an implementation, the second division pattern 470 may also extend through the fourth insulating interlayer 350, ones of the fourth sacrificial layers 320 at upper two levels, and ones of the insulation layers 310 at upper two levels, and may further extend through one of the insulation layers 310 at a third level from above. The second division pattern 470 may extend (e.g., lengthwise) in the second direction D2 on the first and second regions I and II of the substrate 100, and may extend through upper two step layers of the mold. In an implementation, the fourth sacrificial layers 320 at two upper levels of the mold may be divided in the third direction D3 by the second division pattern 470.

Figure 22:
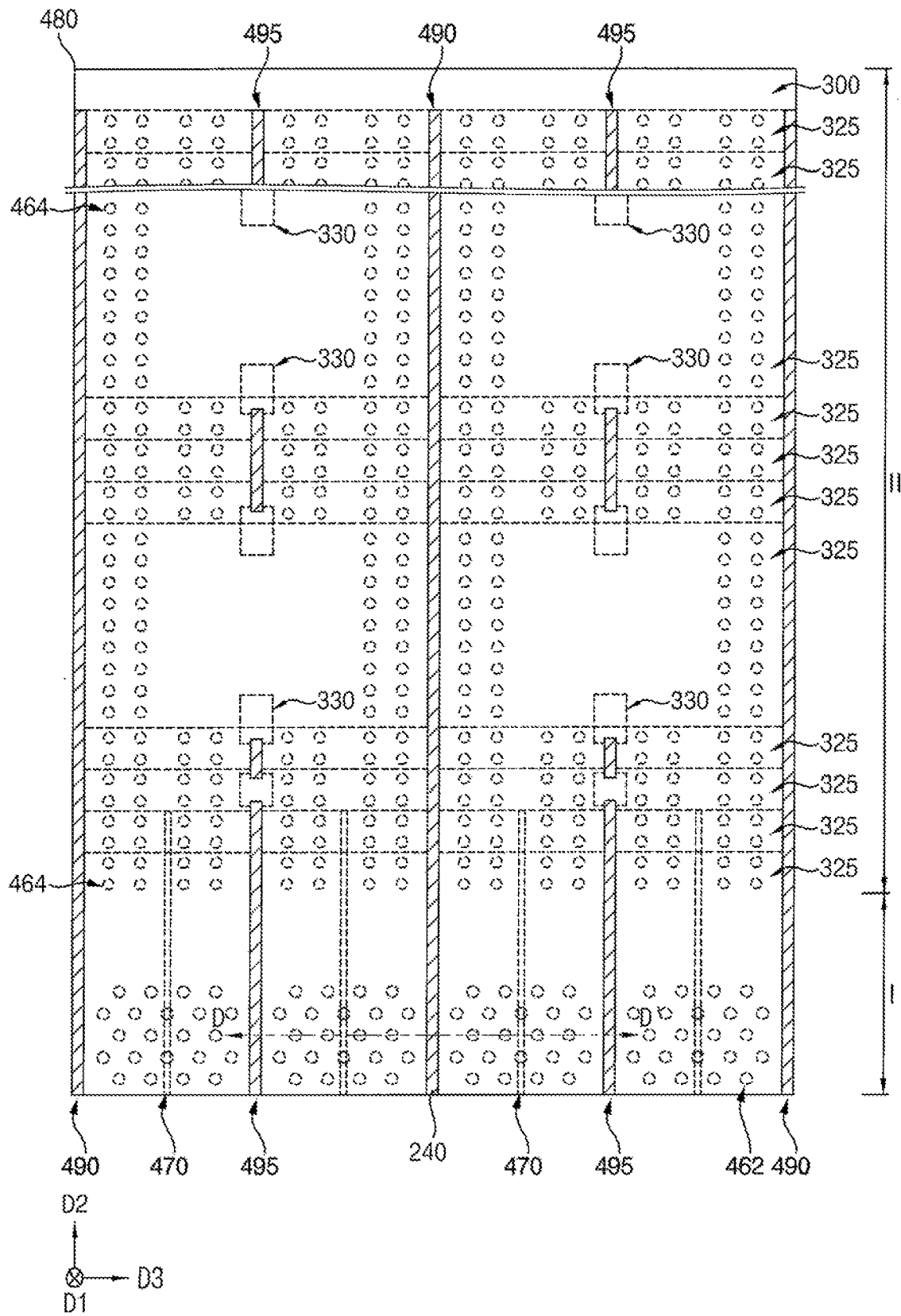
Figure 23:
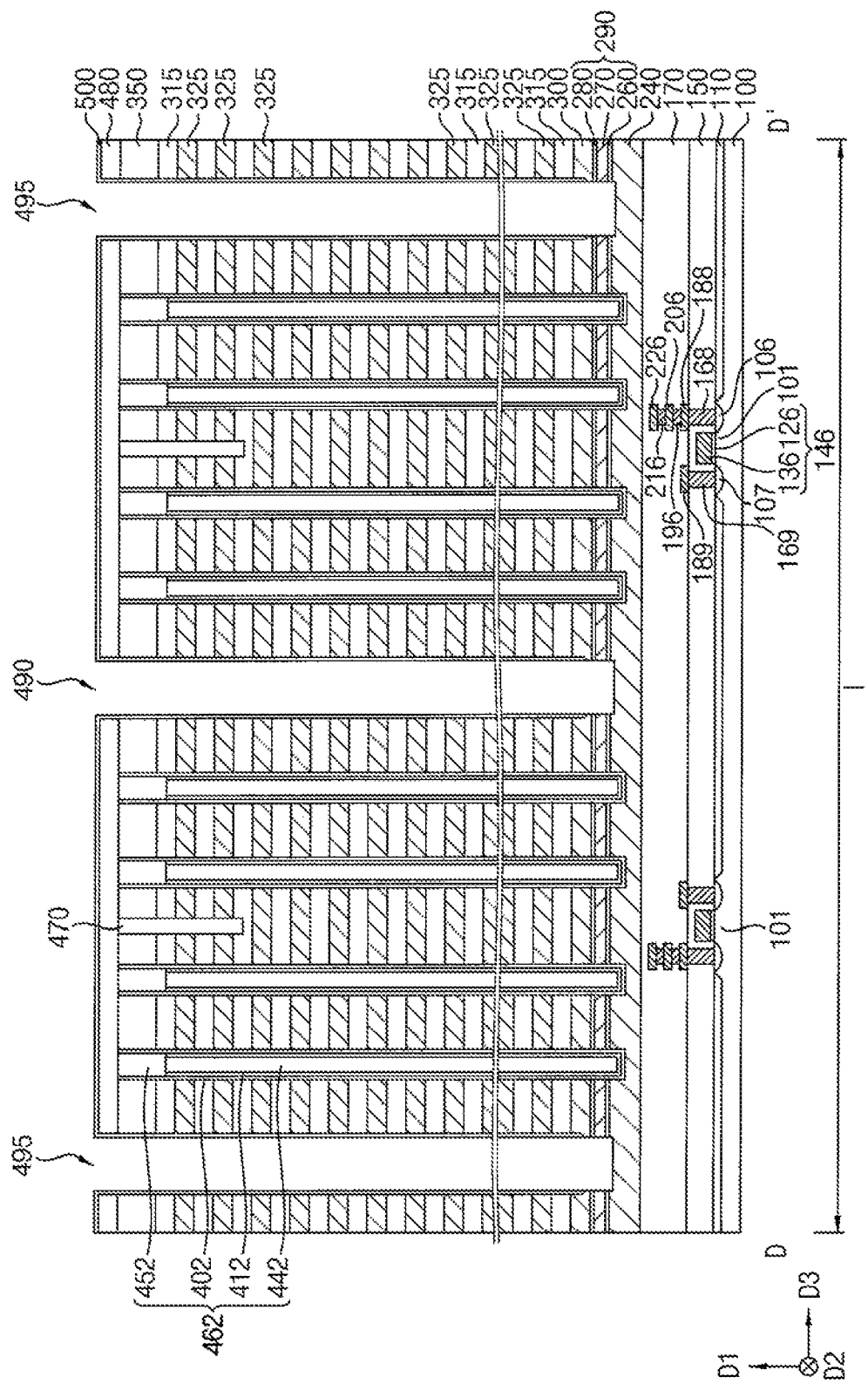

Referring to FIGS. 22 and 23, a fifth insulating interlayer 480 including an oxide, e.g., silicon oxide, may be formed on the fourth insulating interlayer 350, the memory channel structure 462, the support structure 464, and the second division pattern 470, and third and fourth openings 490 and 495 may be formed through the third to fifth insulating interlayers 340, 350 and 480 and the mold by an etching process.

In an implementation, the third opening 490 may extend in the second direction D2 on the first and second regions I and II of the substrate 100, and may extend to opposite ends in the second direction D2 of the mold having a staircase shape (e.g., may extend completely across the device in the second direction D2). In an implementation, a plurality of third openings 490 may be spaced apart from each other in the third direction D3. In an implementation, the mold may be divided into a plurality of parts in the third direction D3 by the third openings 490. As the third opening 490 is formed, the insulation layers 310 and the fourth sacrificial layers 320 of the mold may be divided into first insulation patterns 315 and fourth sacrificial patterns 325, respectively.

In an implementation, the fourth opening 495 may continuously extend in the second direction D2 on the first region I of the substrate 100, and a plurality of fourth openings 495 may be spaced apart from each other in the second direction D2 on the second region II of the substrate 100. The fourth openings 495 arranged in the second direction D2 may be formed between neighboring ones of the third openings 490 in the third direction D3. In an implementation, the fourth openings 495 may be spaced apart from each other in the second direction D2, which may be different from the third opening 490 continuously extending in the second direction D2 to opposite ends in the second direction D2 of the mold, and thus the mold may not be entirely divided in the third direction D3 by the fourth opening 495. In an implementation, a portion of the mold between neighboring ones of the fourth openings 495 in the second direction D2 may at least partially overlap the first division pattern 330 in the first direction D1.

Each of the fourth openings 495 may continuously extend in the second direction D2 on the first region I of the substrate 100, and may continuously extend to end portions in the second direction D2 of the step layers of the mold at upper two levels even on the second region II of the substrate 100. Thus, the fourth sacrificial patterns 325 at the upper two levels of the mold may be divided by the fourth opening 495 and the second division patterns 470 at opposite sides in the third direction D3 of the fourth opening 495.

In an implementation, the mold may be divided into a plurality of parts spaced apart from each other in the third direction D3 each of which may extend in the second direction D2 by the etching process for forming the third and fourth openings 490 and 495, and the mold may not lean or fall down due to the support structures 464 and the memory channel structures 462 extending through the mold.

In an implementation, the etching process may be performed until the third and fourth openings 490 and 495 expose an upper surface of the first support layer 300, and further extend through an upper portion of the first support layer 300.

In an implementation, the third and fourth openings 490 and 495 may be formed by a reactive ion etching (RIE) process. If the channel layer 410 were to remain in the dummy channel hole 365, the third and fourth openings 490 and 495 could be bent toward the dummy channel holes 365 due to ions stacked in polysilicon of the channel layer 410.

In an implementation, the channel layer 410 in the dummy channel hole 365 may be almost entirely removed by the processes illustrated with reference to FIG. 16, and the third and fourth openings 490 and 495 may be formed in a straight line along the second direction D2 without the influence of the channel layer 410 including polysilicon.

A first spacer layer may be formed on sidewalls of the third and fourth openings 490 and 495 and an upper surface of the fifth insulating interlayer 480, and may be anisotropically etched so that portions of the first spacer layer on bottoms of the third and fourth openings 490 and 495 may be removed to form a first spacer 500. Thus, an upper surface of the first support layer 300 may be partially exposed.

The exposed first support layer 300 and a portion of the first sacrificial layer structure 290 thereunder may be removed to enlarge the third and fourth openings 490 and 495 downwardly. Accordingly, each of the third and fourth openings 490 and 495 may expose an upper surface of the CSP 240, and may further extend through an upper portion of the CSP 240.

In an implementation, the first spacer 500 may include, e.g., undoped polysilicon. When the first sacrificial layer structure 290 is partially removed, the sidewalls of the third and fourth openings 490 and 495 may be covered by the first spacer 500, and the first insulation patterns 315 and the fourth sacrificial patterns 325 included in the mold may not be removed.

Figure 24:
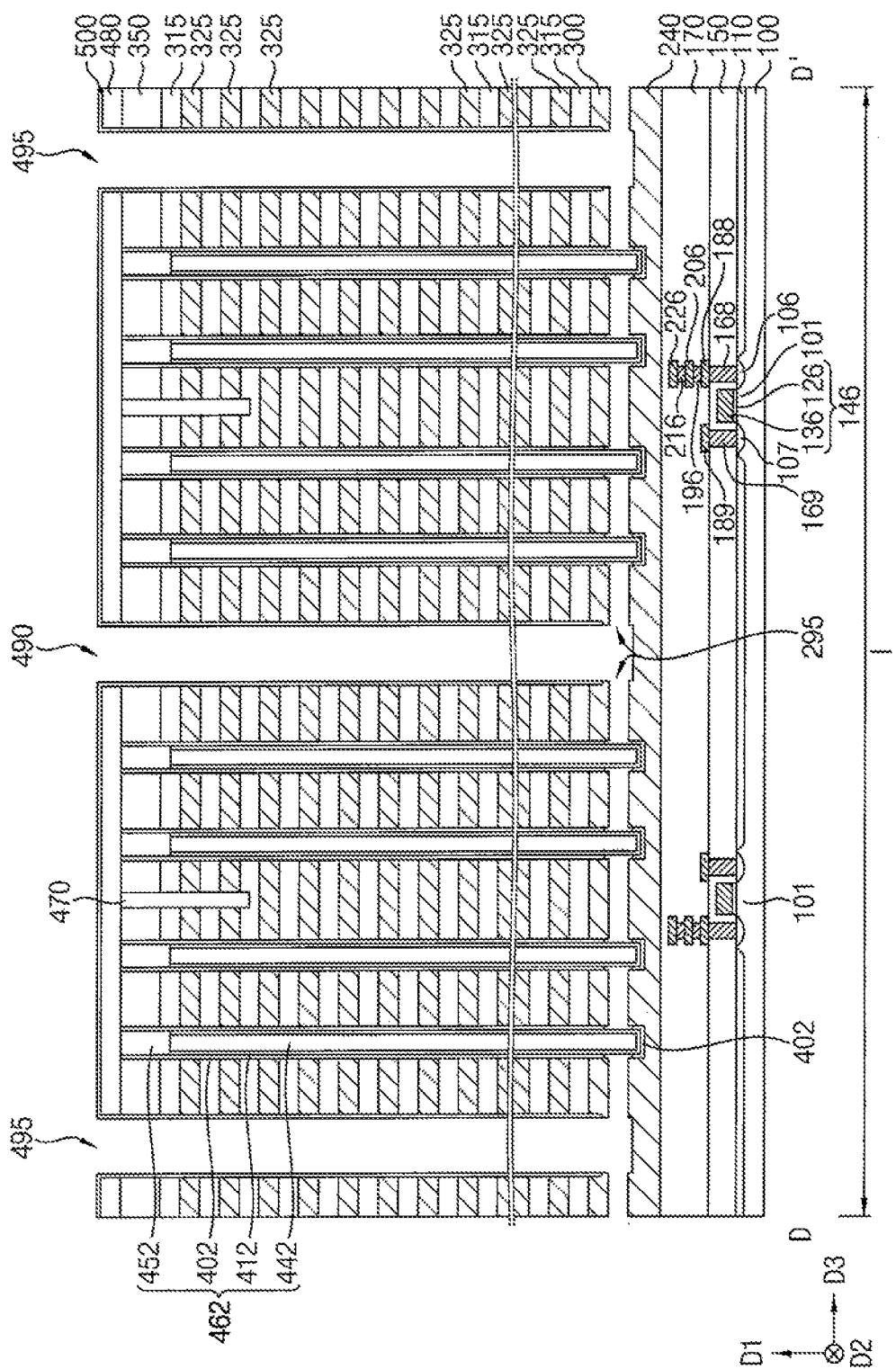

Referring to FIG. 24, the first sacrificial layer structure 290 exposed by the third and fourth openings 490 and 495 may be removed by, e.g., a wet etching process to form a first gap 295.

The wet etching process may be performed using, e.g., hydrofluoric acid or phosphoric acid. In an implementation, the third and fourth openings 490 and 495 may extend through the support pattern 305 instead of extending through the first support layer 300 and the first sacrificial layer structure 290 on the second region II of the substrate 100, and the first sacrificial layer structure 290 may not be removed on the second region II of the substrate 100 by the wet etching process.

As the first gap 295 is formed, a lower portion of the first support layer 300 and an upper surface of the CSP 240 may be exposed. Additionally, a sidewall of the charge storage structure 402 may be partially exposed by the first gap 295, and the exposed sidewall of the charge storage structure 402 may also be removed to expose an outer sidewall of the channel 412. Accordingly, the charge storage structure 402 may be divided into an upper portion extending through the mold to cover most portion of the outer sidewall of the channel 412 and a lower portion covering a lower surface of the channel 412 on the CSP 240.

Figure 25:
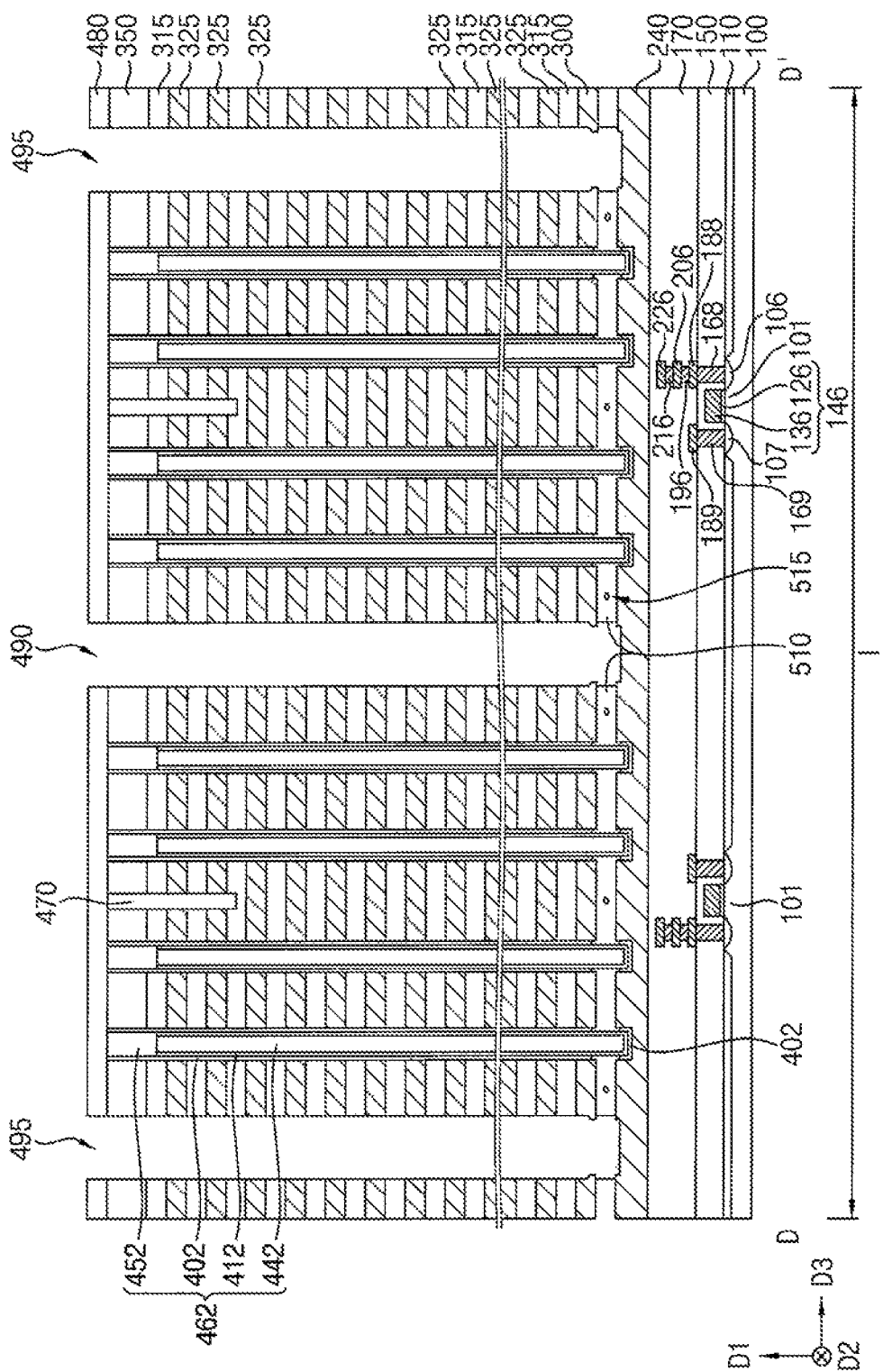

Referring to FIG. 25, after removing the first spacer 500, a channel connection layer may be formed on the sidewalls of the third and fourth openings 490 and 495 and in the first gap 295, and a portion of the channel connection layer in the third and fourth openings 490 and 495 may be removed to form a channel connection pattern 510 in the first gap 295.

As the channel connection pattern 510 is formed, the channels 412 between neighboring ones of the third and fourth openings 490 and 495 in the third direction D3 may be connected with each other.

The channel connection pattern 510 may include, e.g., polysilicon doped with n-type impurities or undoped polysilicon.

An air gap 515 may be formed in the channel connection pattern 510.

Figure 26:
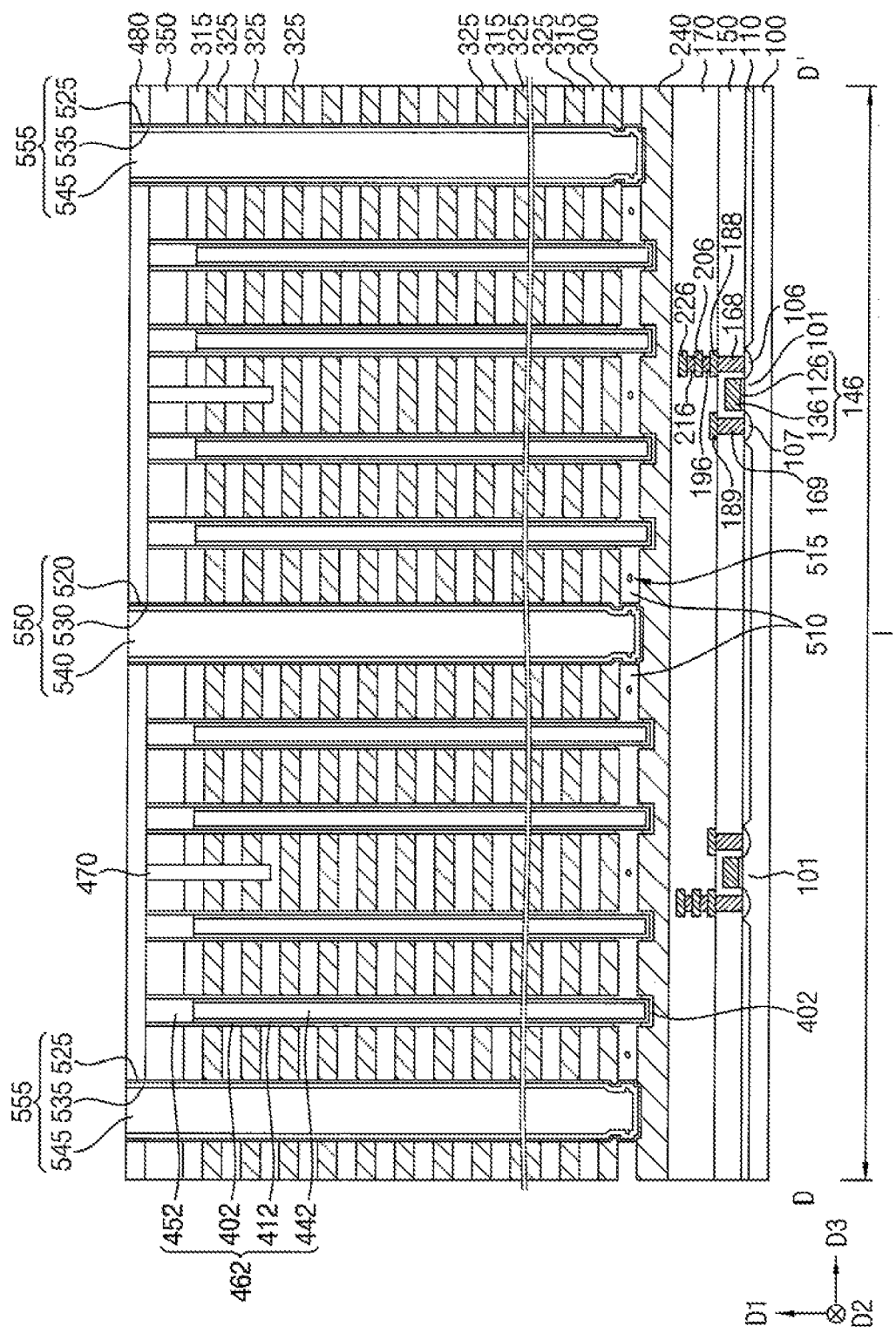

Referring to FIG. 26, second and third sacrificial layer structures 550 and 555 may be formed in the third and fourth openings 490 and 495, respectively.

The second and third sacrificial layer structures 550 and 555 may be formed by sequentially forming an etch stop layer and a second spacer layer on the sidewalls of the third and fourth openings 490 and 495 and the exposed upper surface of the CSP 240, forming a fifth sacrificial layer on the second spacer layer to fill the third and fourth openings 490 and 495, and planarizing the fifth sacrificial layer, the second spacer layer and the etch stop layer until the upper surface of the fifth insulating interlayer 480 is exposed.

The second sacrificial layer structure 550 may include a first etch stop pattern 520, a second spacer 530 and a fifth sacrificial pattern 540 sequentially stacked, the third sacrificial layer structure 555 may include a second etch stop pattern 525, a third spacer 535 and a sixth sacrificial pattern 545 sequentially stacked.

The etch stop layer may include a material having an etching selectivity with respect to the fourth sacrificial pattern 325, e.g., an oxide such as silicon oxide. The second spacer layer may include, e.g., a nitride such as silicon nitride, and the fifth sacrificial layer may include, e.g., polysilicon or silicon oxide.

Figure 27:
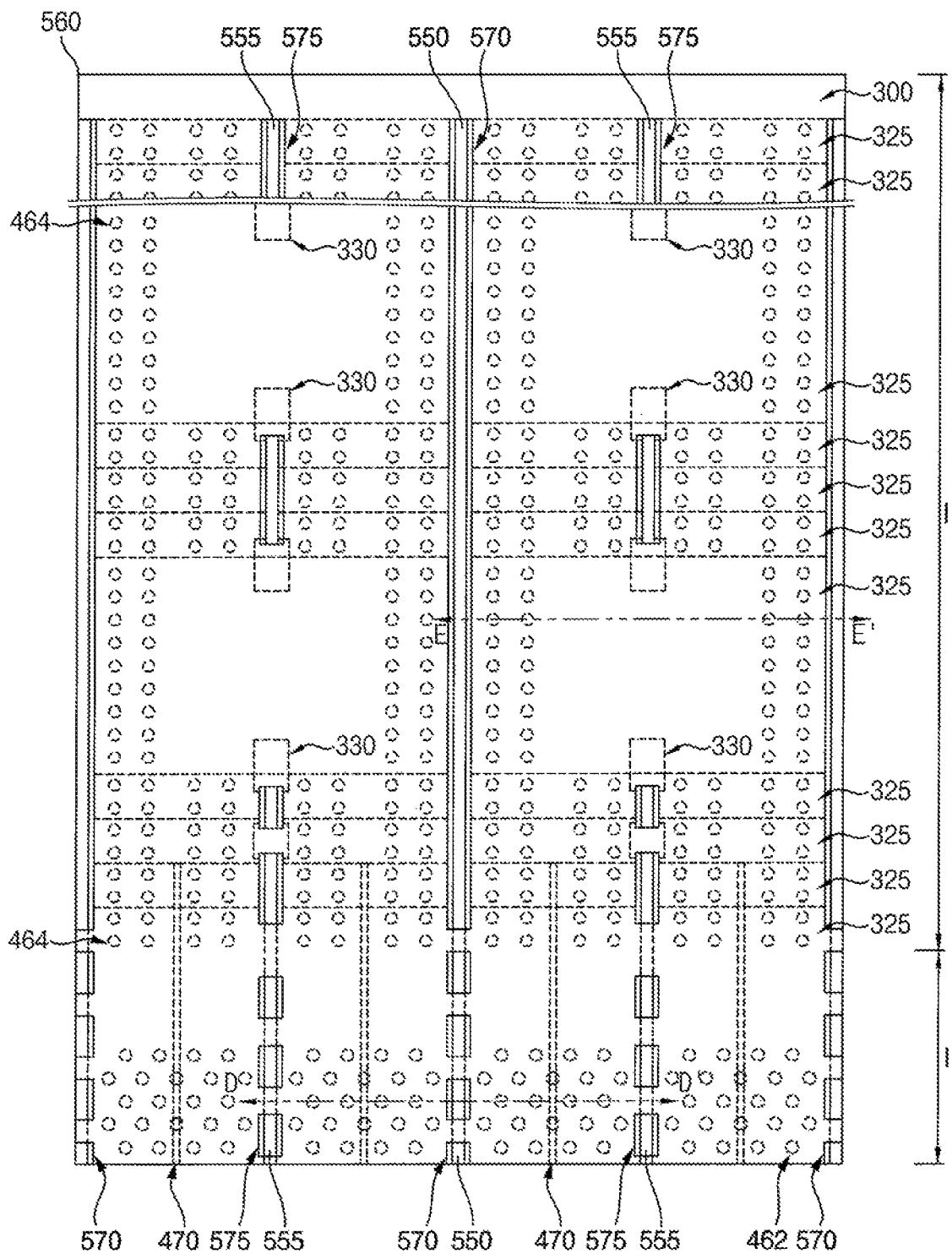
Figure 28:
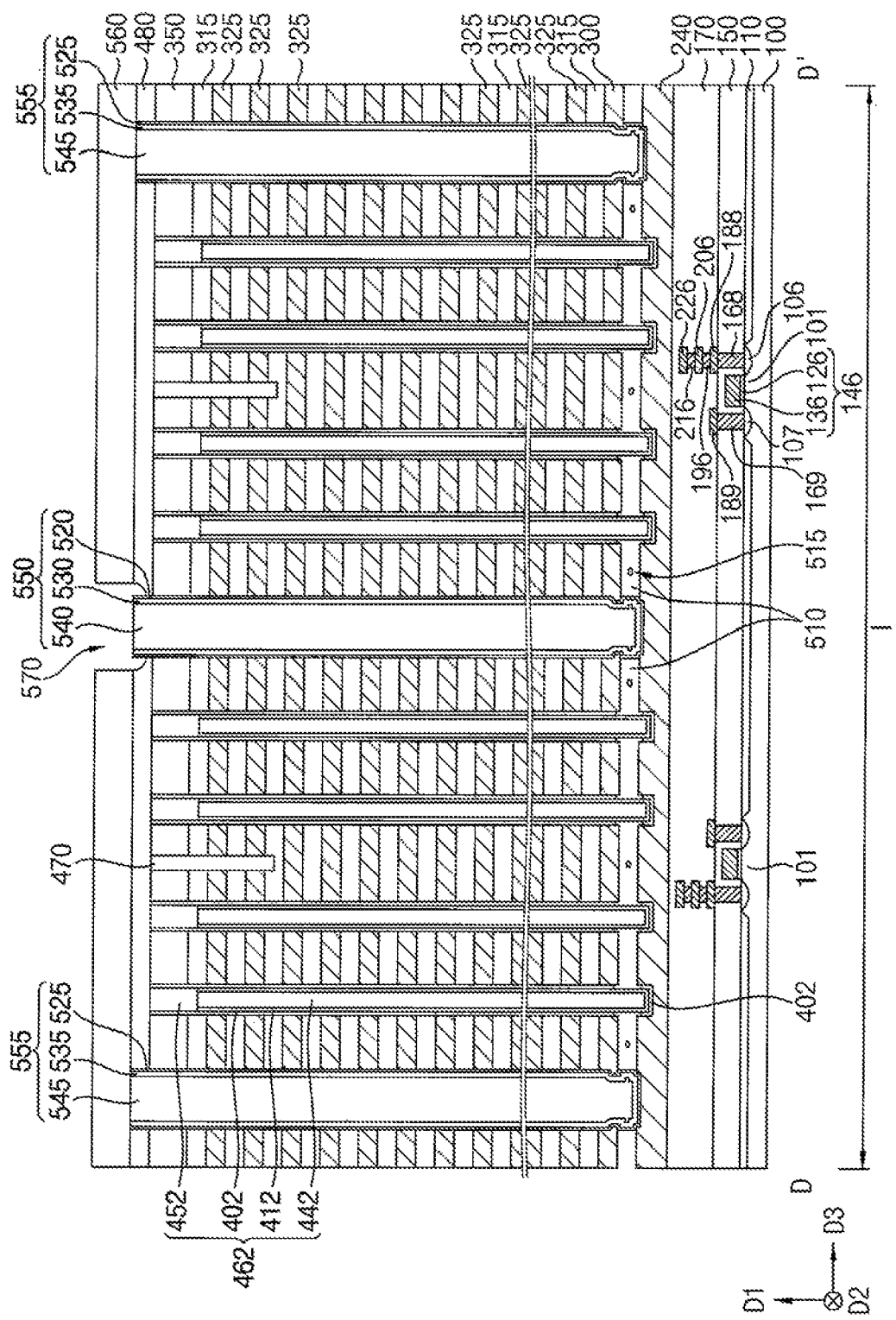

Referring to FIGS. 27 and 28, a second support layer 560 may be formed on the fifth insulating interlayer 480, and the second and third sacrificial layer structures 550 and 555, and may be partially etched to form fifth and sixth openings 570 and 575.

In an implementation, the fifth opening 570 may overlap the second sacrificial layer structure 550 in the first direction D1. In an implementation, as illustrated the drawings, the fifth opening 570 may continuously extend in the second direction D2 on the second region II of the substrate 100, and a plurality of fifth openings 570 may be spaced apart from each other in the second direction D2 on the first region I of the substrate 100. In an implementation, a plurality of fifth openings 570 may be spaced apart from each other in the second direction D2 even on the second region II of the substrate 100. In an implementation, the fifth opening 570 may have a width in the third direction D3 greater than that of the second sacrificial layer structure 550.

In an implementation, the sixth opening 575 may overlap the third sacrificial layer structure 555 in the first direction D1. Thus, a plurality of sixth openings 575 may be spaced apart from each other in the second direction D2 on the second region II of the substrate 100. Additionally, a plurality of sixth openings 575 may be spaced apart from each other in the second direction D2 on the same third sacrificial layer structure 555 even on the first region I of the substrate 100. In an implementation, the sixth opening 575 may have a width in the third direction D3 greater than that of the third sacrificial layer structure 555.

In an implementation, the fifth and sixth openings 570 and 575 may be arranged in a zigzag pattern in the second direction D2 on the first region I of the substrate 100. The fifth and sixth openings 570 and 575 may partially overlap each other in the third direction D3.

The second support layer 560 may include an oxide, e.g., silicon oxide.

Figure 29:
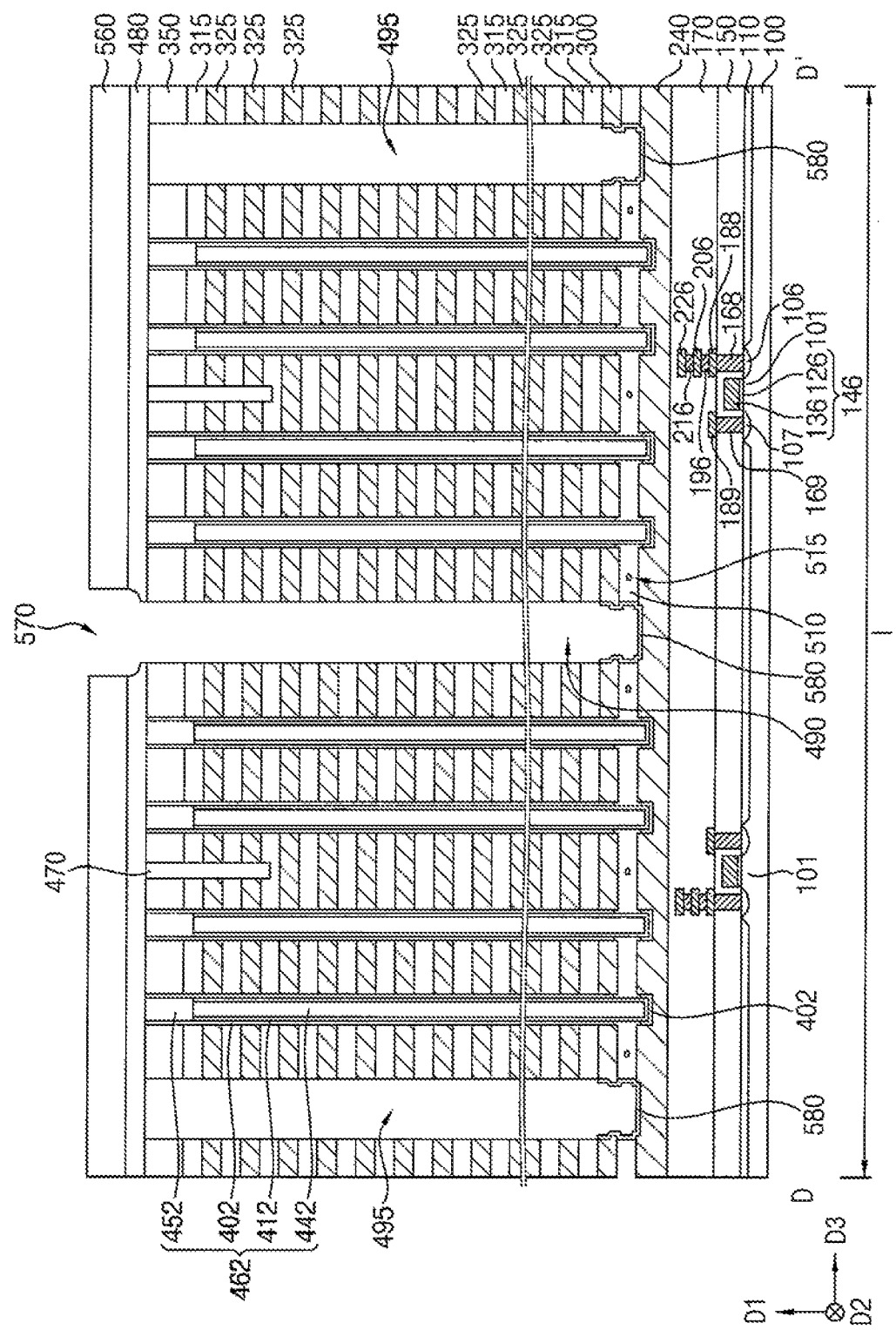

Referring to FIG. 29, the second and third sacrificial layer structures 550 and 555 may be removed by an etching process through the fifth and sixth openings 570 and 575, and thus the third and fourth openings 490 and 495 may be formed again.

As described above, the fifth and sixth openings 570 and 575 may not entirely expose but partially cover upper surfaces of the second and third sacrificial layer structures 550 and 555, respectively, on the first region I of the substrate 100, an thus, even though the third and fourth openings 490 and 495 are formed again by the etching process, the upper surfaces of the second and third sacrificial layer structures 550 and 555 may be at least partially covered by the second support layer 560. Accordingly, even though an upper surface of the mold is high and an extension length in the second direction D2 is large, the mold may not lean or fall down in the third direction D3, due to the second support layer 560 at least partially covering portions of the mold where the third and fourth openings 490 and 495 are formed.

A plurality of fourth openings 495 may be spaced apart from each other in the second direction D2 on the second region II of the substrate 100 so that a portion of the mold remain between the fourth openings 495, the support structures 464 may extend through the mold, and thus the mold may not lean or fall down in the third direction D3 due to the portion of the mold and the support structures 464.

In an implementation, the second and third sacrificial layer structures 550 and 555 may be removed by a wet etching process.

An oxidation process may be performed on a layer structure including silicon and exposed by the third and fourth openings 490 and 495 to form a protection layer 580. In an implementation, as the oxidation process is performed, the protection layer 580 may be formed on the upper surface of the CSP 240 exposed by the third and fourth openings 490 and 495, a sidewall of the channel connection pattern 510, and a sidewall of the first support layer 300. The protection layer 580 may include, e.g., silicon oxide.

Figure 30:
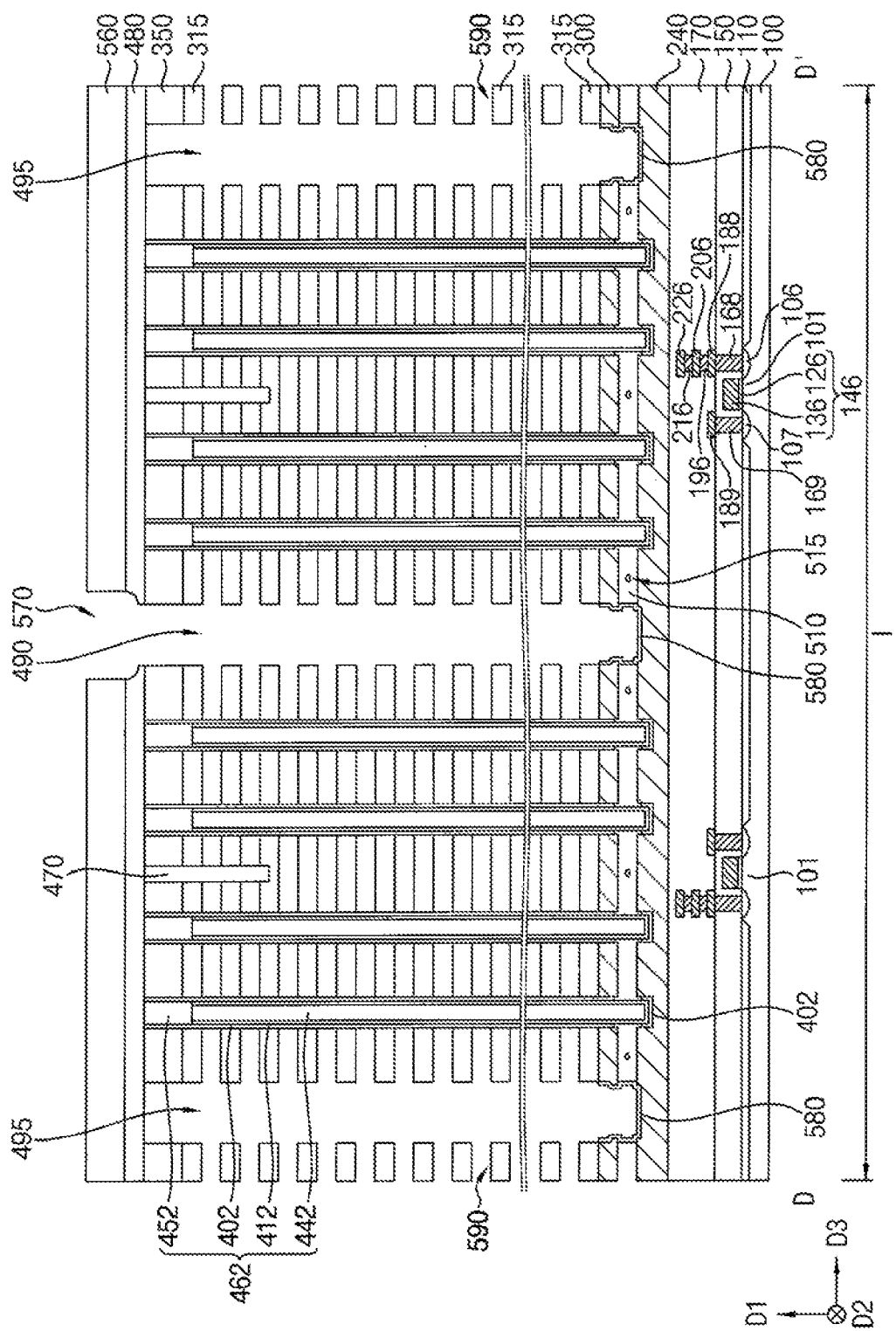
Figure 31:
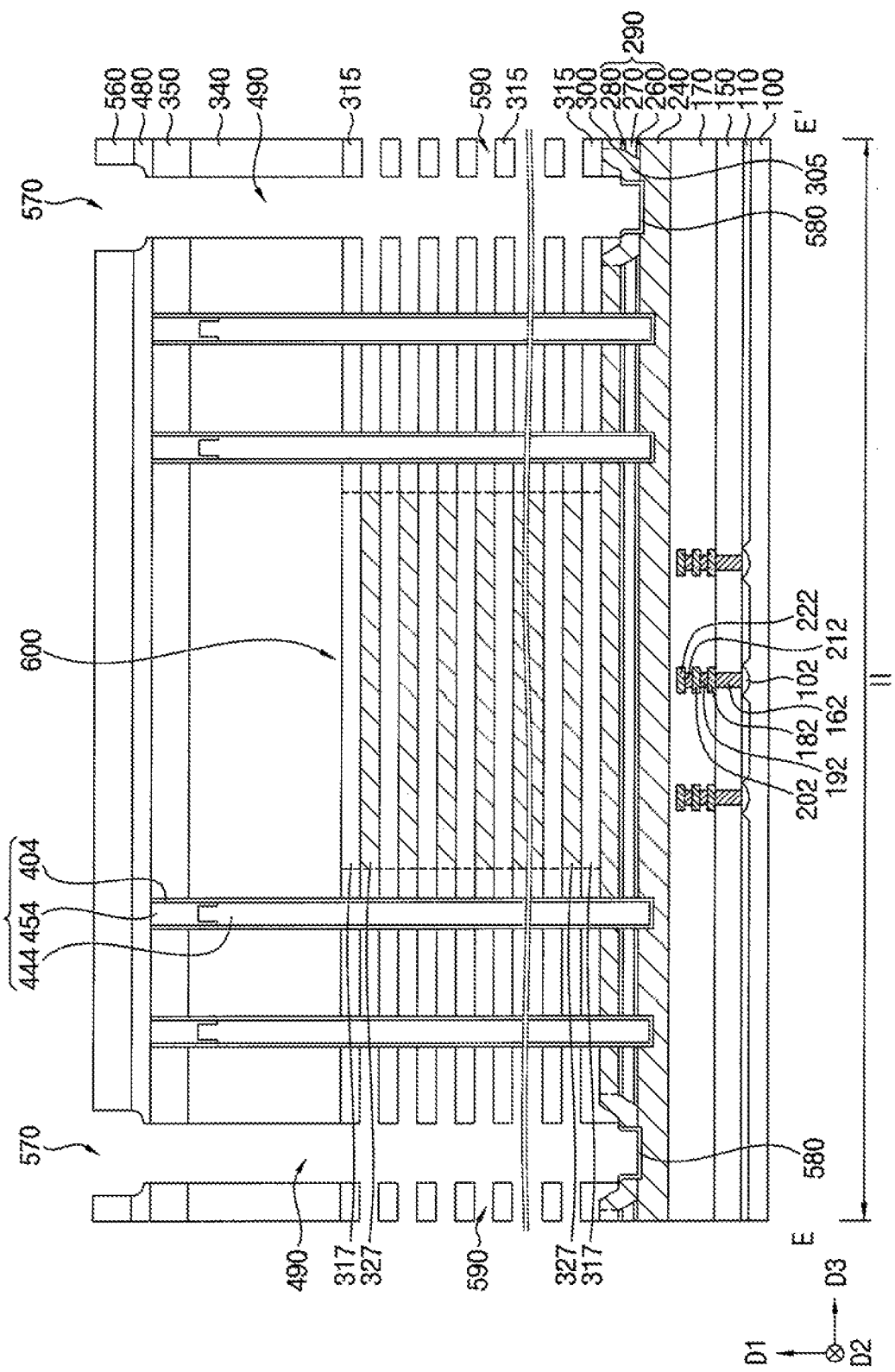

Referring to FIGS. 30 and 31, the fourth sacrificial patterns 325 exposed by the third and fourth openings 490 and 495 may be removed to form a second gap 590 between the first insulation patterns 315, and an outer sidewall of the charge storage structure 402 included in the memory channel structure 462 and an outer sidewall of the dummy charge storage structures 404 included in the support structure 464 may be partially exposed by the second gap 590.

In an implementation, the fourth sacrificial patterns 325 may be removed by a wet etching process using, e.g., phosphoric acid ($H_3PO_4$) or sulfuric acid ($H_2SO_4$).

The wet etching process may be performed through the third and fourth openings 490 and 495, and a portion of the fourth sacrificial pattern 325 between the third and fourth openings 490 and 495 may be entirely removed by an etching solution provided through the third and fourth openings 490 and 495 in two ways. In an implementation, the etching solution may be provided only in one way through the third opening 490 at an area where the fourth opening 495 is not formed between the third openings 490 on the second region II of the substrate 100, and thus the fourth sacrificial pattern 325 might not be entirely removed but partially remain, which may be referred to as a third insulation pattern 327. Additionally, a portion of the first insulation pattern 315 overlapping the third insulation patterns 327 in the first direction D1 may be referred to as a second insulation pattern 317. The second and third insulation patterns 317 and 327 alternately and repeatedly stacked in the first direction D1 may form an insulation pattern structure 600.

In an implementation, the insulation pattern structure 600 may extend through a portion of the mold on the second region II of the substrate 100, and may have a shape of a rectangle, ellipse, circle, or a rectangle with concave opposite sides in the second direction D2. In an implementation, the insulation pattern structure 600 may extend through the second step having a relatively large length in the second direction D2 in each mold.

Figure 32:
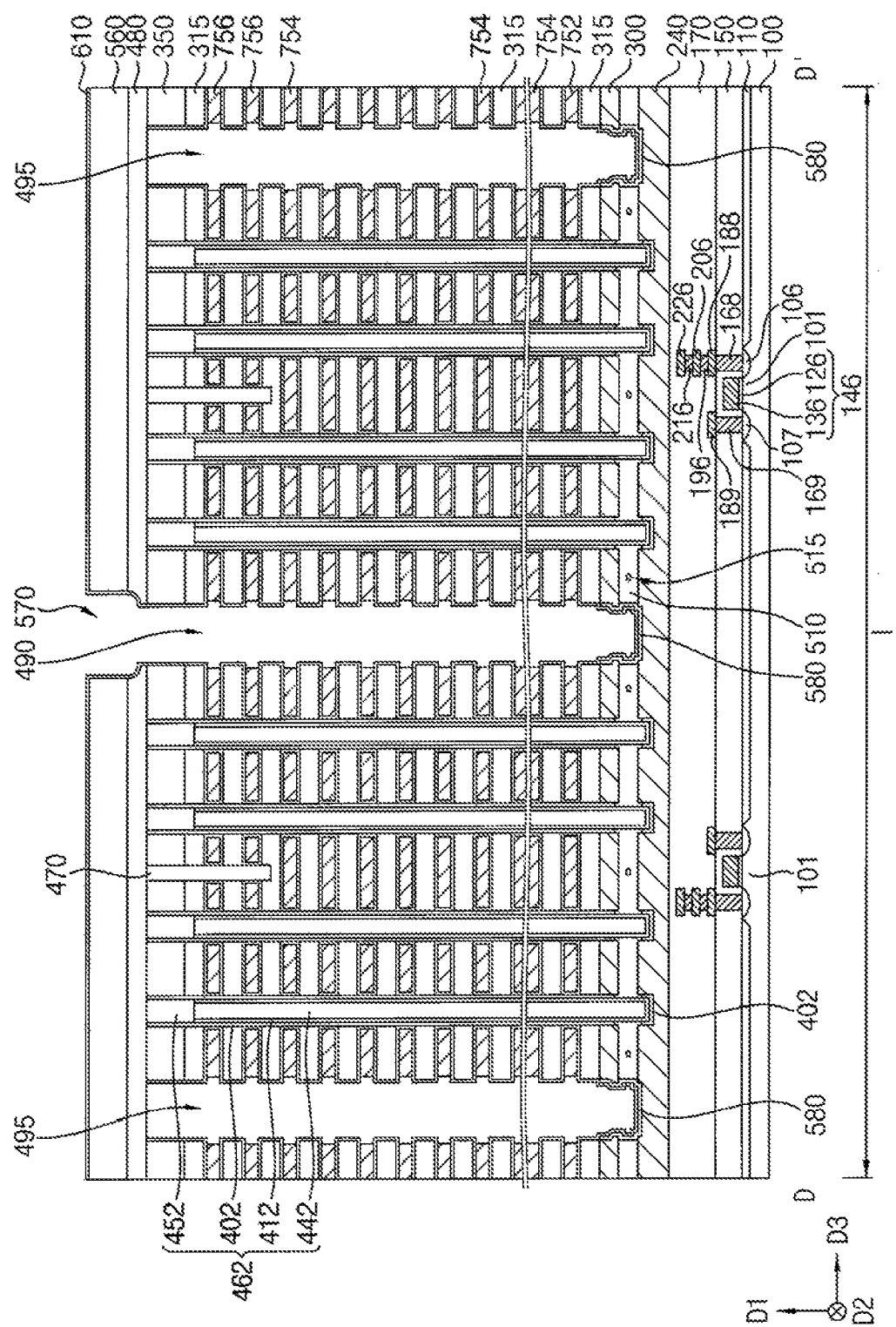
Figure 33:
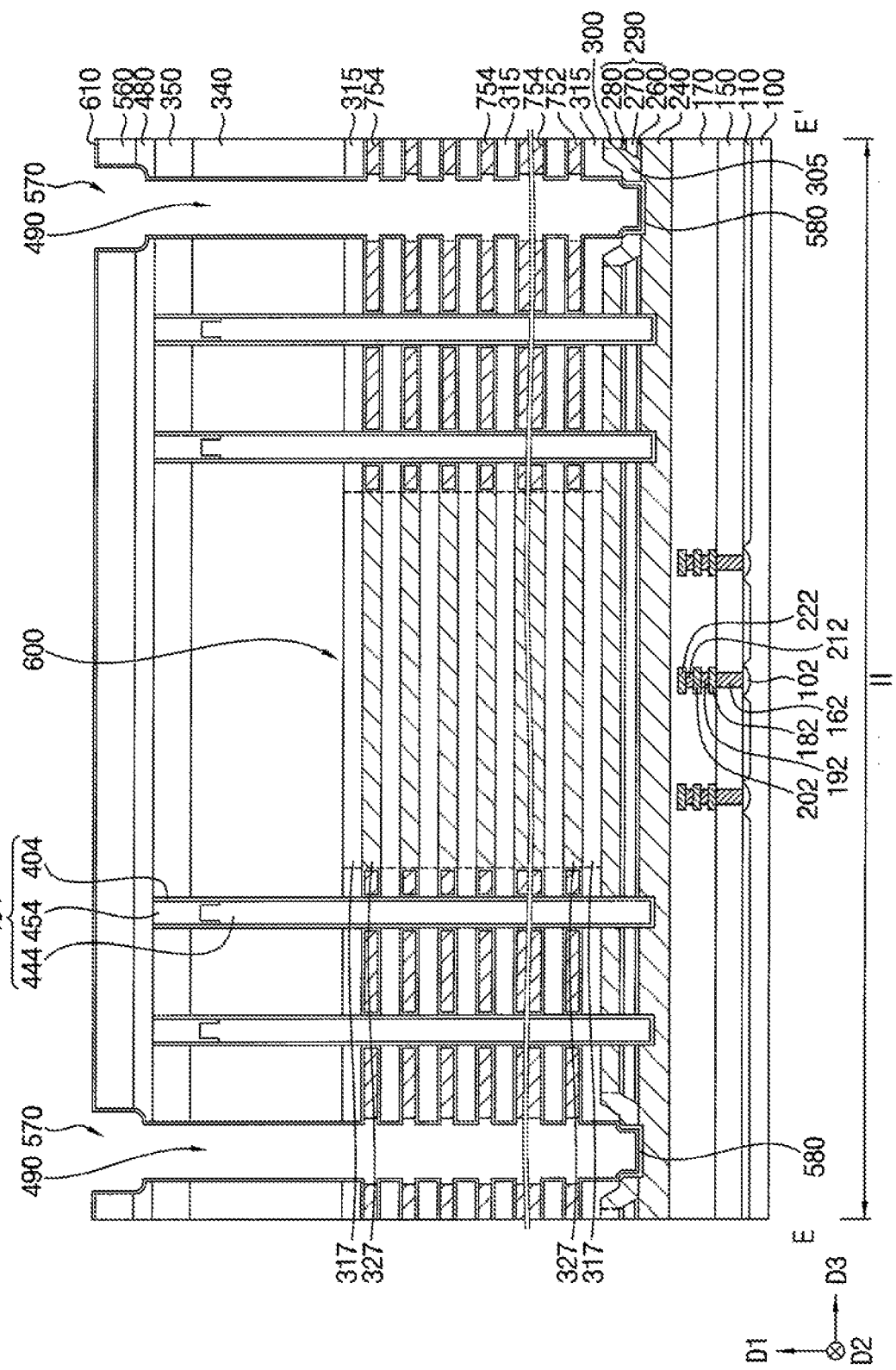

Referring to FIGS. 32 and 33, a second blocking layer 610 may be formed on the outer sidewall of the charge storage structure 402 and the outer sidewall of the dummy charge storage structure 404 exposed by the third and fourth openings 490 and 495, inner walls of the second gaps 590, surfaces of the first insulation patterns 315, an upper surface of the protection layer 580, a sidewall and an upper surface of the fifth insulating interlayer 480, and a sidewall and an upper surface of the second support layer 560, and a gate electrode layer may be formed on the second blocking layer 610.

The gate electrode layer may include a gate barrier layer and a gate conductive layer sequentially stacked. The gate electrode layer may include a low resistance metal, and the gate barrier layer may include a metal nitride. The second blocking layer 610 may include a metal oxide, e.g., aluminum oxide, hafnium oxide, zirconium oxide, or the like.

The gate electrode layer may be partially removed to form a gate electrode in each of the second gaps 590. In an implementation, the gate electrode layer may be partially removed by a wet etching process. As a result, the fourth sacrificial pattern 325 in the mold having the staircase shape including the fourth sacrificial pattern 325 and the first insulation pattern 315 sequentially stacked as a step layer may be replaced with the gate electrode and the second blocking layer 610 covering lower and upper surfaces of the gate electrode.

In an implementation, the gate electrode may extend in the second direction D2, and a plurality of gate electrodes may be spaced apart from each other in the first direction D1 to form a gate electrode structure. The gate electrodes may be stacked in a staircase shape in which extension lengths in the second direction D2 decrease in a stepwise manner from a lowermost level toward an uppermost level. An end portion in the second direction D2 of each of the gate electrodes that is not overlapped with upper gate electrodes in the first direction D1, e.g., the step of each of the step layers may be referred to as a pad. The gate electrode structure may include first pads having a relatively short length in the second direction D2 and second pads having a relatively large length in the second direction D2. In an implementation, a suitable number of the first and second pads may be included.

In an implementation, a plurality of gate electrode structures may be formed in the third direction D3. In an implementation, the gate electrode structures may be spaced apart from each other in the third direction D3 by the third openings 490. As described above, the fourth opening 495 may not extend in the second direction D2 to or between opposite ends in the second direction D2 of the gate electrode structure, but a plurality of fourth openings 495 may be spaced apart from each other in the second direction D2, and thus the gate electrode structure might not be divided by the fourth openings 495. In an implementation, one of the gate electrodes at a lowermost level may be divided in the third direction D3 by the fourth openings 495, the first division pattern 330 and the insulation pattern structure 600, and each one of the gate electrodes at upper two levels may be divided in the third direction D3 by the fourth opening 495 and the second division pattern 470.

In an implementation, the gate electrode structure may include first to third gate electrodes 752, 754 and 756 sequentially stacked in the first direction D1. In an implementation, the first gate electrode 752 may be formed at a lowermost level, and may serve as a ground selection line (GSL). The third gate electrode 756 may be formed at an uppermost level and a second level from above, and may serve as a string selection line (SSL). The second gate electrode 754 may be formed at a plurality of levels between the first and third gate electrodes 752 and 756, and may serve as word lines, respectively. In an implementation, the numbers of levels at which the first to third gate electrodes 752, 754 and 756 are formed may be varied.

In an implementation, a memory block that may be formed between neighboring ones of the third openings 490 in the third direction D3 and include the first to third gate electrodes 752, 754 and 756, the charge storage structures 402 and the channels 412 may include two GSLs, one word line and four SSLs at each level.

Figure 34:
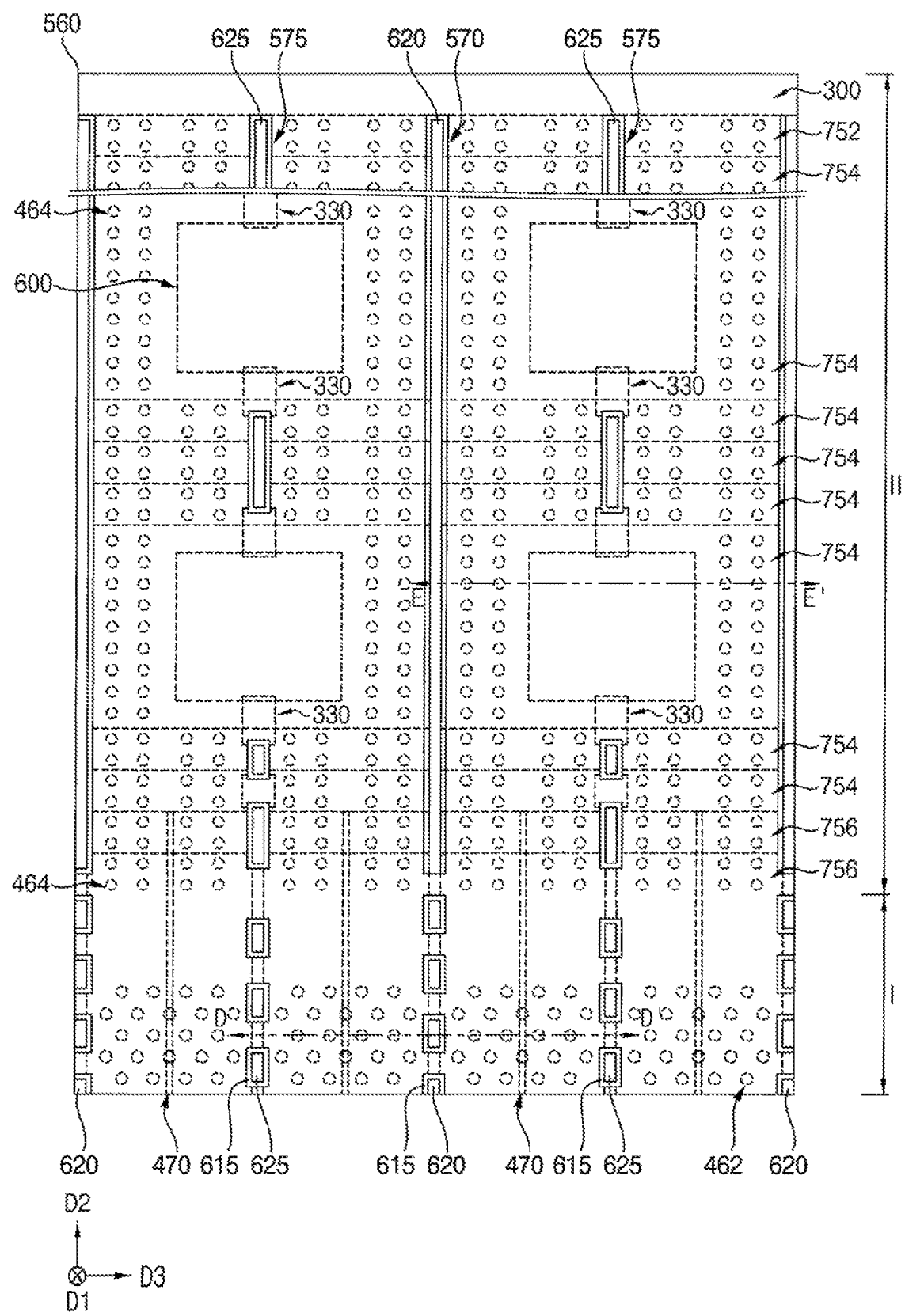
Figure 35:
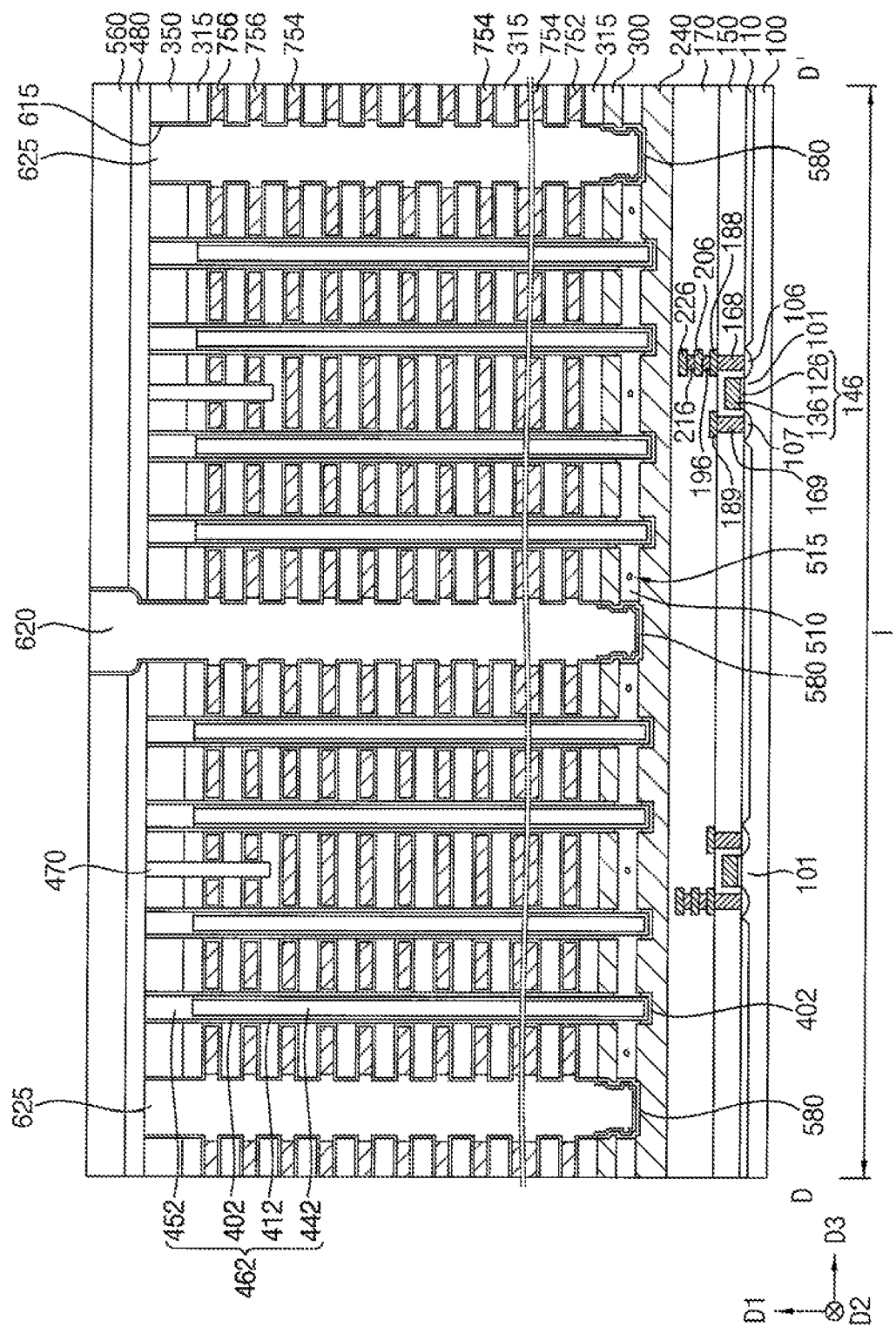
Figure 36:
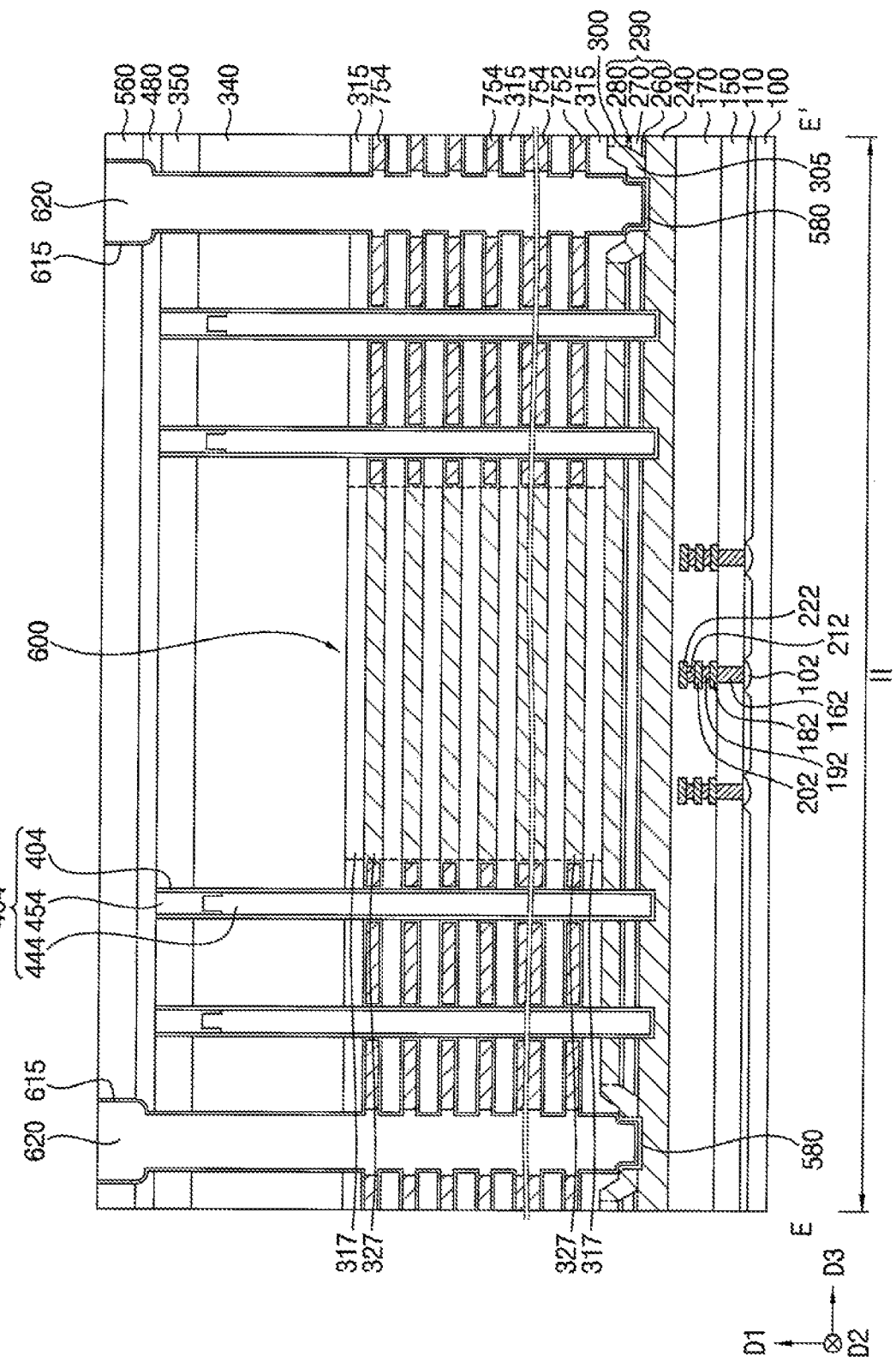

Referring to FIGS. 34 to 36, a third division pattern 620 filling the third and fifth openings 490 and 570 and a fourth division pattern 625 filling the fourth and sixth openings 495 and 575 may be formed on the second blocking layer 610, and may be planarized until an upper surface of the second support layer 560 is exposed. Thus, the second blocking layer 610 may be transformed into a second blocking pattern 615.

The third and fourth division patterns 620 and 625 may include an oxide, e.g., silicon oxide.

Figure 37:
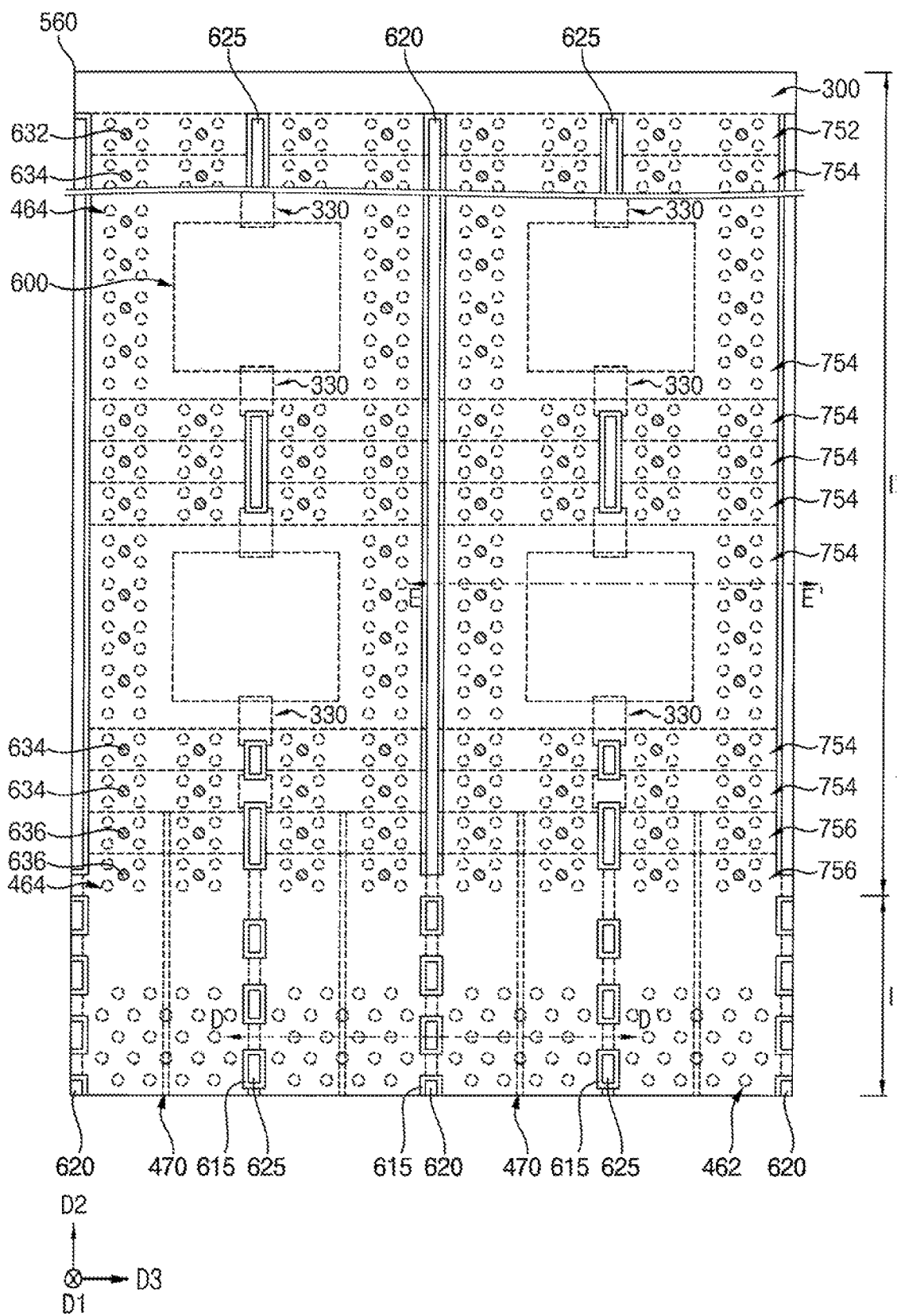
Figure 38:
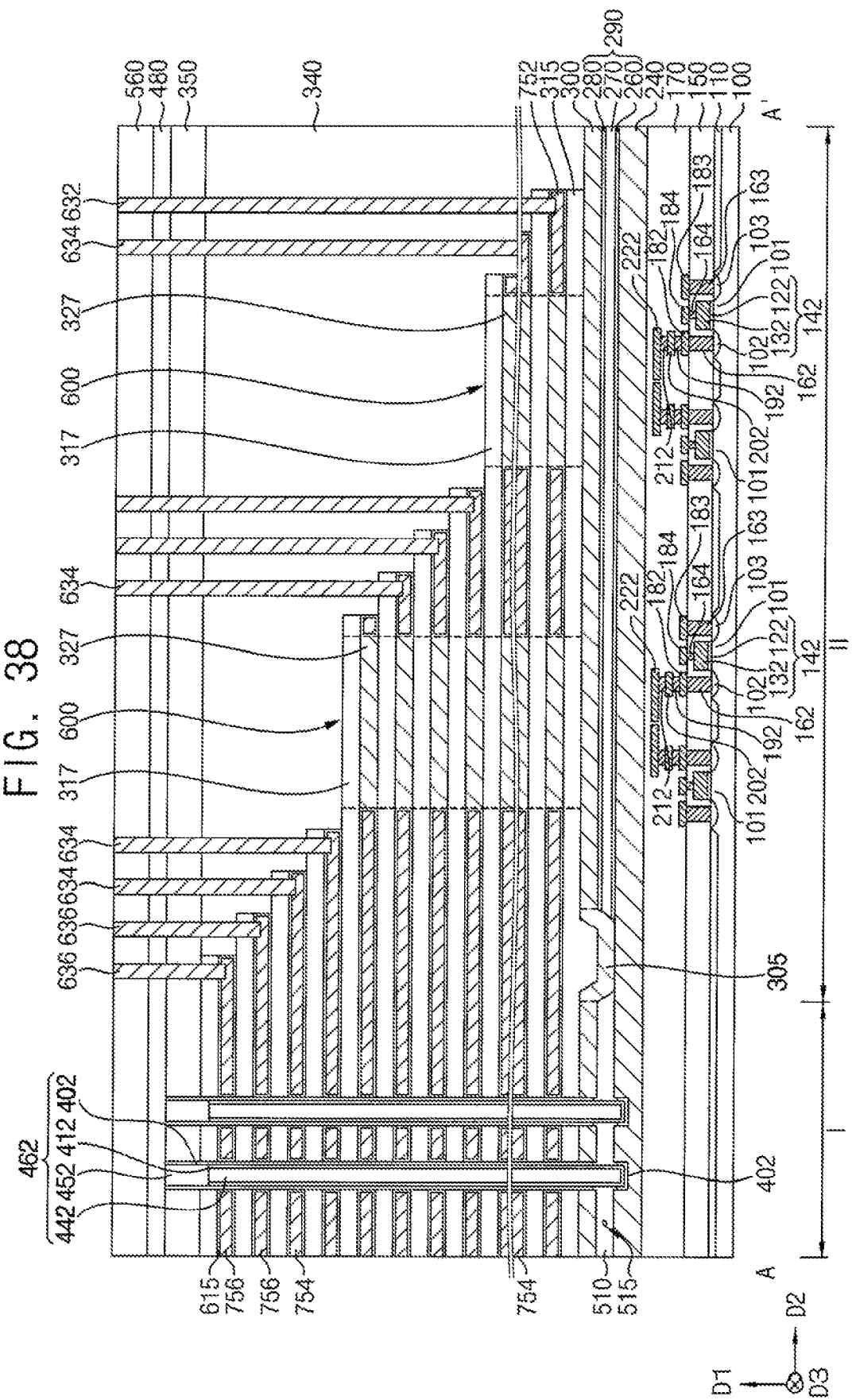

Referring to FIGS. 37 and 38, first to third upper contact plugs 632, 634 and 636 may be formed through the second support layer 560, the third to fifth insulating interlayers 340, 350 and 480, and the first insulation pattern 315 on the second region II of the substrate 100.

The first to third upper contact plugs 632, 634 and 636 may contact pads of the first to third gate electrodes 752, 754 and 756, respectively. In an implementation, each of the first to third upper contact plugs 632, 634 and 636 may be formed in an area surrounded by the support structure 464 in each of the first and second pads of the gate electrode structure. For example, the support structures 464 may be at vertices of a rectangle in a plan view, and each of the first to third upper contact plugs 632, 634 and 636 may be formed in an inside of the rectangle.

In an implementation, the first to third upper contact plugs 632, 634 and 636 may have a layout as illustrated in FIG. 37, or the numbers and layouts of the first to third upper contact plugs 632, 634 and 636 may be varied.

Figure 39:
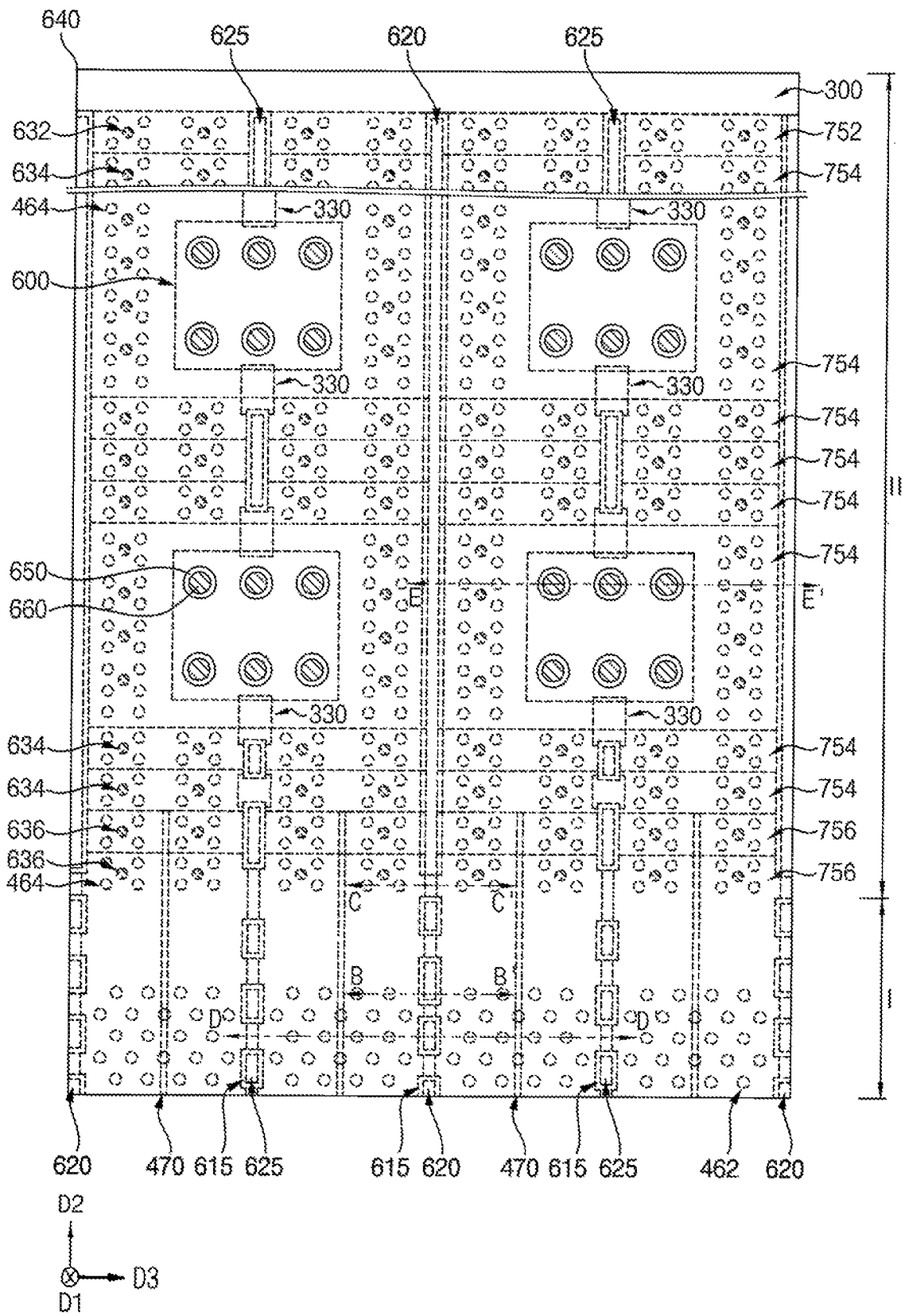
Figure 40:
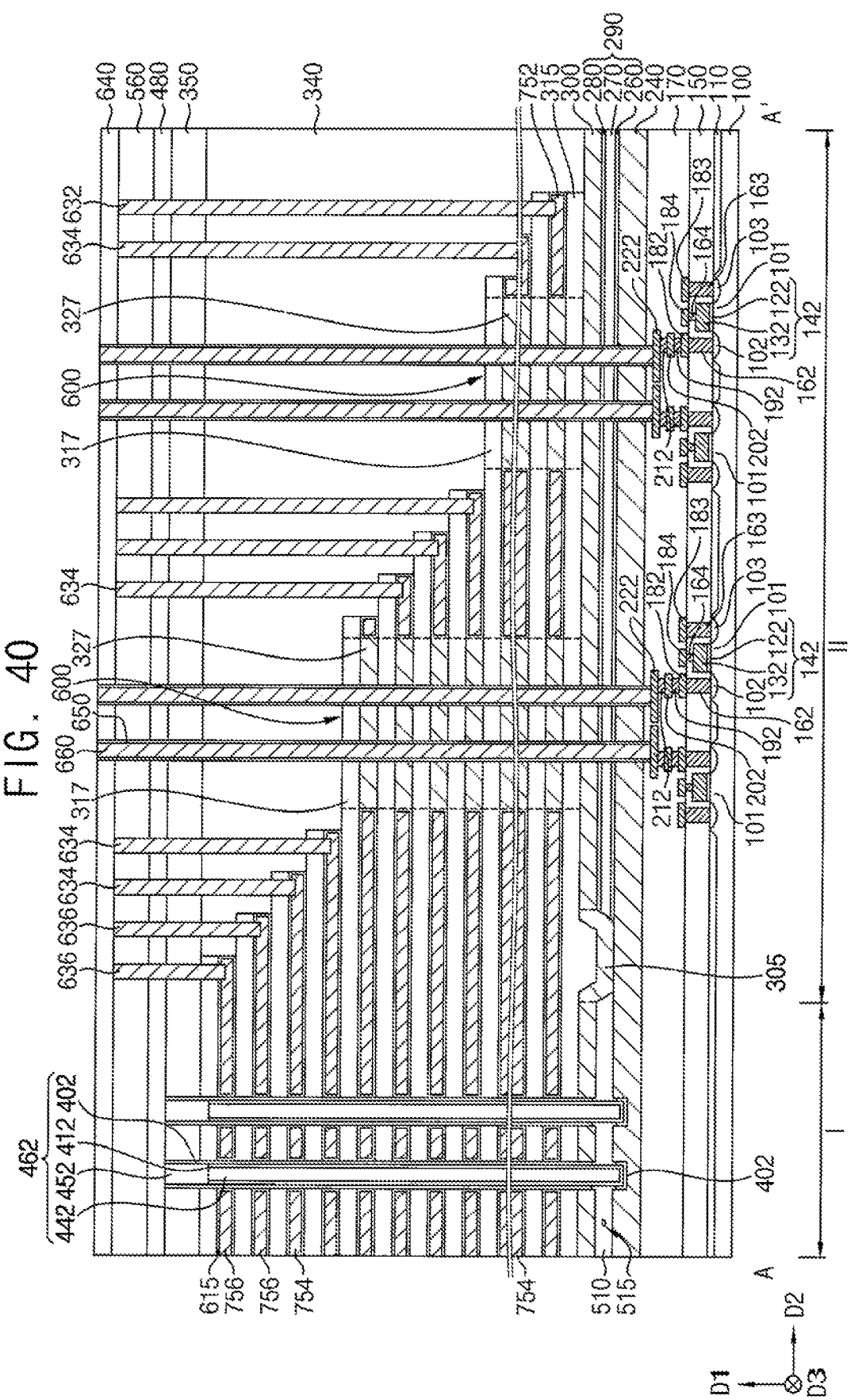
Figure 41:
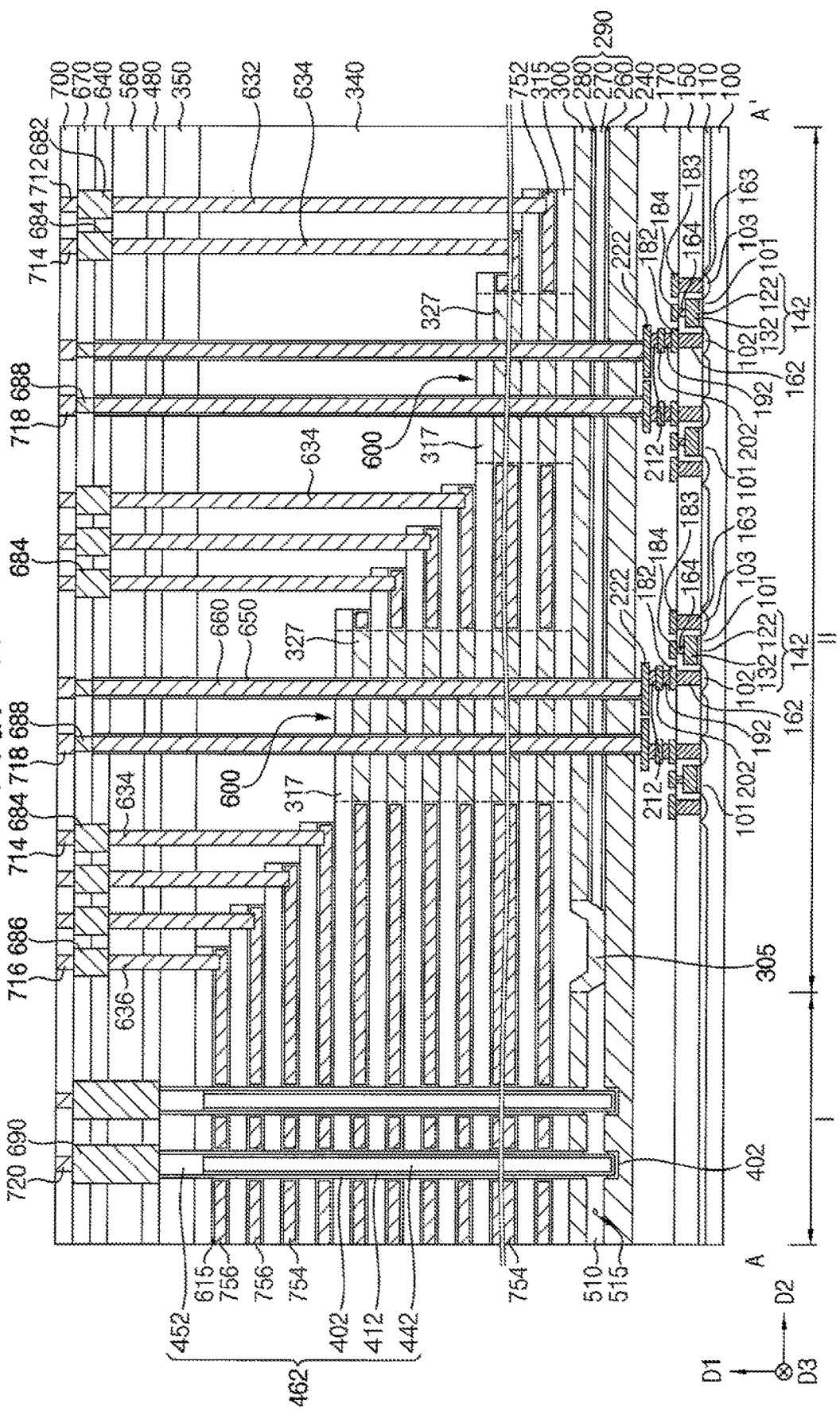
Figure 42:
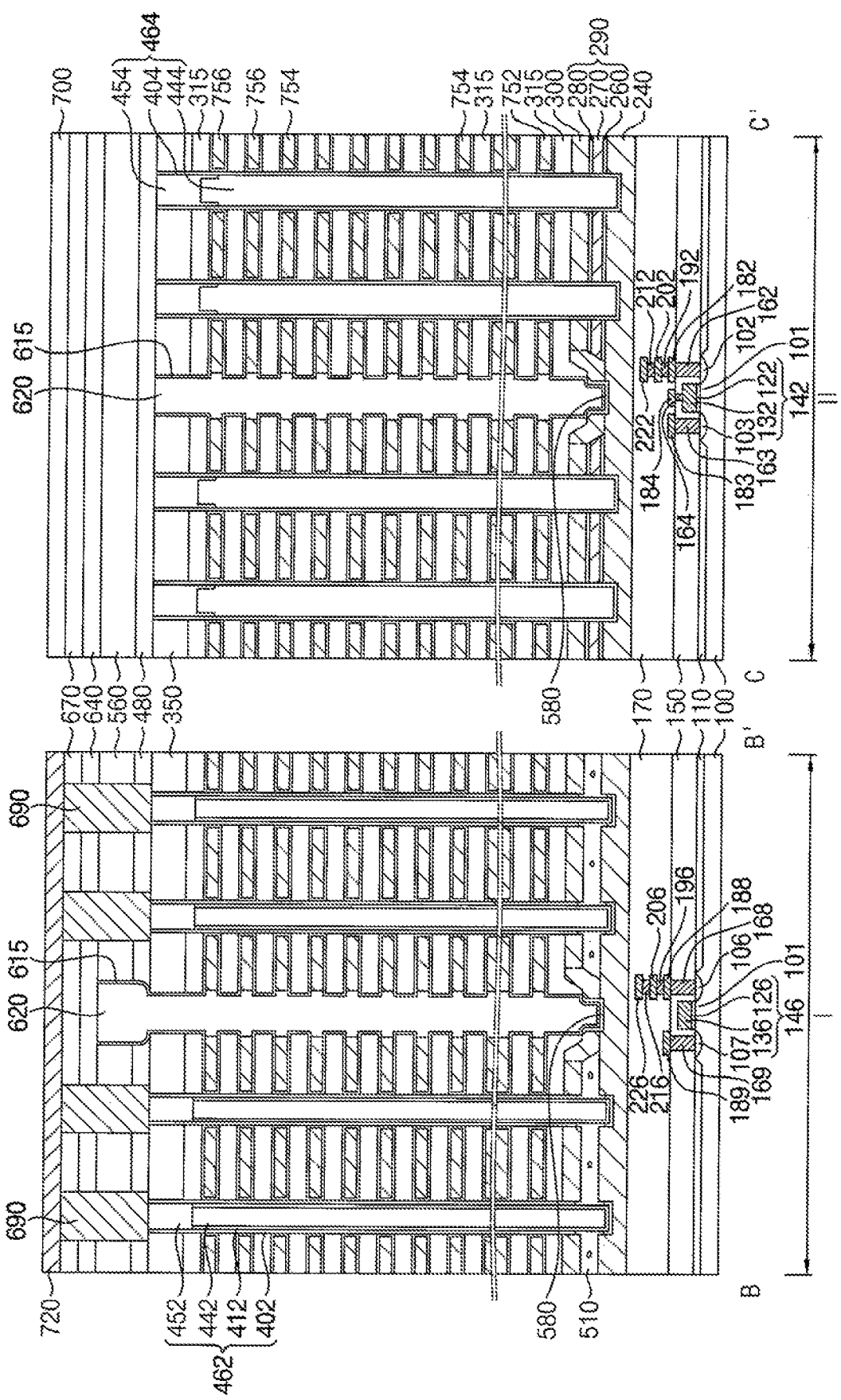

Referring to FIGS. 39 and 40, a sixth insulating interlayer 640 may be formed on the second support layer 560 and the first to third upper contact plugs 632, 634 and 636, and a through via 660 may be formed through the third to sixth insulating interlayers 340, 350, 480 and 640, the second support layer 560, the insulation pattern structure 600, the first support layer 300, the first sacrificial layer structure 290, the CSP 240 and an upper portion of the second insulating interlayer 170 on the second region II of the substrate 100 to contact an upper surface of the eighth lower wiring 222.

A plurality of through vias 660 may be formed to be spaced apart from each other in an area where the insulation pattern structure 600 is formed. In an implementation, as illustrated in the drawings, six through vias 660 may be formed in each area.

A fourth insulation pattern 650 may be formed on a sidewall of the through via 660, and may be electrically connected to the first support layer 300 and the CSP 240. In an implementation, the through via 660 may extend through the insulation pattern structure 600, e.g., the second and third insulation patterns 317 and 327 to be electrically insulated from the first to third gate electrodes 752, 754 and 756, and thus, if an additional insulation pattern is formed on sidewalls of the first support layer 300 and the CSP, the sixth insulation pattern 650 may not be formed.

The first to third upper contact plugs 632, 634 and 636 and the through via 660 may include, e.g., a metal, a metal nitride, a metal silicide, or the like, and the sixth insulation pattern 650 may include an oxide, e.g., silicon oxide.

A common source contact plug may be further formed through a portion of the first support layer 300 that is not covered by the gate electrode structure.

Referring to FIGS. 41 to 44, a seventh insulating interlayer 670 may be formed on the sixth insulating interlayer 640, the fourth insulation pattern 650 and the through via 660, and fourth to eighth upper contact plugs 682, 684, 686, 688 and 690 may be formed.

The fourth to sixth upper contact plugs 682, 684 and 686 may extend through the sixth and seventh insulating interlayers 640 and 670 to contact upper surfaces of the first to third upper contact plugs 632, 634 and 636, respectively, the seventh upper contact plug 688 may extend through the seventh insulating interlayer 670 to contact an upper surface of the through via 660, and the eighth upper contact plug 690 may extend through the second support layer 560 and the fifth to seventh insulating interlayers 480, 640 and 670 to contact an upper surface of the first capping pattern 452.

An eighth insulating interlayer 700 may be formed on the seventh insulating interlayer 670, the fourth to eighth upper contact plugs 682, 684, 686, 688 and 690, and first to fifth upper wirings 712, 714, 716, 718 and 729 may be formed through the eighth insulating interlayer 700.

The first to fifth upper wirings 712, 714, 716, 718 and 729 may contact upper surfaces of the fourth to eighth upper contact plugs 682, 684, 686, 688 and 690, respectively.

The seventh and eighth insulating interlayers 670 and 700 may include an oxide, e.g., silicon oxide, and the fourth to eighth upper contact plugs 682, 684, 686, 688 and 690 and the first to fifth upper wirings 712, 714, 716, 718 and 720 may include, e.g., a metal, a metal nitride, a metal silicide, or doped polysilicon.

In an implementation, the fifth upper wiring 720 may extend in the third direction D3, and a plurality of fifth upper wirings 720 may be formed. The fifth upper wiring may serve as a bit line. In an implementation, an additional upper via and a sixth upper wiring may be further formed on the fifth upper wiring 720, and the sixth upper wiring may serve as a bit line.

The numbers and layouts of the first to fifth upper wirings 712, 714, 716, 718 and 720 on the second region II of the substrate 100 may be varied.

The fabrication of the semiconductor device may be completed by the above processes.

As described above, after forming the charge storage structure layer 400 and the channel layer 410 in the channel hole 360 and the dummy channel hole 365, most of the channel layer 410 in the dummy channel hole 365 may be removed, and thus, unlike the memory channel structure 462 in the channel hole 360, the support structure 464 in the dummy channel hole 365 may not include a channel containing polysilicon.

Thus, when the third and fourth openings 490 and 495 are formed by, e.g., a RIE process to divide the fourth sacrificial layer 320 into the fourth sacrificial patterns 325 extending in the second direction D2, the support structure 464 adjacent to the third and fourth openings 490 and 495 may not include polysilicon, and thus a phenomenon in which the third and fourth openings 490 and 495 do not extend in the second direction D2 straightly, but rather are bent toward the support structure 464 due to the stacked ions in polysilicon, may be reduced or prevented. Accordingly, an electrical short that could otherwise occur between neighboring ones of the gate electrodes, which may be formed by removing the fourth sacrificial patterns 325 through the third and fourth openings 490 and 495 to form the second gaps 590 and filling a conductive material into the second gaps 590, may be reduced or prevented.

The semiconductor device may have the following structural characteristics.

Referring to FIGS. 20, 39 and 41 to 44, the semiconductor device may include the lower circuit patterns on the substrate 100 including the first region I and the second region II at least partially surrounding the first region I; the CSP 240 on the lower circuit patterns; the gate electrode structure including the gate electrodes 752, 754 and 756, each of which may extend in the second direction D2, spaced apart from each other in the first direction D1 on the CSP 240; the memory channel structure 462 extending in the first direction D1 through the gate electrode structure on the first region I of the substrate 100 to be connected to the CSP 230; the support structure 464 extending through the gate electrode structure to be connected to the CSP 240 on the second region II of the substrate 100; the upper contact plugs 632, 634 and 636 extending in the first direction D1 to contact end portions in the second direction D2, e.g., the pads of the gate electrodes 752, 754 and 756 on the second region II of the substrate 100.

In an implementation, memory channel structure 462 may include the channel 412 extending in the first direction D1, the charge storage structure 402 surrounding the outer sidewall of the channel 412, the first filling pattern 442 filling the inner space formed by the channel 412, and the first capping pattern 452 on the channel 412 and the first filling pattern 442. In an implementation, the support structure 464 may include the second filling pattern 444 extending in the first direction D1, the dummy charge storage structure 404 contacting the outer sidewall of the second filling pattern 444, and the second capping pattern 454 on the second filling pattern 444.

In an implementation, the second capping pattern 454 may include the upper portion 454a and the lower portion 454b protruding from the upper portion 454a downwardly in the first direction D1. In an implementation, the lower portion of the second capping pattern 454 may have a shape of a ring contacting an edge lower surface of the upper portion 454a of the second capping pattern 454.

In an implementation, the lower surface of the upper portion 454a of the second capping pattern 454 may be substantially coplanar with the lower surface of the first capping pattern 452.

In an implementation, the first capping pattern 452 may contact the upper inner sidewall of the charge storage structure 402, and the second capping pattern 454 may contact the upper inner sidewall of the dummy charge storage structure 404.

In an implementation, the charge storage structure 402 may include the tunnel insulation pattern 392, the charge storage pattern 382, and the first blocking pattern 372 sequentially stacked in a horizontal direction substantially parallel to the upper surface of the substrate 100 from the outer sidewall of the channel 412, and the dummy charge storage structure 404 may include the dummy tunnel insulation pattern 394, the dummy charge storage pattern 384, and the dummy blocking pattern 374 sequentially stacked in the horizontal direction from the outer sidewall of the second filling pattern 444.

Figure 45:
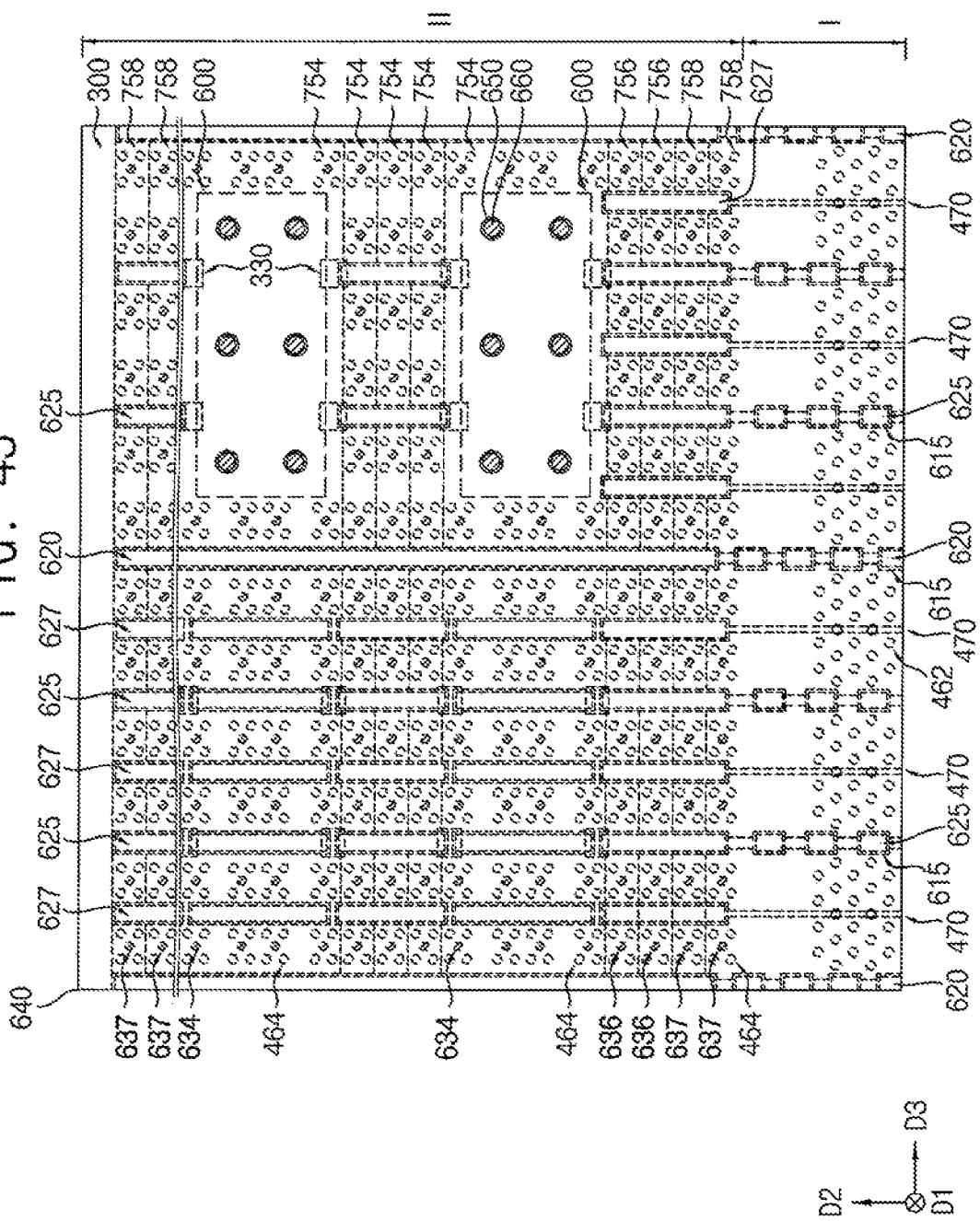
FIG. 45 is a plan view of a semiconductor device in accordance with example embodiments, and corresponding to FIG. 39.

FIG. 45 is a plan view of a semiconductor device in accordance with example embodiments, corresponding to FIG. 39.

This semiconductor device may be substantially the same as or similar to that illustrated with reference to FIGS. 39 and 41 to 44, except for further including a GIDL gate electrode, an extension length of the second division pattern 470, and layouts of the fourth division pattern 625 and the insulation pattern structure 600.

Referring to FIG. 45, the gate electrode structure may further include fourth gate electrodes 758 under the first gate electrode 752 and over the third gate electrode 756, respectively, and a ninth upper contact plug 637 may be further formed on a pad of the fourth gate electrode 758, and may transfer electrical signals thereto. The fourth gate electrode 758 may be used in an erase operation for erasing data stored in the memory channel structure 462 by using a GIDL phenomenon.

In an implementation, the fourth gate electrodes 758 may be formed at two levels under the first gate electrode 752 and at upper two levels over the third gate electrode 756.

FIG. 45 shows two memory blocks arranged in the third direction D3, e.g., first and second memory blocks that are separated from each other by the third division pattern 620.

In an implementation, in the first memory block, ones of the fourth division patterns 625 may extend through the second pads of the gate electrode structure, and may be spaced apart from ones of the fourth division patterns 625 extending through the first pads of the gate electrode structure. In the second memory block, the insulation pattern structure 600 and the through via 660 extending in the first direction D1 through the insulation pattern structure 600 may be formed at the second pads of the gate electrode structure.

In the first memory block, two division pattern columns each of which may include a plurality of fourth division patterns 625 spaced apart from each other in the second direction D2 may be spaced apart from each other in the third direction D3 between neighboring ones of the third division patterns 620, and a fifth division pattern column including a plurality of fifth division patterns 627 spaced apart from each other in the second direction D2 may be further formed between the two fourth division pattern columns and between the third division pattern 620 and the fourth division pattern column.

The second division pattern 470 may extend in the second direction D2 on the first region I of the substrate 100, and may also be formed on a portion of the second region II of the substrate 100 adjacent to the first region I of the substrate 100, and may contact one of the fifth division patterns 627 included in the fifth division pattern column, which is formed at an area adjacent to the first region I of the substrate 100 and extends through the third and fourth gate electrodes 756 and 758 at upper four levels. Thus, the third and fourth gate electrodes 756 and 758 at the four levels may be divided in the third direction D3 by the second division pattern 470 and the fifth division pattern 627.

The first division pattern 330 may overlap in the first direction D1 an area between the fourth division patterns 625 spaced apart from each other in the second direction D2 and extend through the first gate electrode 752, while the first division pattern 330 may not extend through a portion of the first gate electrode 752 overlapping in the first direction D1 an area between the fifth division patterns 627 spaced apart from each other in the second direction D2. Thus, the first gate electrode 752 might not be divided in the third direction D3 at the location of the fifth division patterns 627.

As a result, each first memory block may include three GSLs, one word line, and six SSLs at each level, and the second memory block may have the same numbers of the GSL, the word line and the SSL at each level.

Figure 43:
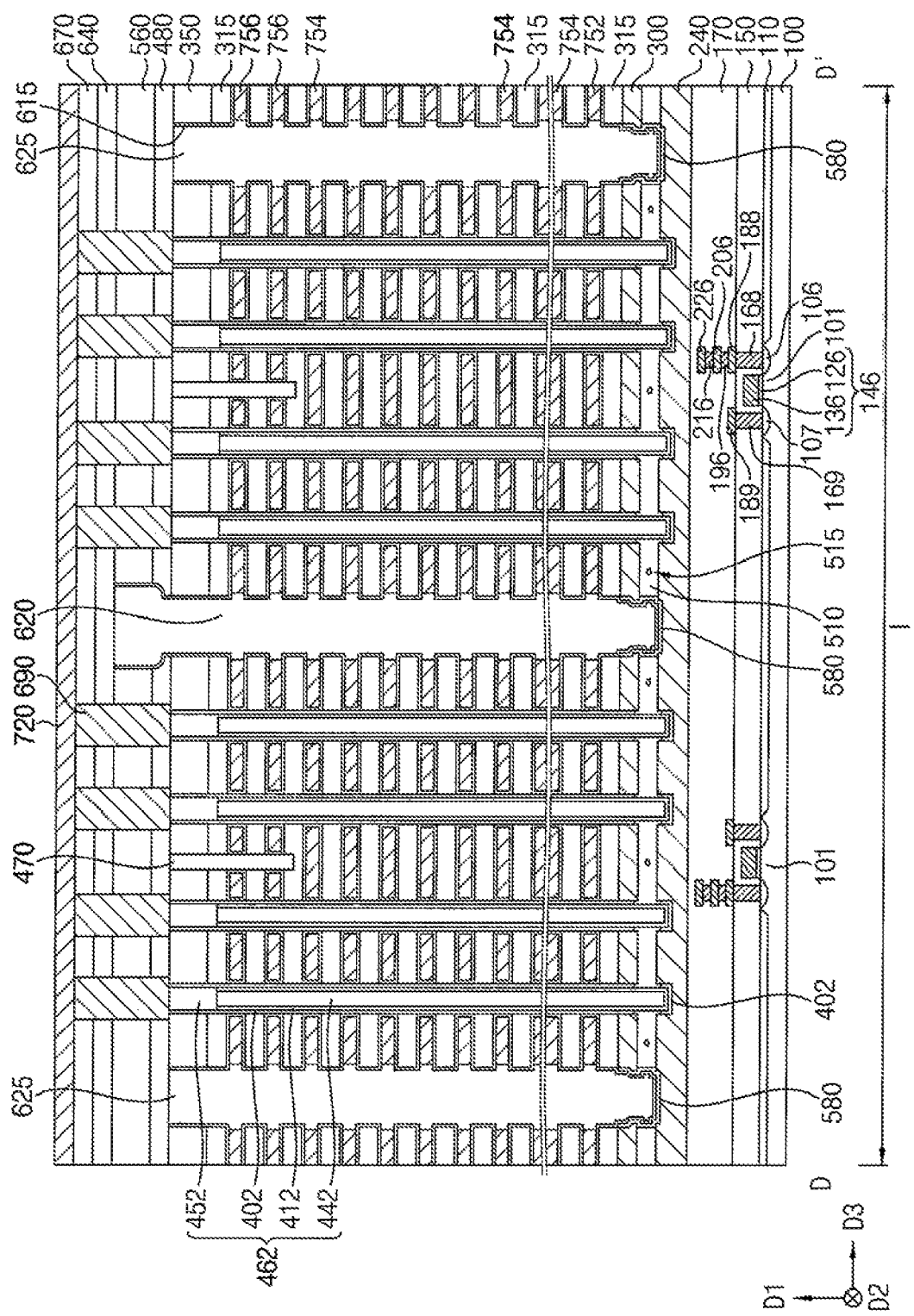
Figure 44:
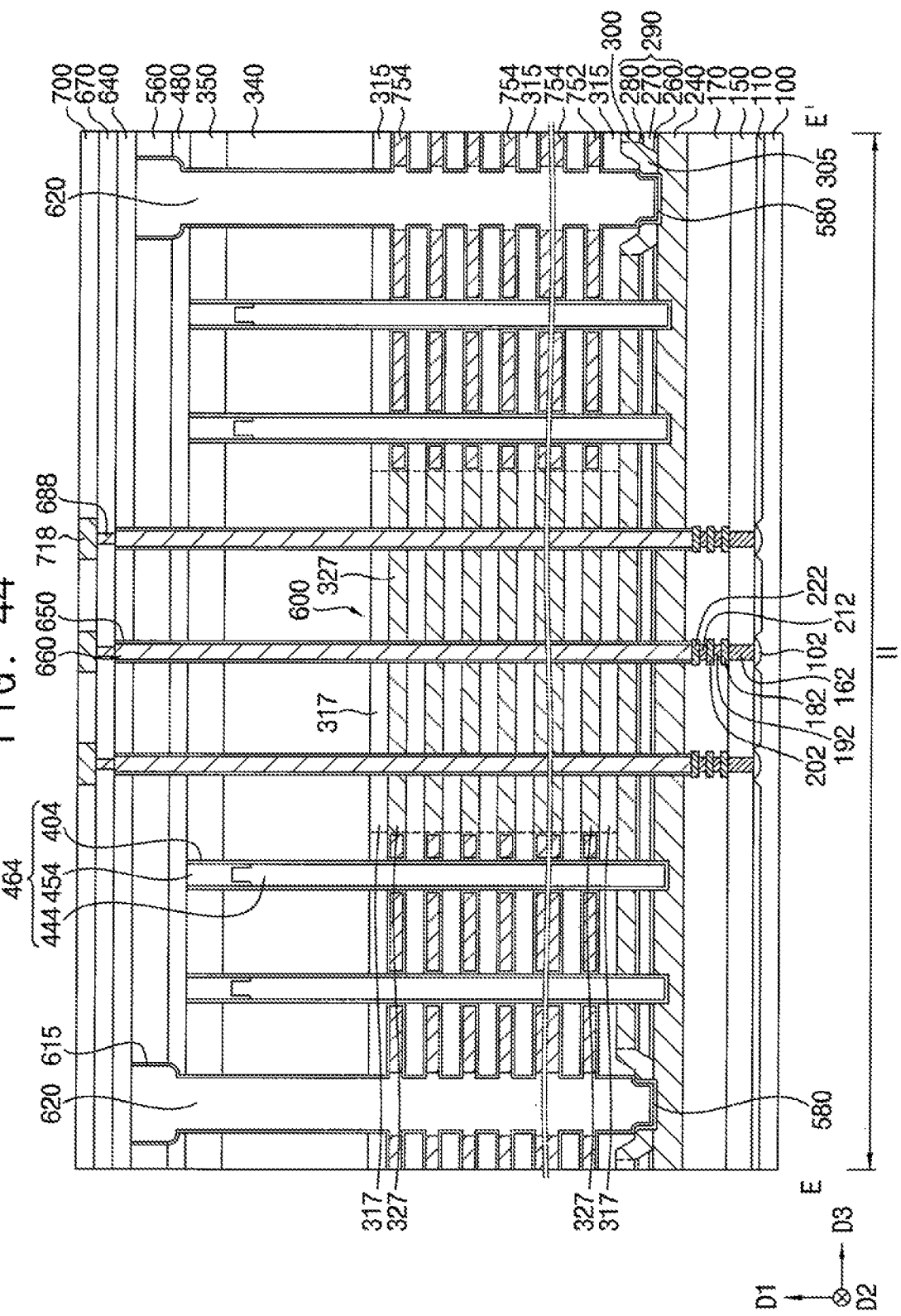
Figure 46:
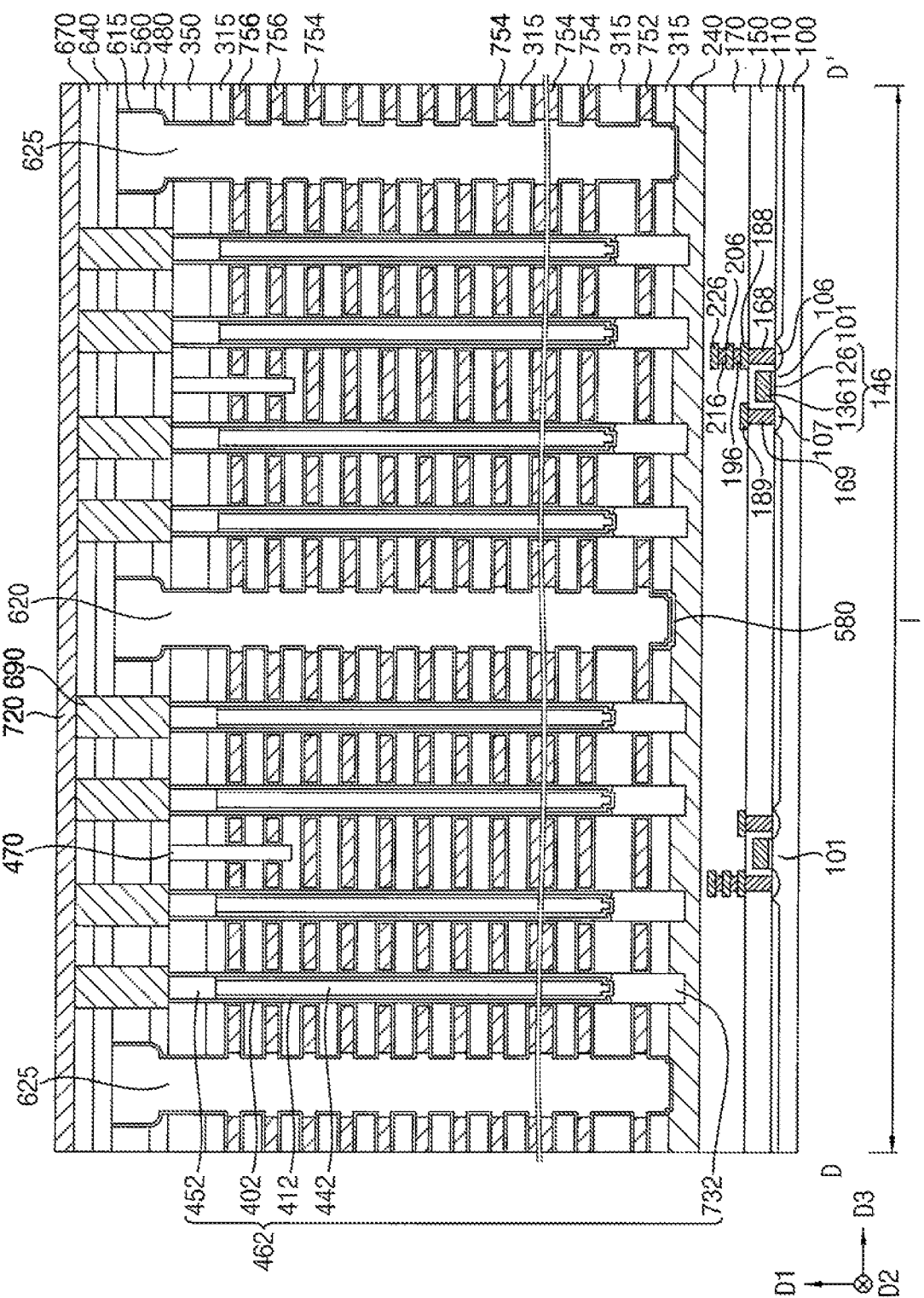
FIG. 46 is a cross-sectional view of a semiconductor device in accordance with example embodiments, and corresponding to FIG. 43.

FIG. 46 is a cross-sectional view of a semiconductor device in accordance with example embodiments, corresponding to FIG. 43. This semiconductor device may be substantially the same as or similar to that of FIGS. 39 and 41 to 44, except for the memory channel structure 462, the channel connection pattern 510, the first support layer 300, the support pattern 305 and the protection layer 580.

The memory channel structure 462 may further include a first semiconductor pattern 732 on the substrate 100, and the charge storage structure 402, the channel 412, the first filling pattern 442 and the first capping pattern 452 may be formed on the first semiconductor pattern 732.

The first semiconductor pattern 732 may include, e.g., single crystalline silicon or polysilicon. In an implementation, an upper surface of the first semiconductor pattern 732 may be formed at a height between lower and upper surfaces of the first insulation pattern 315 between the first and second gate electrodes 752 and 754. The charge storage structure 402 may have a cup-like shape of which a central lower surface is opened, and may contact an edge upper surface of the first semiconductor pattern 732. The channel 412 may have a cup-like shape, and may contact a central upper surface of the first semiconductor pattern 732. Thus, the channel 412 may be electrically connected to the CSP 240 through the first semiconductor pattern 732.

The support structure 464 may further include a second semiconductor pattern on the substrate 100, and the dummy charge storage structure 404, the second filling pattern 444 and the second capping pattern 454 may be formed on the second semiconductor pattern.

The channel connection pattern 510, the first support layer 300 and the support pattern 305 might not be formed between the CSP 240 and the first gate electrode 752, and additionally, the protection layer 580 might not be formed. In an implementation, one of the first insulation patterns 315 between the first and second gate electrodes 752 and 754 may have a thickness greater than those of ones of the first insulation patterns 315 at upper levels, respectively.

Figure 47:
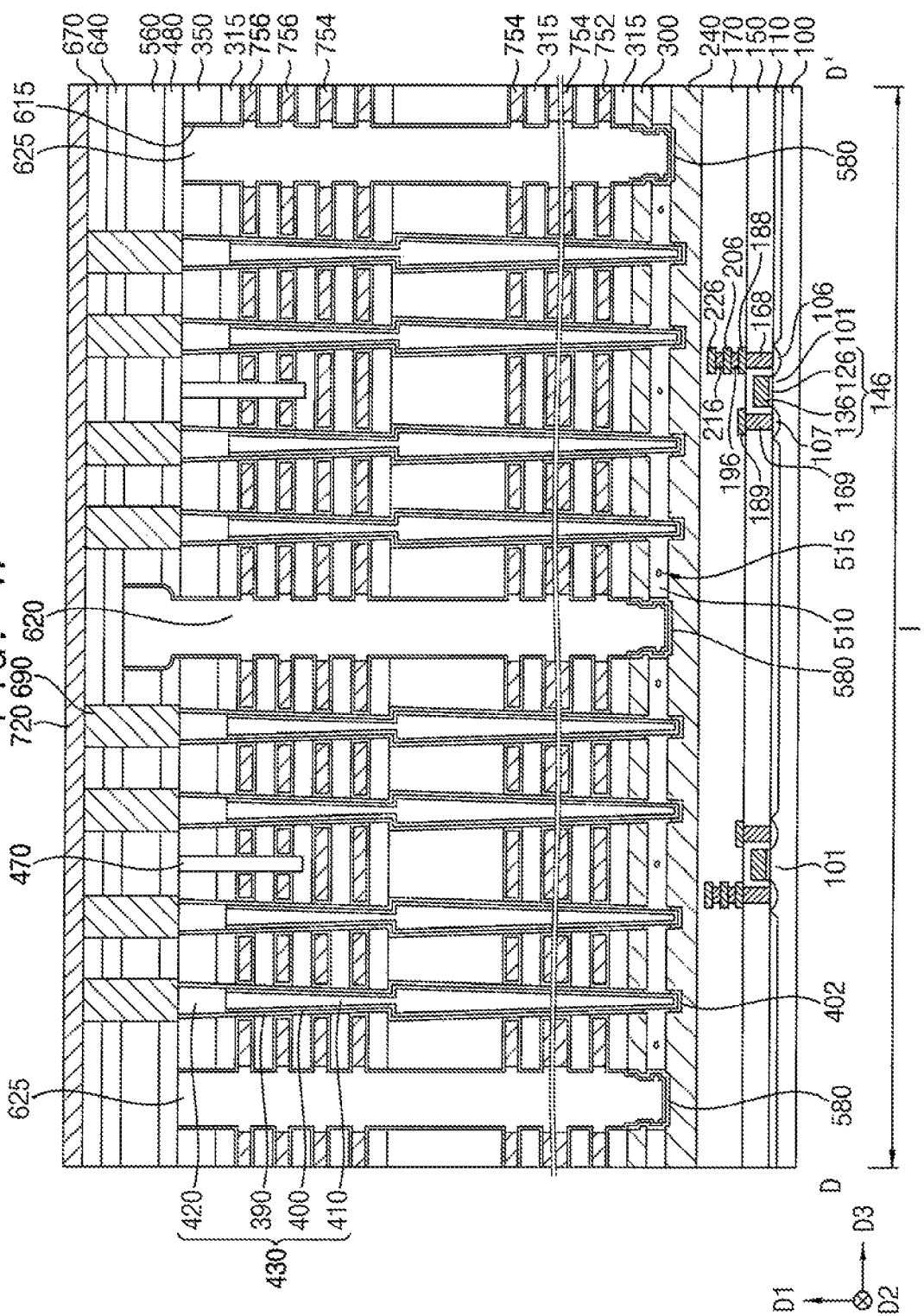
FIG. 47 is a cross-sectional view of a semiconductor device in accordance with example embodiments, and corresponding to FIG. 43.

FIG. 47 is a cross-sectional view of a semiconductor device in accordance with example embodiments, corresponding to FIG. 43. This semiconductor device may be substantially the same as or similar to that of FIGS. 39 and 41 to 44, except for the shape of the memory channel structure 462.

The memory channel structure 462 may include lower and upper portions sequentially stacked, and each of the lower and upper portions may have a width gradually increasing from a bottom toward a top thereof. In an implementation, a lower surface of the upper portion of the memory channel structure 462 may have an area less than that of an upper surface of the lower portion thereof.

In an implementation, as illustrated in the drawings, the memory channel structure 462 may include two portions, e.g., the lower and upper portions. In an implementation, the memory channel structure 462 may include more than two portions. Each of the portions of the memory channel structure 462 may have a width gradually increasing from a bottom toward a top thereof, and an area of a lower surface of an upper portion may be less than that of an upper surface of a lower portion that is directly under the upper portion.

Additionally, the support structure 464 may have the similar shape to that of the memory channel structure 462. In an implementation, the support structure 464 may include a plurality of portions sequentially stacked, and each of the portions may have a width gradually increasing from a bottom toward a top thereof. Thus, a boundary between the portions of the support structure 464 may have a width greater than those of other portions of the support structure 464, and may be located at a relatively closer position to the third and fourth openings 490 and 495. In an implementation, the support structure 464 may not include the channel layer 410 containing polysilicon, and thus, even though the third and fourth openings 490 and 495 are formed by a RIE process, the third and fourth openings 490 and 495 may not be bent by the support structure 464.

Figure 48:
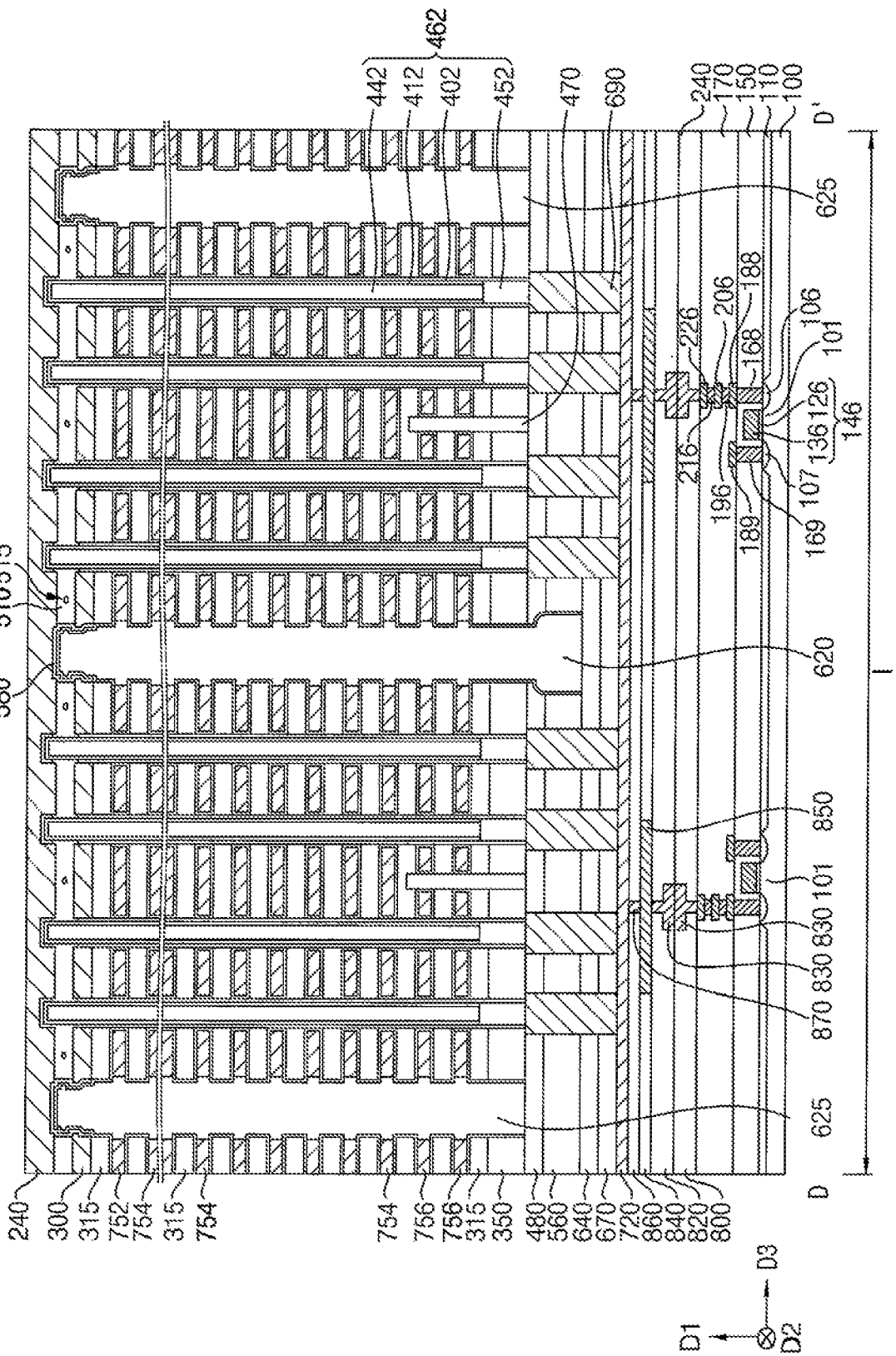
FIG. 48 is a cross-sectional view of a semiconductor device in accordance with example embodiments, and corresponding to FIG. 43.

FIG. 48 is a cross-sectional view of a semiconductor device in accordance with example embodiments, corresponding to FIG. 43. This semiconductor device may be substantially the same as or similar to that of FIGS. 39 and 41 to 44, except that upper structures may be overturned, and bonding structures may be further formed. The lower circuit patterns may correspond to the peripheral circuit wirings 4110 of FIG. 4, and circuit structures including the lower circuit patterns may correspond to the first structure 4100 of FIG. 4.

In an implementation, ninth to twelfth insulating interlayers 800, 820, 840 and 860 may be sequentially stacked on the eighth and ninth lower wirings 222 and 226 and the second insulating interlayer 170. Additionally, a first bonding pattern extending through the ninth insulating interlayer 800 to contact the eight lower wiring 222, and a second bonding pattern 810 extending through the ninth insulating interlayer 800 to contact the ninth lower wiring 226 may be formed. Furthermore, a third bonding pattern extending through the tenth insulating interlayer 820 to contact the first bonding pattern, and a fourth bonding pattern 830 extending through the tenth insulating interlayer 820 to contact the second bonding pattern 810 may be formed. The first and third bonding patterns and the second and fourth bonding patterns 810 and 830 may include a metal, e.g., copper, aluminum, or the like, and may be formed by, e.g., a dual damascene process.

A seventh upper wiring extending through the eleventh insulating interlayer 840 to contact the third bonding pattern, and an eighth upper wiring 850 extending through the eleventh insulating interlayer 840 to contact the fourth bonding pattern 830 may be formed, and a first upper via extending through the twelfth insulating interlayer 860 to contact the seventh upper wiring, and a second upper via 870 extending through the twelfth insulating interlayer 860 to contact the eighth upper wiring 850 may be formed.

At least some of the first to fifth upper wirings 712, 714, 716, 718 and 720, and at least some of the sixth upper wirings may be electrically connected to the lower circuit patterns through the first and third bonding patterns or the second and fourth bonding patterns 810 and 830.

By way of summation and review, as the number of stacks of the memory cells in the semiconductor device increases, a mold for forming the memory cells could lean or fall down, and dummy channels may be formed through the mold so as to help prevent the mold from leaning. An etching process of forming a word line cut for replacing sacrificial layers included in the mold with gate electrodes and for dividing the mold in an extension direction of the gate electrodes may be affected by the dummy channels so as not to be well formed.

One or more embodiments may provide a semiconductor device having improved characteristics.

In the method of manufacturing the semiconductor device in accordance with example embodiments, the channel layer including polysilicon in the dummy channel hole may be mostly removed, so that each opening for replacing the sacrificial layers included in the mold may not be affected by the channel layer including polysilicon. Thus, each opening might not be bent but may be formed in a straight line. Accordingly, electrical short between gate electrodes may be prevented, and the gate electrodes may have enhanced electrical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a substrate;
    a gate electrode structure on the substrate, the gate electrode structure including gate electrodes spaced apart from each other in a first direction perpendicular to an upper surface of the substrate, each of the gate electrodes extending in a second direction parallel to the upper surface of the substrate;
    a memory channel structure extending through the gate electrode structure on the substrate, the memory channel structure including:
        a channel extending in the first direction;
        a charge storage structure surrounding an outer sidewall of the channel;
        a first filling pattern filling an inner space formed by the channel; and
        a first capping pattern on the channel and the first filling pattern; and
    a support structure extending through the gate electrode structure on the substrate, the support structure including:
        a second filling pattern extending in the first direction;
        a dummy charge storage structure surrounding an outer sidewall of the second filling pattern; and
        a second capping pattern on the second filling pattern,
    wherein the second capping pattern includes:
        an upper portion; and
        a lower portion protruding from the upper portion downwardly in the first direction, and
    wherein the lower portion of the second capping pattern is disposed between the second filling pattern and the dummy charge storage structure in a horizontal direction substantially parallel to the upper surface of the substrate.

2. The semiconductor device as claimed in claim 1, wherein the lower portion of the second capping pattern contacts an outer edge lower surface of the upper portion of the second capping pattern.

3. The semiconductor device as claimed in claim 1, wherein a lower surface of the second capping pattern is substantially coplanar with a lower surface of the first capping pattern.

4. The semiconductor device as claimed in claim 1, wherein:
    the first capping pattern contacts an upper inner sidewall of the charge storage structure, and
    the second capping pattern contacts an upper inner sidewall of the dummy charge storage structure.

5. The semiconductor device as claimed in claim 1, wherein the channel, the first capping pattern, and the second capping pattern each include undoped or doped polysilicon.

6. The semiconductor device as claimed in claim 1, wherein the first filling pattern and the second filling pattern each include an oxide.

7. The semiconductor device as claimed in claim 1, wherein:
    the charge storage structure includes a tunnel insulation pattern, a charge storage pattern, and a blocking pattern sequentially stacked from the outer sidewall of the channel in the horizontal direction, and
    the dummy charge storage structure includes a dummy tunnel insulation pattern, a dummy charge storage pattern, and a dummy blocking pattern sequentially stacked from the outer sidewall of the second filling pattern in the horizontal direction.

8. The semiconductor device as claimed in claim 1, wherein the memory channel structure further includes a semiconductor pattern on the substrate, the semiconductor pattern contacting a lower surface of the channel.

9. The semiconductor device as claimed in claim 1, wherein:
    the memory channel structure includes a plurality of memory channel portions sequentially stacked in the first direction, each memory channel portion of the plurality of memory channel portions having a width gradually decreasing from a top toward a bottom thereof in the first direction, and
    the support structure includes a plurality of dummy portions sequentially stacked in the first direction, each dummy portion of the plurality of dummy portions having a width gradually decreasing from a top toward a bottom thereof in the first direction.

10. The semiconductor device as claimed in claim 9, wherein:
    an upper surface of each memory channel portion of the plurality of memory channel portions included in the memory channel structure has a width greater than that of a lower surface of one memory channel portion of the plurality of memory channel portions of the memory channel structure that is directly thereon, and
    an upper surface of each dummy portion of the plurality of dummy portions included in the support structure has a width greater than that of a lower surface of one dummy portion of the plurality of dummy portions of the support structure that is directly thereon.

11. The semiconductor device as claimed in claim 1, wherein:
    the substrate includes a cell array region and an extension region at least partially surrounding the cell array region, and
    the gate electrode structure is on the cell array region and the extension region of the substrate, the channel is on the cell array region of the substrate, and the support structure is on the extension region of the substrate.

12. A semiconductor device, comprising:
    a substrate;
    a gate electrode structure on the substrate, the gate electrode structure including gate electrodes spaced apart from each other in a first direction perpendicular to an upper surface of the substrate, each of the gate electrodes extending in a second direction parallel to the upper surface of the substrate;
    a memory channel structure extending through the gate electrode structure on the substrate; and
    a support structure extending through the gate electrode structure on the substrate, the support structure including:
        a first filling pattern extending in the first direction;
        a first capping pattern on the first filling pattern; and
        a dummy charge storage structure surrounding outer sidewalls of the first filling pattern and the first capping pattern,
    wherein the first capping pattern includes:
        an upper portion; and
        a lower portion protruding from an outer edge lower surface of the upper portion downwardly in the first direction, and
    wherein the lower portion of the first capping pattern is disposed between the first filling pattern and the dummy charge storage structure in a horizontal direction substantially parallel to the upper surface of the substrate.

13. The semiconductor device as claimed in claim 12, wherein the first capping pattern includes undoped or doped polysilicon.

14. The semiconductor device as claimed in claim 12, wherein the support structure includes a dummy tunnel insulation pattern, a dummy charge storage pattern, and a dummy blocking pattern sequentially stacked from an outer sidewall of the first filling pattern in the horizontal direction.

15. The semiconductor device as claimed in claim 12, wherein the memory channel structure includes:
   a second filling pattern extending in the first direction;
   a channel surrounding an outer sidewall of the second filling pattern;
   a charge storage structure surrounding an outer sidewall of the channel; and
   a second capping pattern on the channel and the second filling pattern.

16. The semiconductor device as claimed in claim 15, wherein a lower surface of the upper portion of the first capping pattern is substantially coplanar with a lower surface of the second capping pattern.

17. The semiconductor device as claimed in claim 15, wherein the second capping pattern contacts an upper inner sidewall of the charge storage structure.

18. A semiconductor device, comprising:
   a substrate including a cell array region and an extension region at least partially surrounding the cell array region;
   lower circuit patterns on the substrate;
   a common source plate (CSP) on the lower circuit patterns;
   a gate electrode structure on the CSP, the gate electrode structure including gate electrodes spaced apart from each other in a first direction perpendicular to an upper surface of the substrate, and each of the gate electrodes extending in a second direction parallel to the upper surface of the substrate;
   a memory channel structure extending through the gate electrode structure on the cell array region of the substrate and connected to the CSP, the memory channel structure including:
      a channel extending in the first direction;
      a charge storage structure surrounding an outer sidewall of the channel;
      a first filling pattern filling an inner space formed by the channel; and
      a first capping pattern on the channel and the first filling pattern;
   a support structure extending through the gate electrode structure and connected to the CSP on the substrate, the support structure including:
      a second filling pattern extending in the first direction;
      a dummy charge storage structure surrounding an outer sidewall of the second filling pattern; and
      a second capping pattern on the second filling pattern; and
   a contact plug extending in the first direction and contacting an upper surface of an end portion in the second direction of each of the gate electrodes,
   wherein the CSP directly contacts lower and side surfaces of the dummy charge storage structure.

19. The semiconductor device as claimed in claim 18, wherein the second capping pattern includes:
   an upper portion; and
   a lower portion protruding from an outer edge lower surface of the upper portion downwardly in the first direction.

20. The semiconductor device as claimed in claim 19, wherein the lower portion of the second capping pattern is disposed between the second filling pattern and the dummy charge storage structure in a horizontal direction substantially parallel to the upper surface of the substrate.

* * * * *